(12) United States Patent
Nishigaki et al.

(10) Patent No.: US 7,830,068 B2
(45) Date of Patent: Nov. 9, 2010

(54) ACTUATOR AND ELECTRONIC HARDWARE USING THE SAME

(75) Inventors: Michihiko Nishigaki, Kanagawa-ken (JP); Toshihiko Nagano, Kanagawa-ken (JP); Kazuhiko Itaya, Kanagawa-ken (JP); Takashi Kawakubo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 107 days.

(21) Appl. No.: 12/354,182

(22) Filed: Jan. 15, 2009

(65) Prior Publication Data

US 2009/0189487 A1 Jul. 30, 2009

(30) Foreign Application Priority Data

Jan. 16, 2008 (JP) .............................. 2008-007249

(51) Int. Cl.
H01L 41/08 (2006.01)

(52) U.S. Cl. ..................................................... 310/331

(58) Field of Classification Search ......... 310/330–332, 310/328
See application file for complete search history.

(56) References Cited

U.S. PATENT DOCUMENTS

| 7,215,064 B2 * | 5/2007 | Mehta ......................... 310/331 |
| 7,446,457 B2 * | 11/2008 | Ikehashi ...................... 310/330 |
| 7,449,817 B2 * | 11/2008 | Kato et al. ................... 310/331 |
| 7,633,213 B2 * | 12/2009 | Takayama et al. ............ 310/331 |
| 7,732,990 B2 * | 6/2010 | Nishigaki et al. ............ 310/331 |
| 2008/0042521 A1 | 2/2008 | Kawakubo et al. |
| 2008/0074006 A1 | 3/2008 | Kawakubo et al. |
| 2009/0051251 A1 | 2/2009 | Kawakubo et al. |

FOREIGN PATENT DOCUMENTS

| JP | 2006-087231 | 3/2006 |
| JP | 2006-159356 | 6/2006 |
| JP | 2007-273451 | 10/2007 |

* cited by examiner

*Primary Examiner*—Mark Budd
(74) *Attorney, Agent, or Firm*—Turocy & Watson, LLP

(57) ABSTRACT

An actuator includes a first beam, a first fixed part, a second beam, a first connective part, and a first fixed electrode. The first beam extends from a first fixed end to a first connective end, and the first fixed part connects the first fixed end and the substrate and supports the first beam above a main surface of the substrate with a gap. The second beam extends from a second connective end to a first action end and is provided in parallel to the first beam, and has a first division part divided by a first slit extending from the first action end toward the second connective end. The first connective part connects the first connective end and the second connective end and holds the second beam above the main surface of the substrate with a gap. The first fixed electrode is provided on the main surface of the substrate being configured to be opposed to a part of the first division part on a side of the first action end.

22 Claims, 36 Drawing Sheets

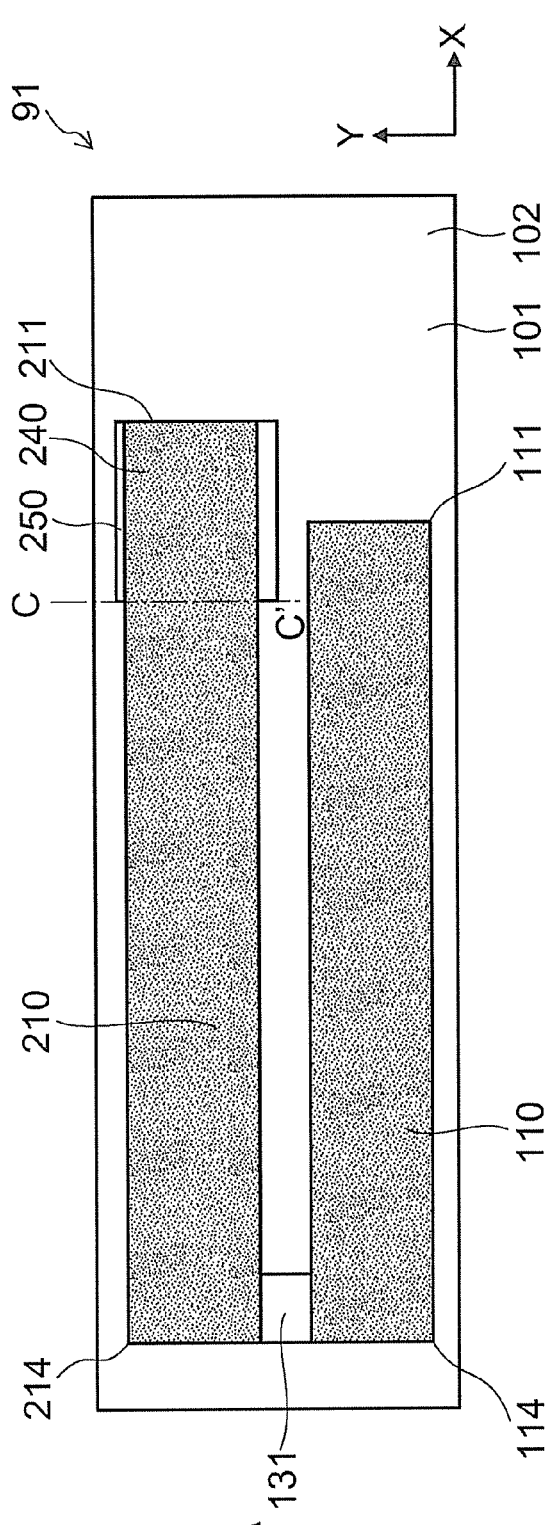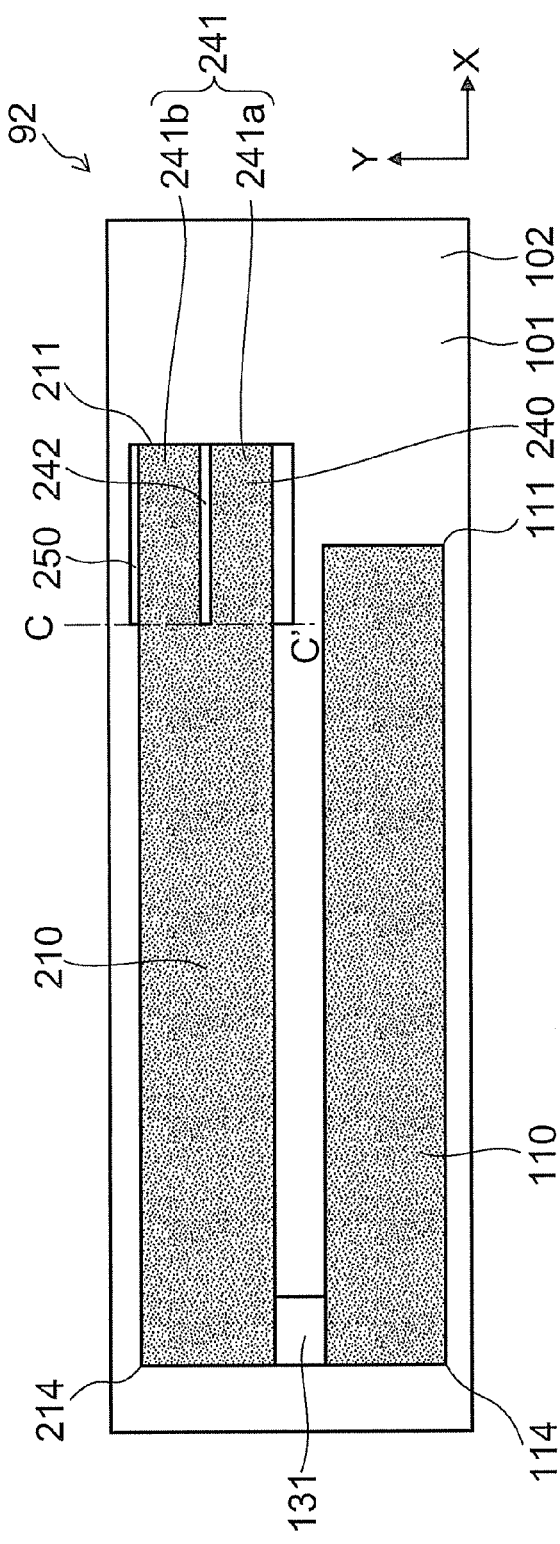

ACTUATOR AND ELECTRONIC HARDWARE USING THE SAME

CROSS-REFERENCE TO RELATED APPLICATIONS

This application is based upon and claims the benefit of priority from the prior Japanese Patent Application No. 2008-007249, filed on Jan. 16, 2008; the entire contents of which are incorporated herein by reference.

BACKGROUND OF THE INVENTION

1. Field of the Invention

This invention relates to an actuator of piezoelectric driving system and an electronic hardware using it.

2. Background Art

MEMS (Micro-electro-mechanical System) actuator has been expected to be applied to various optical switches, communication circuits, variable-volume capacitors or micro-switches used in electronic hardware, and so forth.

Driving mechanism of MEMS actuator include a method of bending and carrying out displacement a beam by driving mechanism such as electrostatic force, thermal stress, electromagnetic force, and piezoelectric force. Among them, piezoelectric driving system has not only advantages of low power consumption and low driving voltage but also an advantage that the capacitance tuning ratio is large in the case of variable capacitor because the movable electrode does not perform pull-in to the fixed electrode by the driving voltage and therefore the actuator can be continuously and largely changed, and has particularly been focused.

However, the piezoelectric driving type actuator has a long thin beam structure in which a piezoelectric film is sandwiched by upper and lower electrodes, and therefore, the beam comes to bend up or down by a slight residual stress of the materials of the piezoelectric film or the upper or lower electrodes. For example, if the beam bends to the fixed electrode side, the movable electrode becomes in contact with the fixed electrode, and the MEMS variable capacitor indicates a high capacitance value and therewith the capacitance does not change, and the MEMS switch is in the ON state and therewith does not change to be in the OFF state. On the other hand, if the beam bends to the opposite side of the fixed electrode side, the movable electrode comes to detach from the fixed electrode, and in a general range of the driving voltage, the MEMS variable capacitor indicates a low capacitance value and therewith the capacitance hardly changes, and the MEMS switch is in the OFF state and therewith does not change to be in the ON state.

With respect to the problem of the beam warpage, an actuator having a folded beam structure has been proposed (JP-A 2006-87231 (Kokai)). However, the warpage of the beam of actuator is a spherical shape, and therefore, in this folded beam structure actuator, dissolution of warpage is insufficient. Therefore, when the valuable capacitor is produced by the actuator of this structure, the contact area of the movable electrode and the fixed electrode cannot be large and the maximum of the capacitance (maximum capacitance) is small. Moreover, change of the capacitance with respect to the applied voltage indicates precipitous change in the vicinity of the maximum capacitance, and control of the capacitance is difficult.

SUMMARY OF THE INVENTION

According to an aspect of the invention, there is provided an actuator including: a substrate; a first beam extending from a first fixed end to a first connective end, including a first lower electrode, a first upper electrode, and a first piezoelectric film provided between the first lower electrode and the first upper electrode; a first fixed part connecting the first fixed end and the substrate and supporting the first beam above a main surface of the substrate with a gap; a second beam extending from a second connective end to a first action end and provided in parallel to the first beam, including a second lower electrode, a second upper electrode, a second piezoelectric film provided between the second lower electrode and the second upper electrode, and having a first division part divided by a first slit extending from the first action end toward the second connective end; a first connective part connecting the first connective end and the second connective end and holding the second beam above the main surface of the substrate with a gap; and a first fixed electrode provided on the main surface of the substrate being configured to be opposed to a part of the first division part on a side of the first action end.

According to another aspect of the invention, there is provided an electronic hardware including: an electric circuit having the actuator including: a substrate; a first beam extending from a first fixed end to a first connective end, including a first lower electrode, a first upper electrode, and a first piezoelectric film provided between the first lower electrode and the first upper electrode; a first fixed part connecting the first fixed end and the substrate and supporting the first beam above a main surface of the substrate with a gap; a second beam extending from a second connective end to a first action end and provided in parallel to the first beam, including a second lower electrode, a second upper electrode, a second piezoelectric film provided between the second lower electrode and the second upper electrode, and having a first division part divided by a first slit extending from the first action end toward the second connective end; a first connective part connecting the first connective end and the second connective end and holding the second beam above the main surface of the substrate with a gap; and a first fixed electrode provided on the main surface of the substrate being configured to be opposed to a part of the first division part on a side of the first action end, as at least any one of a variable capacitor and a high-frequency switch.

BRIEF DESCRIPTION OF THE DRAWINGS

FIGS. 6A and 6B are schematic plan views illustrating structures of actuators of first and second comparative examples, respectively;

DETAILED DESCRIPTION OF THE INVENTION

Hereinafter, embodiments of this invention will be described with reference to drawings.

For each of the following figures, the same signs are appended to the same components as described above with respect to an above-presented figure, and the detailed description will be appropriately omitted.

First Embodiment

Figure 1:
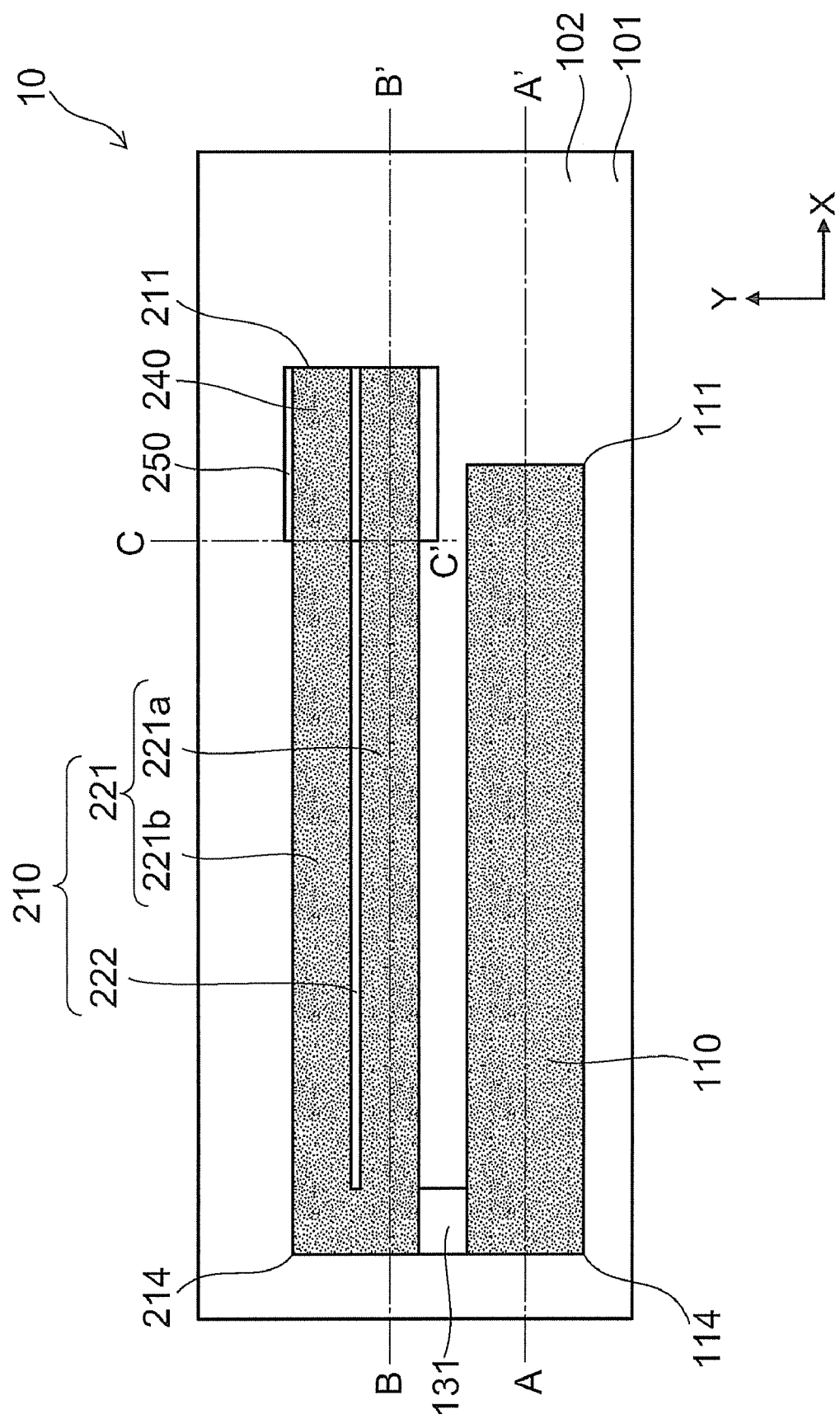
FIG. 1 is a schematic plan view illustrating a structure of an actuator according to a first embodiment of this invention.

FIG. 1 is a schematic plan view illustrating a structure of an actuator according to a first embodiment of this invention.

Figure 2:
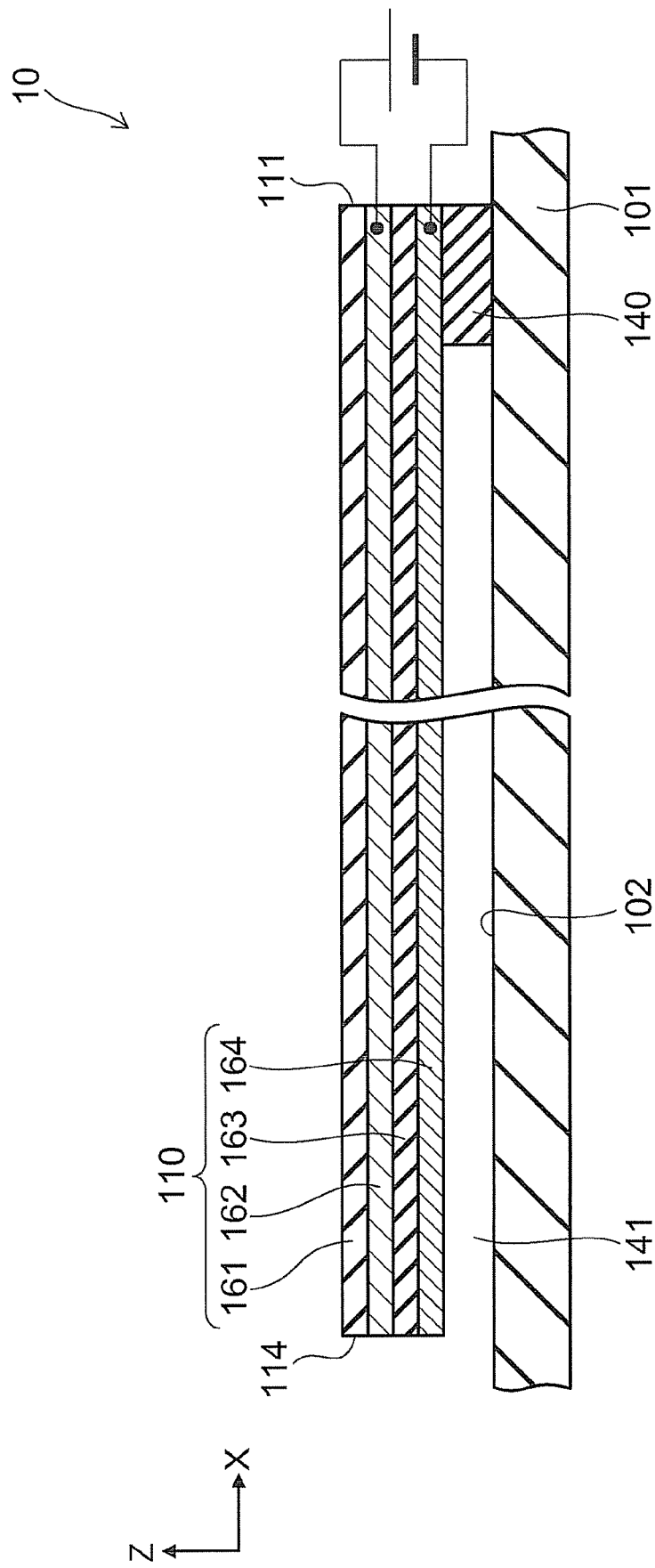
FIG. 2 is a sectional view of line A-A' of FIG. 1.

FIG. 2 is a sectional view of line A-A' of FIG. 1.

Figure 3:
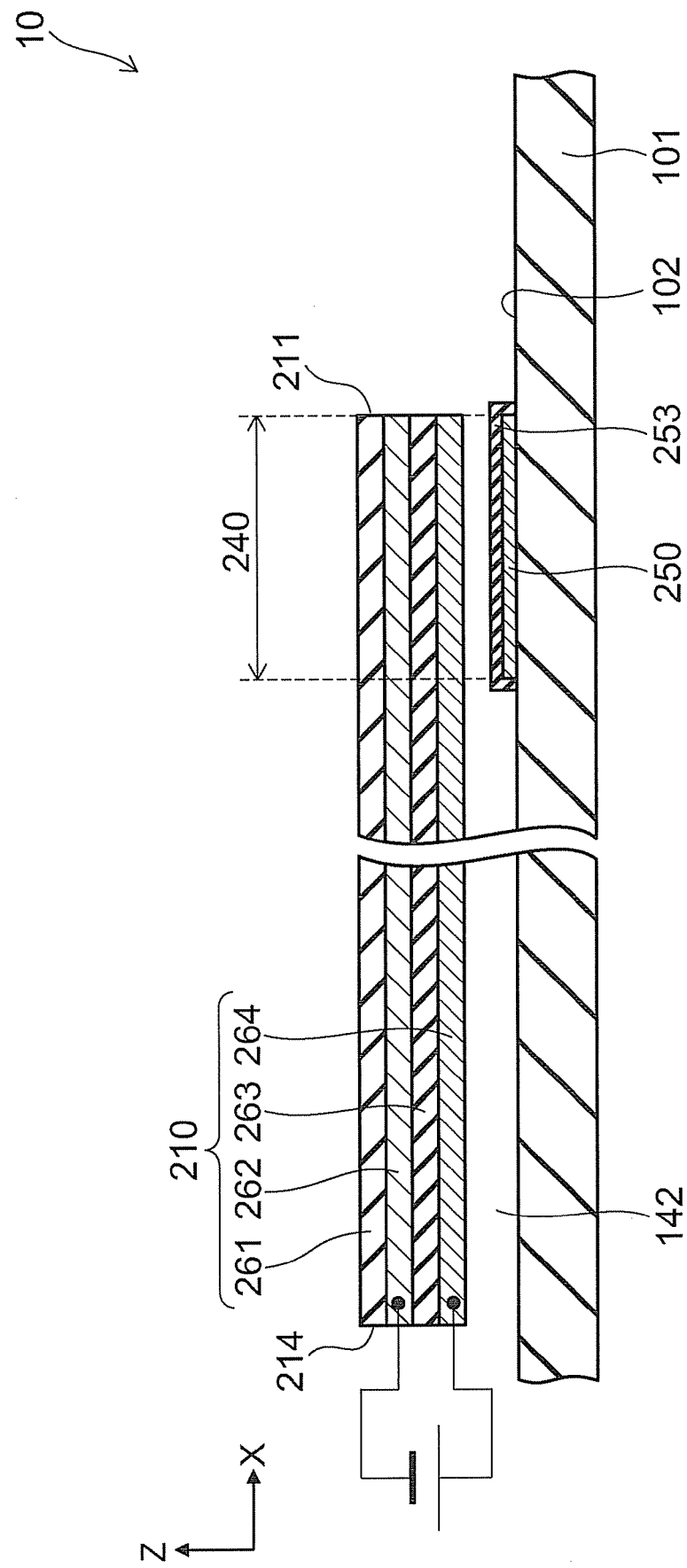
FIG. 3 is a sectional view of line B-B' of FIG. 1.

FIG. 3 is a sectional view of line B-B' of FIG. 1.

As shown in FIGS. 1 to 3, an actuator 10 according to the first embodiment of this invention includes a substrate 101 and a first beam 110 provided above a main surface of 102 of the substrate 101 and extending from a first fixed end 111 to a first connective end 114. And, the actuator 10 further includes a first fixed part 140 connecting the first fixed end 111 and the main surface 102 to support the first beam 110 above the main surface 102 of the substrate 101 with a gap 141. That is, the first beam 110 is held by the first fixed part 140 with the gap 141 above the substrate 101.

In these figures and each of the following figures, the extending direction of the first beam 110, namely, the A-A' line direction is X axis, and the direction that is parallel to the main surface 102 of the substrate 101 and perpendicular to X axis is Y axis, and the direction perpendicular to X axis and Y axis (namely, perpendicular to the main surface 102) is Z axis.

Furthermore, the actuator 10 further includes a second beam 210 extending from a second connective end 214 to a first action end 211 and provided in parallel to the first beam 110. And the actuator 10 further includes a first connective part 131 connecting the first connective end 114 of the first beam 110 and the second connective end 214 of the second beam 210 and holding the second beam 210 above the main surface 102 of the substrate 101 with a gap 142. That is, the second beam 210 is held through the first connective part 131 and the first beam 110 by the first fixed part 140 above the main surface 102 of the substrate 101 with the gap 142.

And, as shown in FIG. 1, the second beam 210 has a first division part 221 divided by a first slit 222 provided to extend to the direction from the first action end 211 toward the second connective end 214. In the example shown in FIG. 1, the first slit 222 is one slit and the first division part 221 has two division portions, namely, a division portion 221a and a division portion 221b.

And, actuator 10 further includes a first fixed electrode 250 opposed to a part of the first division part 221 of the second beam 210 on a side of the first action end 211 and provided on the main surface 102 of the substrate 101. A part of the second beam 210 opposed to the first fixed electrode 250 becomes a first action part 240. That is, a part of the first division part 221 opposed to the first fixed electrode 250 becomes a first action part 240. On the surface of the first fixed electrode 250 opposed to the second beam 210, a first dielectric film 253 can be provided.

And, as shown in FIG. 2, the first beam 110 has a first lower electrode 164 opposed to the main surface 102 of the substrate 101, a first upper electrode 162, and a first piezoelectric film 163 provided between the first lower electrode 164 and the first upper electrode 162. Moreover, a support film 161 is provided in the upper side of the first upper electrode 162.

Moreover, as shown in FIG. 3, the second beam 210 has a second lower electrode 264 opposed to the main surface 102 of the substrate 101, a second upper electrode 262, and a second piezoelectric film 263 provided between the second lower electrode 264 and the second upper electrode 262. Moreover, a support film 261 is provided in the upper side of the second upper electrode 262.

As described above, in the actuator 10, the first beam 110 and the second beam 210 have a monomorph structure. And, when a voltage is applied to the first piezoelectric film 163 by the first upper electrode 162 and the first lower electrode 164, the first beam 110 bends to the upper direction or lower direction according to polarity of the applied voltage by the inverse piezoelectric effect. Moreover, when a voltage is applied to the second piezoelectric film 263 by the second upper electrode 262 and the second lower electrode 264, the second beam 210 bends to the upper direction or lower direction according to magnitude and polarity of the applied voltage by the inverse piezoelectric effect. And, according to the applied voltage, the distance between the second lower electrode 264 of the second beam 210 and the first fixed electrode 250 is changed and the actuator 10 operates as a variable capacitor or a high-frequency switch. That is, the region of the second beam 210 opposed to the first fixed electrode 250 becomes the action part 240, and in the action part 240, the distance between the second lower electrode 264 and the first fixed electrode 250 is changed, and the actuator 10 operates as a variable capacitor or a high-frequency switch.

For the substrate 101, an insulator glass substrate, a semiconductor substrate such as silicon (Si), or the like can be used.

Moreover, for the first fixed part 140, such a material as silicon oxide ($SiO_2$), silicon nitride ($Si_3N_4$), aluminum nitride (AlN), or the like can be used. As described later, the first fixed part 140 may be formed by the first beam 110 itself. That is, it is possible that the first beam 110 itself is bended to the thickness direction (Z-axis direction) of the first beam 110 in the part of the fixed end 111, the part connects the first beam 110 and the substrate 101, and supports the first beam 110 above the main surface 102 of the substrate 101 with a gap. In this case, the first fixed part 140 is composed of a material composing the first beam 110.

Moreover, for the support film 161, the support film 261 and the first dielectric film 253, an insulating film such as silicon oxide ($SiO_2$), silicon nitride ($Si_3N_4$), or aluminum nitride (AlN) can be used.

Moreover, for the first upper electrode 162, the lower electrode 164, the second upper electrode 262, the second lower electrode 264 and the first fixed electrode 140, a layer made of aluminum (Al), gold (Au), platinum (Pt), copper (Cu), iridium (Ir), tungsten (W), molybdenum (Mo), or the like can be used.

Moreover, for the first piezoelectric film 163 and the second piezoelectric film 263, a layer made of such a material as, crystal of wurtzite form crystal such as AlN or ZnO, or perovskite ferroelectric substance such as PZT or barium titanate (BTO) can be used. Furthermore, there can be used a layer including PbTe, PbSe, PbS, HgTe, HgSe, $Hg_{1-x}Cd_xTe$, GaSb, GaAs, InP, InAs, InSb, Ge, $Mg_2Si$, $Mg_2Ge$, $Mg_2Sn$, $Ca_2Sn$, $Ca_2Pb$, ZnSb, $ZnAs_2$, $Zn_3As_2$, CdSb, $CdAs_2$, $Cd_3As_2$, $Bi_2Se_3$, $Bi_2Te_3$, $Sb_2Te_3$, $As_2Se_3$, $As_2Te_3$, $PtSb_2$, $In_2Se_3$, $In_2Te_3$, HgTe, $Hg_{1-x}Cd_xTe$, InSb, $Cd_3As_2$, $Bi_2Te_3$, or $PtSb_2$.

And, in the actuator 10 according to this embodiment, the first lower electrode 164 and the second lower electrode 264 can be the same layer and can contain the same material. Moreover, the first upper electrode 162 and the second upper electrode 262 can be the same layer and can contain the same material. Moreover, the first piezoelectric film 163 and the second piezoelectric film 263 can be the same layer and can contain the same material. However, this invention is not limited thereto.

Furthermore, the first connective part 131 can contain the respective and substantially same layers as the first lower electrode layer composing the first lower electrode 164, the first piezoelectric film layer composing the first piezoelectric film 163, and the first upper electrode layer composing the first upper electrode 162. However, this invention is not limited thereto.

The actuator 10 having such a structure can be obtained by, for example, forming the first fixed electrode 250 and the first dielectric film 253 thereon in a predetermined shape on the main surface 102 of the substrate 101, then forming a sacrifice layer of a predetermined pattern, then forming the first fixed part 140, then sequentially depositing to form a layer to be the lower electrodes, a layer to be the piezoelectric films, a layer to be the upper electrodes, and a layer to be support films, patterning the deposited layers to be a predetermined shape, forming the first beam 110, the second beam 210, and the first connective part 131, and then removing the sacrifice layer.

In the actuator 10, as shown in FIGS. 2, 3, the polarity of the applied voltage between the first lower electrode 164 and the first upper electrode 162 and the polarity of the applied voltage between the second lower electrode 264 and the second upper electrode 262 are reverse. Thereby, by the inverse piezoelectric effect, the first piezoelectric film 163 and the second piezoelectric film 263 are bended, and the first action part 240 is displaced to the direction near to the first fixed electrode 250. Moreover, by inverting the polarity of the applied voltage, the first action part 240 is displaced to the direction backing away from the first fixed electrode 250.

And, the actuator 10 according to this embodiment has a folded structure in which the first beam 110 and the second beam 210 are connected by the connective part 131. Therefore, even if there are stress strains in the stacked films (first lower electrode 164, first piezoelectric film 163, first upper electrode 162, first support film 161, second lower electrode 264, second piezoelectric film 263, second upper electrode 262, second support film 261) composing the beams, the stress strains are cancelled in the extending direction (X axis direction) of the first beam 110 and the second beam 210, and therefore, in the first action part 240, the effect of warpage of beams of X axis direction can be cancelled. Thereby, abnormality of distance between the second lower electrode 264 and the first fixed electrode 250 that is generated by warpage of the beams of X axis direction can be prevented.

Furthermore, in the actuator 10 according to this embodiment, the first slit 222 parallel to the extending direction of the second beam 210 is provided in the second beam 210, and the first slit 222 opens in the first action end 211. And, the second beam 210 of the first action end 211 side is divided into a plurality of first division portions 221 (in the example of FIG.

1, division portion 221a and division portion 221b) by the first slit 222. Therefore, in the plurality of first division portions 221, the division portion 221a and the division portion 221b can individually generate bending transformation, namely, are movable to each other. Therefore, in the first action part 240, the effect of the warpage of the beam due to the stress of Y axis direction can be decreased, and the abnormality of distance between the second lower electrode 264 and the first fixed electrode 250 that is generated by warpage of the beam of Y axis direction can be prevented.

In this case, the length of the first slit 222 is set to be longer than the length of X axis direction of the first action part 240 formed by opposing of the second beam 210 and the first fixed electrode 250 (the extending direction of the second beam 210). As described above, by providing the first slit 222 longer than the region of the first action part, namely, the first division part 221, the freedom degree of the movement of the first division part 221 is more enhanced, and as a result, the effect of warpage of the beams can be substantially cancelled, and the actuator in which the maximum capacitance is large and the precipitous change of the capacitance in the vicinity of the maximum capacitance is relaxed can be obtained.

Figure 4:
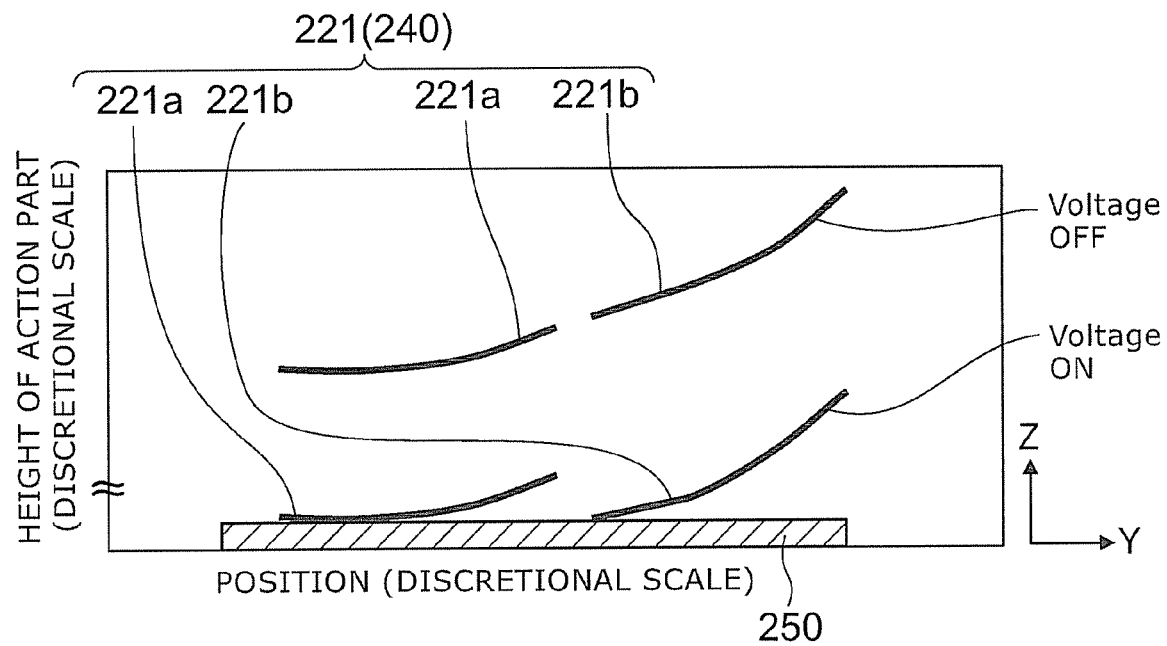
FIG. 4 is a schematic sectional view illustrating characteristics of the actuator according to the first embodiment of this invention.

FIG. 4 is a schematic sectional view illustrating characteristics of the actuator according to the first embodiment of this invention.

FIG. 4 is a sectional view schematically showing line C-C' of FIG. 1. The horizontal axis represents position in Y axis direction and the vertical axis represents position in Z axis direction. And, FIG. 4 shows the states of the second beam 210 when the applied voltages to the first piezoelectric film 163 and the second piezoelectric film 263 are OFF and ON. That is, heights (distance) of the division portion 221a and the division portion 221b in OFF and in ON from the first fixed electrode 250 are schematically shown. That is, FIG. 4 shows warpage of Y axis direction of the second beam 210. The division portion 221a and the division portion 221b have a stacked structure but are omitted, and the first dielectric film 253 is also omitted and drawn.

As shown in FIG. 4, in the actuator 10, slight warpage of Y axis direction is left in the division portion 221a and the division portion 221b of the second beam 210, but in ON, a wide region of the division portion 221a and some region of the division portion 221b are in contact with the first fixed electrode 250 (through the first dielectric film 253). Thereby, in the first action part 240 of the second beam 210, the area in which the second lower electrode 264 and the first fixed electrode 250 are approximated can be large. Thereby, the maximum capacitance formed by the first action part 240 and the first fixed electrode 250 can be large.

Figure 5:
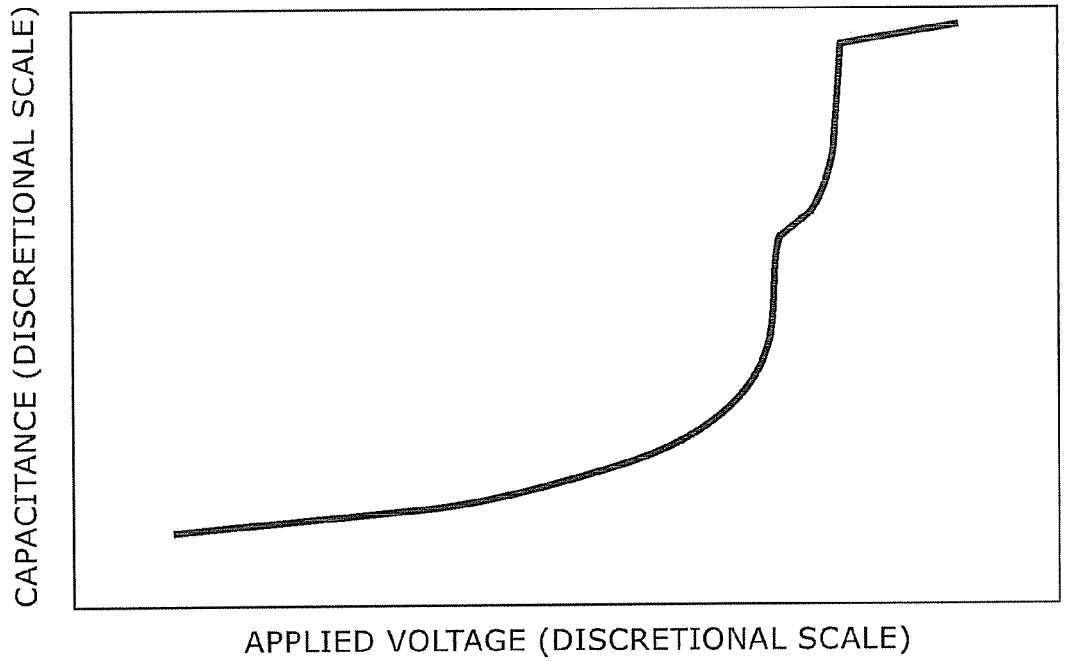
FIG. 5 is a graph view illustrating characteristics of the actuator according to the first embodiment of this invention.

FIG. 5 is a graph view illustrating characteristics of the actuator according to the first embodiment of this invention.

The horizontal axis of FIG. 5 represents applied voltage to the first piezoelectric film 163 and the second piezoelectric film 263, and the vertical axis represents capacitance formed between the first action part 240 of the second beam 210 and the first fixed electrode 250.

As shown in FIG. 5, in the actuator 10 according to this embodiment, applied voltage-capacitance characteristics are gradually changed. This corresponds to movement of two division portions 221a, 221b of the first division part 221 by the applied voltage. As described above, in the actuator 10 according to this embodiment, by providing the first division part 211, the capacitance is gradually changed and the precipitous change of capacitance in the vicinity of the maximum capacitance is relaxed.

First and Second Comparative Examples

FIGS. 6A and 6B are schematic plan views illustrating structures of actuators of first and second comparative examples.

As shown in FIG. 6A, an actuator 91 of the first comparative example has a folded beam structure in which a first beam 110 and a second beam 210 are connected by a first connective part 131, but a slit is not provided in the second beam 210. That is, the division part does not exist.

Moreover, as shown in FIG. 6B, the actuator 92 of the second comparative example has a folded beam structure in which a first beam 110 and a second beam 210 are connected by a first connective part 131. And, only the part opposed to the fixed electrode 250 of the second beam 210, namely, the part of the first action part 240 is provided with the first slit 242. And, the length of X axis direction of the first division part 241 provided by the first slit 242 (division portion 241a, 241b) is the same as the length of X axis direction of the first action part 240. That is, in the actuator 92 of the second comparative example, the first fixed electrode 250 is provided to be opposed to all of the first division part 241 of the second beam 210. And, the length of X axis direction of the first division part 241 is the same as the length of X axis direction of the first action part 240 formed by opposing of the second beam 210 and the first fixed electrode 250 (extending direction of the second beam 210), and is shorter than the length of X axis direction of the first division part 221 of the actuator 10 according to this embodiment illustrated in FIG. 1.

The actuator 91 of the first comparative example and the actuator 92 of the second comparative example have the same structure as the actuator 10 according to the first embodiment illustrated in FIG. 1, except for the planar shape of the second beam 210.

Hereinafter, warpage of the beams of the actuators of the comparative examples will be explained.

Figure 7:
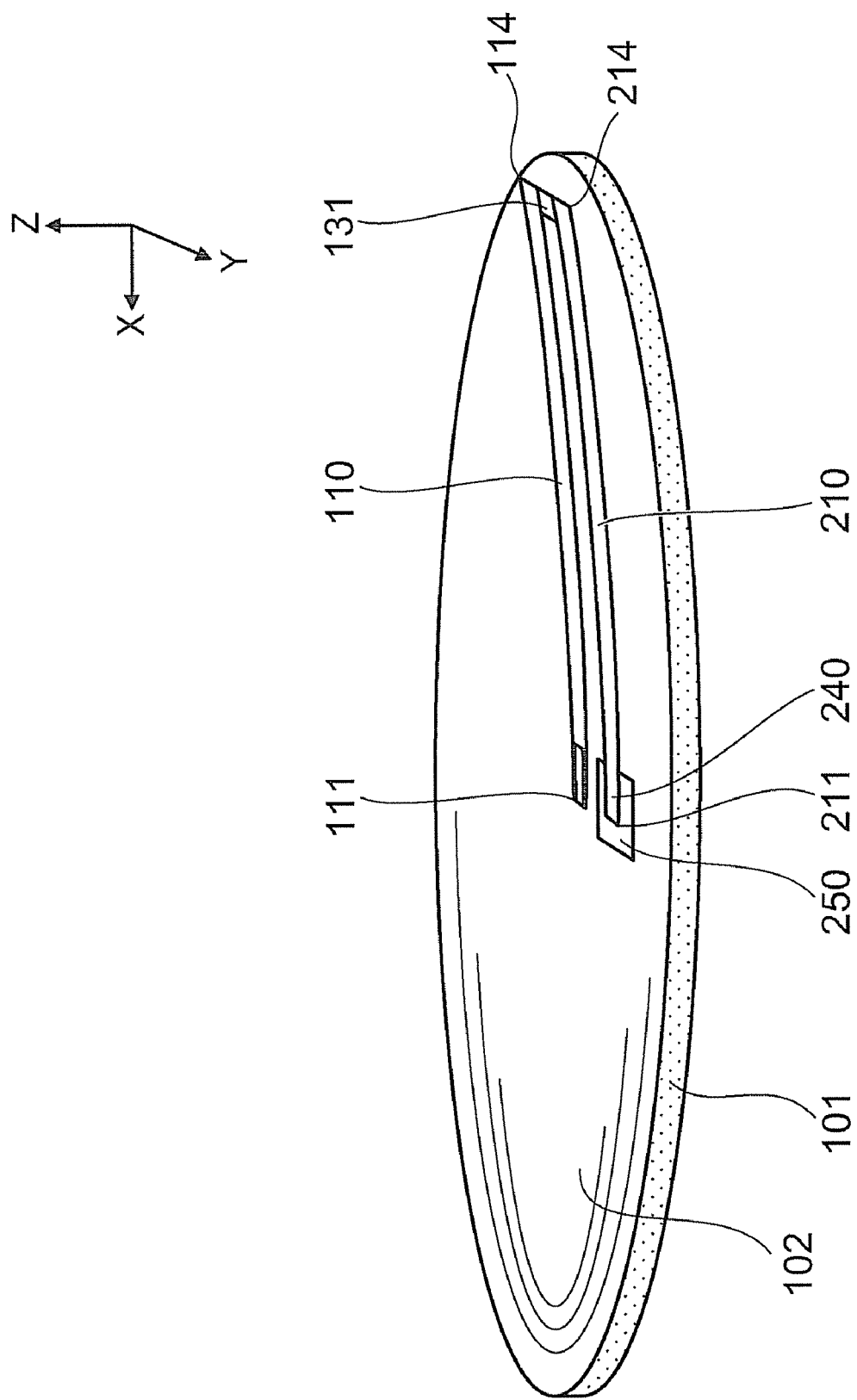
FIG. 7 is a schematic view for explaining warpage generated in an actuator.

FIG. 7 is a schematic view for explaining warpage generated in an actuator.

As shown in FIG. 7, in the actuator having the first beam 110, the first connective part 131, and the second beam 210, the residual strain is generated in the film having the stacked structure composing the actuator, and spherical warpage is generated in the entire stacked film. In the example shown in FIG. 7, warpage of a concave shape is generated.

In this case, the actuators 91, 92 of the first and second comparative examples shown in FIGS. 6A, 6B has a folded beam structure, and therefore, even if large warpage is generated in the part of the first connective end 114 and the second connective end 214, warpage is cancelled by the first beam 110 and the second beam 210 in the part of the first action part 240, and warpage of X axis direction is reduced.

However, the warpage of Y axis is not reduced in the actuator 91 of the first comparative example. On the other hand, in the actuator 92 of the second comparative example, the first slit 242 is provided in the second beam 210, and therefore, there is possibility that the warpage of Y axis direction can be reduced.

Figure 8A:
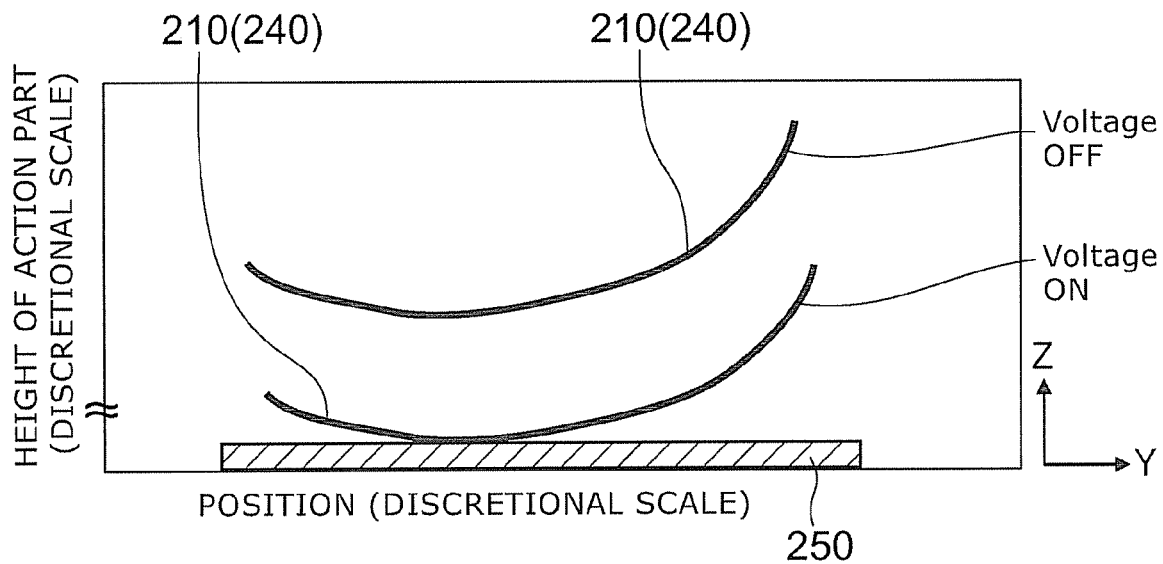
FIGS. 8A and 8B are a schematic sectional view illustrating characteristics of the actuators of the first and second comparative examples, respectively.
Figure 8B:
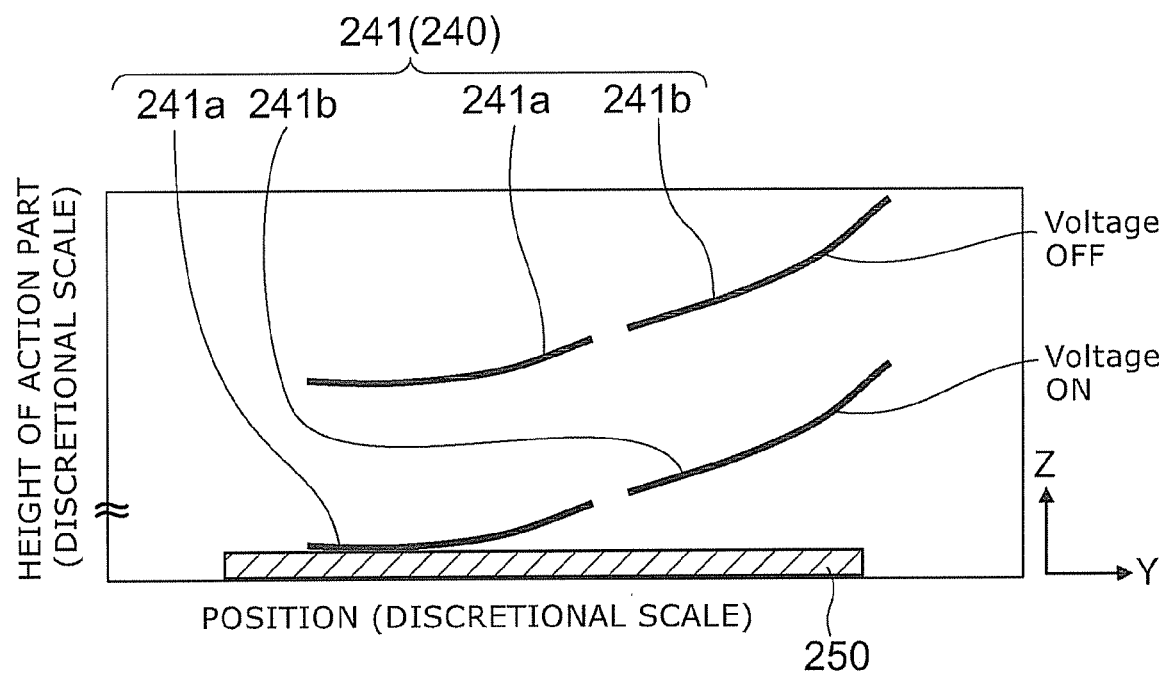

FIGS. 8A and 8B are a schematic sectional view illustrating characteristics of the actuators of first and second comparative examples, respectively.

That is, FIGS. 8A and 8B are sectional views schematically showing line C-C' of FIGS. 6A and 6B, and the horizontal axis represents position of Y axis direction and the vertical axis represents position of Z axis direction. And, FIGS. 8A and 8B shows the states of the second beam 210 when the applied voltages to the first piezoelectric film 163 and the second piezoelectric film 263 are OFF and ON. The second beam 210 has a stacked structure but is omitted, and the first dielectric film 253 is also omitted and drawn.

As shown in FIG. 8A, in the actuator 91 of the first comparative example, the second beam 210 bends to in the upside at a concave portion. This is caused by the residual strain in the film generated by the stacked structure of the lower electrode, piezoelectric film, upper electrode, and support film composing the second beam 210. Therefore, the second beam 210 come to have a curved surface, and the second beam 210 contacts the first fixed electrode 250 (through the first dielectric film 253) only by a part of the curved surface, and the area in which the second beam 210 and the first fixed electrode 250 are approximated is small. Therefore, the maximum capacitance is small.

On the other hand, as shown in FIG. 8B, in the actuator 92 of the second comparative example, the first slit 242 is provided in the first action end 211 side of the second beam 210, and therefore, the curved-surface shape of the first action part 240 of the second beam 210 is more relaxed than that of the actuator 91. Therefore, the area in which the second beam 210 and the first fixed electrode 250 are approximated is larger than that of first comparative example and also the maximum capacitance becomes larger than that of first comparative example. However, the division part 241b cannot contact the first fixed electrode 250 (through the first dielectric film 253), and the improvement degree thereof is smaller than that of actuator 10 of this embodiment.

Figure 9:
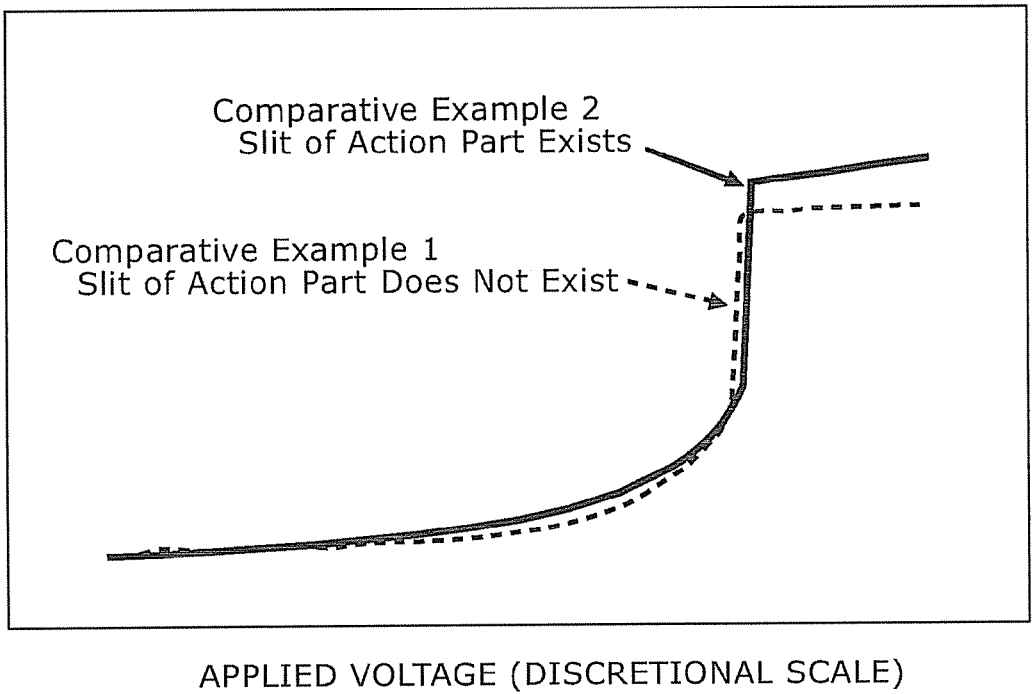
FIG. 9 is a graphic view illustrating characteristics of the first and second comparative examples.

FIG. 9 is a graphic view illustrating characteristics of the first and second comparative examples.

The horizontal axis of FIG. 9 shows applied voltage to the first piezoelectric film 163 and the second piezoelectric film 263, and the vertical axis shows capacitance formed by the first action part 240 of the second beam 210 and the first fixed electrode 250. And, dashed line shows first comparative example and solid line shows second comparative example.

As shown in FIG. 9, in the actuators 91, 92 of the first and second comparative examples, the change of the capacitance to the applied voltage is precipitously changed in therefore, vicinity of the maximum capacitance. Hereinafter, this phenomenon will be explained.

Figure 10:
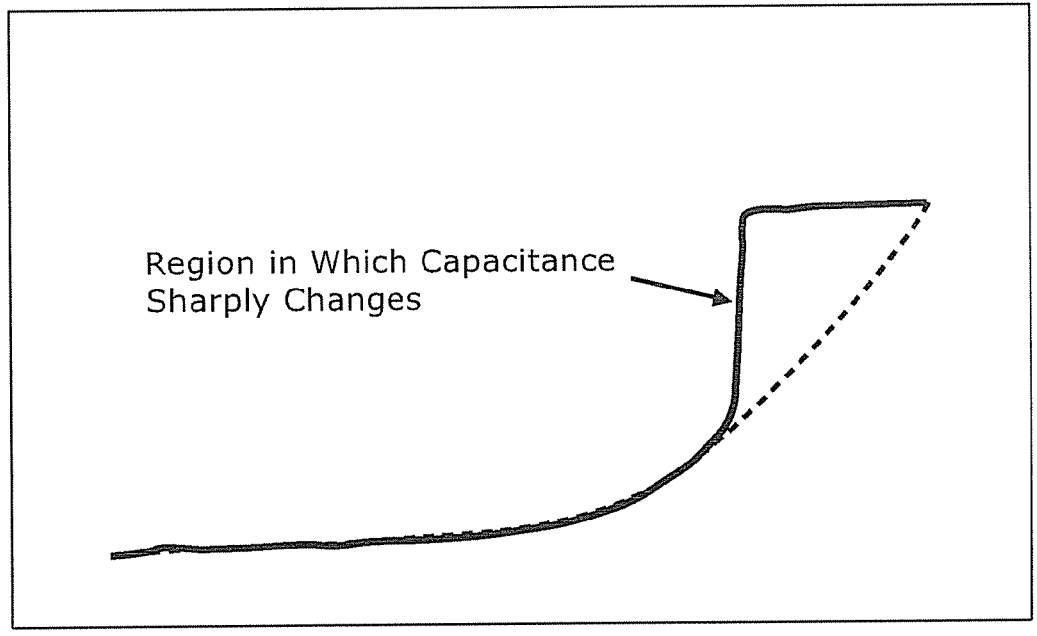
FIG. 10 is a graphic view illustrating characteristics of the actuator of the first comparative example.

FIG. 10 is a graphic view illustrating characteristics of the actuator of the first comparative example.

The horizontal axis of FIG. 10 shows the applied voltage to the first piezoelectric film 163 and the second piezoelectric film 263, and the horizontal axis shows capacitance formed by the first action part 240 of the second beam 210 and the first fixed electrode 250. And the solid line shows actual characteristics and the dashed line illustrates a simulation result of the characteristics when it is hypothesized that the electrostatic attractive force does not act on the first action part 240 from the first fixed electrode 250.

As shown in the dashed line of FIG. 10, when the electrostatic attractive force does not act on the first action part 240 from the first fixed electrode 250, the capacitance gradually increases with increase of the applied voltage. However, actually, if the distance between the first action part 240 and the first fixed electrode 250 becomes smaller than a predetermined distance, the electrostatic attractive force acting between the first action part 240 and the first fixed electrode 250 becomes large, and in addition of the electrostriction of the second beam 210 by the applied voltage, this electrostatic attractive force acts thereon and therefore the capacitance becomes shapely changed (solid line of FIG. 10).

Therefore, as represented by the dashed line of FIG. 9, in the actuator 91 of the first comparative example in which the action part 240 is not provided with the slit, the capacitance is precipitously changed in the vicinity of the maximum capacitance. This is because the division part is not provided in the actuator 91 and therefore when the electrostatic attractive force acts on the first action part 240, the first action part 240 does not move step-by-step.

On the other hand, in the actuator 92 of second comparative example in which the first action part 240 provided with the slit, the first action part 240 is provided with the division portions 241a, 241b, and therefore, as represented by the solid line of FIG. 9, the maximum capacitance is slightly larger than that of the first comparative example (dashed line of FIG. 9), but the improvement of the precipitous change of the applied voltage-capacitance characteristics is relatively small. It is thought that this is because in the second comparative example, the first slit 242 is provided only in the first action part 240 opposed to the first fixed electrode 250 and the length of the first slit 242 is short. That is, the length of X axis direction of the division portions 241a, 241b is short and the freedom degree of movement of the division portions 241a, 241b is small. Therefore, if the electrostatic attractive force acts thereon, the division portions 241a, 241b interlocks and moves at once and cannot move step-by-step. Therefore, in the actuator 92 of second comparative example, it can be assumed that the degree of improvement of precipitous property of the applied voltage-capacitance characteristics is small.

On the other hand, as explained previously, in the actuator 10 according to this embodiment, the length of the first slit 222 of the second beam 210, namely, the length of the X axis direction of the first division part 221 is longer than the length of X axis direction of the first action part 240 and longer than that of the case of the second comparative example. Thereby, in the actuator 10 according to this embodiment, freedom degree of movement of the first division part 221 (division portions 221a, 221b) is more enhanced, and even if the electrostatic attractive force acts thereon, the two division portions 221a, 221b can independently transform step-by-step, and therefore, as a result, the effect of the warpage of the beam can substantially be dissolved, and the maximum capacitance becomes large, and the precipitous change of capacitance in the vicinity of the maximum capacitance can be relaxed.

As described above, there has been presented an example in which voltages of different polarities from each other are applied both between the first lower electrode 164 and the first upper electrode 162 and between the second lower electrode 264 and the second upper electrode 262, but it is also possible to drive the actuator with applying voltage only between the first lower electrode 164 and the first upper electrode 162 or only between the second lower electrode 264 and the second upper electrode 262.

Moreover, in this embodiment, the slit 222 may be one or plural.

Figure 11:
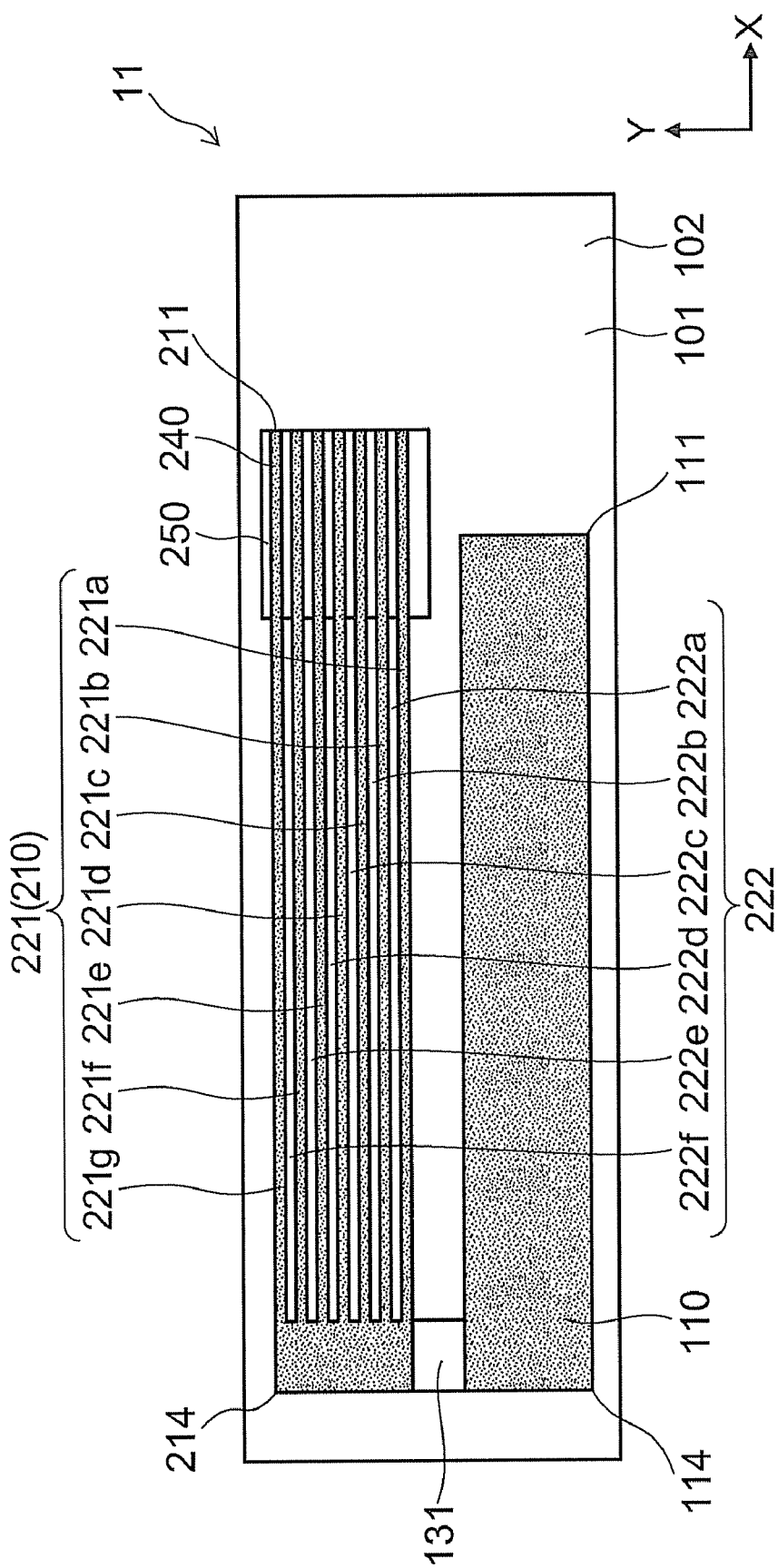
FIG. 11 is a schematic plan view illustrating another structure of the actuator of the first embodiment of this invention.

FIG. 11 is a schematic plan view illustrating another structure of the actuator of the first embodiment of this invention.

As shown in FIG. 11, in the actuator 11 of another example according to the first embodiment, the second beam 210 extends to the direction from the first action end 211 to the second connective end 214 and is provided with six first slits 222 (222a to 222f) and has seven first division portions 221 (221a to 221g) divided thereby. And, the first slits 222 (222a to 222f) and the first division portions 221 (221a to 221g) are provided by the length from the first action end 211 to the first connective part 131. And, the first fixed electrode 250 is provided so as to be opposed to a part of the first division part 221 of the second beam 210 on a side of the first action end 211. That is, the length of X axis direction of the first slits 222 (222a to 222f) and the first division portions 221 (221a to 221g) is longer than the length of X axis direction of the first action part 240 opposed to the first fixed electrode 250.

Sizes of the respective components in the actuator 11 illustrated in FIG. 11 are exemplified as follows.

Length from the first fixed end 111 of the first beam 110 to the first connective end 114 is 400 µm, Width of the first beam 110 (length of Y axis direction) is 40 µm, Length of the first connective portion 131 (length of Y axis direction) is 25 µm, Width of the connective part 131 (length of X axis direction) is 40 µm, Length from the first action end 211 of the second beam 210 to the second connective end 214 is 450 µm, Length of the slit 222 is 410 µm, Width of the slit 222 (slits 222a to 222g) is 5 µm, Width of the division part 221 (division portion 221a to 222g) is 10 µm, and Gap between the second beam 210 (first action part 240) and the first fixed electrode 250 is about 1 µm.

However, this invention is not limited thereto.

Figure 12:
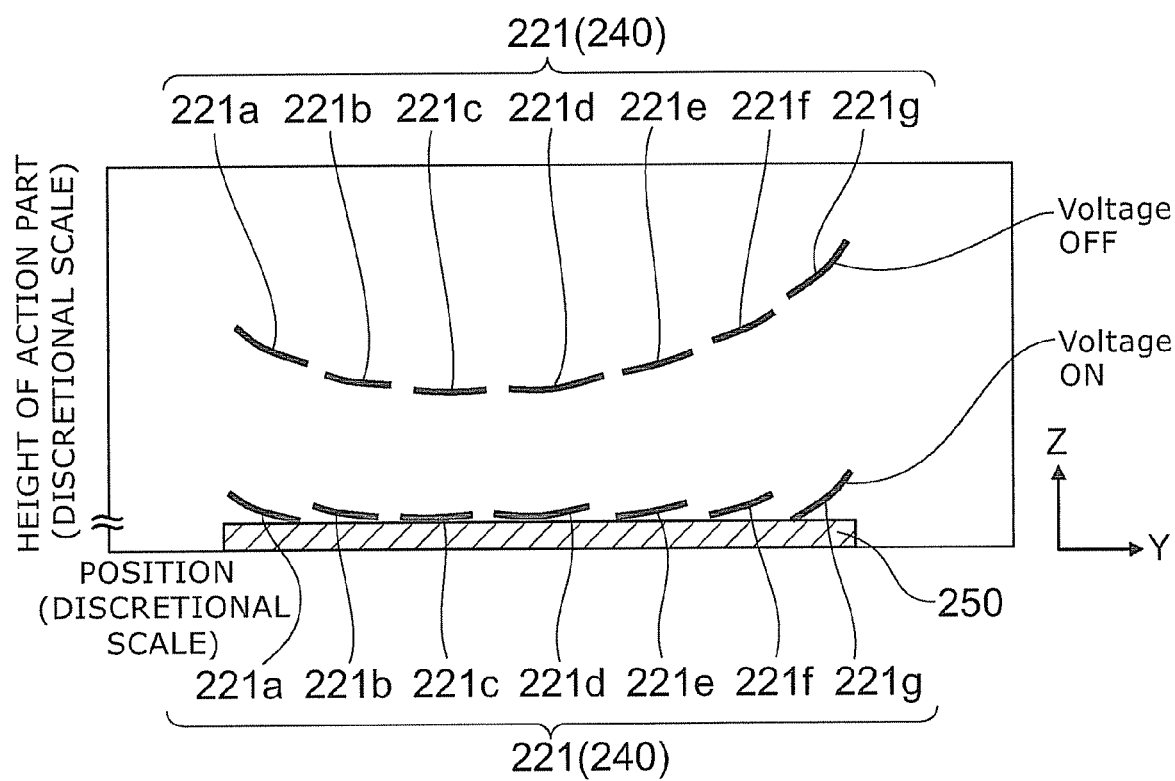
FIG. 12 is a schematic sectional view illustrating another characteristic of the actuator according to the first embodiment of this invention.

FIG. 12 is a schematic sectional view illustrating another characteristic of the actuator according to the first embodiment of this invention.

FIG. 12 is a sectional view schematically showing line C-C', and the horizontal axis represents position of Y axis direction, and the vertical axis represents position of z axis direction.

And, FIG. 12 shows the states of the second beam 210 when the applied voltages to the first piezoelectric film 163 and the second piezoelectric film 263 are OFF and ON. The second beam 210 has a stacked structure but is omitted, and the first dielectric film 253 is also omitted and drawn.

As shown in FIG. 12, in the actuator 11, seven first division portions 221 (221a to 221g) can independently move, and therefore, freedom degree of movement of the first division portions 221 (221a to 221g) is high, and in ON, each of the division portions 221a to 221g of the division part 221 can contact the first fixed electrode 250 (through the first dielectric film 253). Therefore, the area in which the first division portions 221 (221a to 221g) and the first fixed electrode 250 are approximated becomes further larger than that of the actuator 10 illustrated in FIG. 1, and the maximum capacitance can be further larger. Moreover, because the seven first division portions 221 (221a to 221g) can independently move, the applied voltage-capacitance characteristics can be further gradually changed according to movement of the seven first division portions 221 (221a to 221g). As described above, in the actuator 11, the effect of warpage of the beam can be substantially dissolved, and the maximum capacitance is large, and the shape change of capacitance in the vicinity of the maximum capacitance can be relaxed.

In this embodiment, the length of X axis direction of the first slit 222, namely, first division part 221 can be set to be longer than length of X axis direction of the first action part 240. In this case, the first slit 222 (first division part 221) may be provided in the almost entire region (length) from the first action end 211 to the second connective end 214 or may be provided to the midstream thereof. Moreover, when the first slit 222 is plural, length of the first slit 222 (first division part 221) may be changed in each of the plurality of slits 222 (first division part 221).

Figure 13:
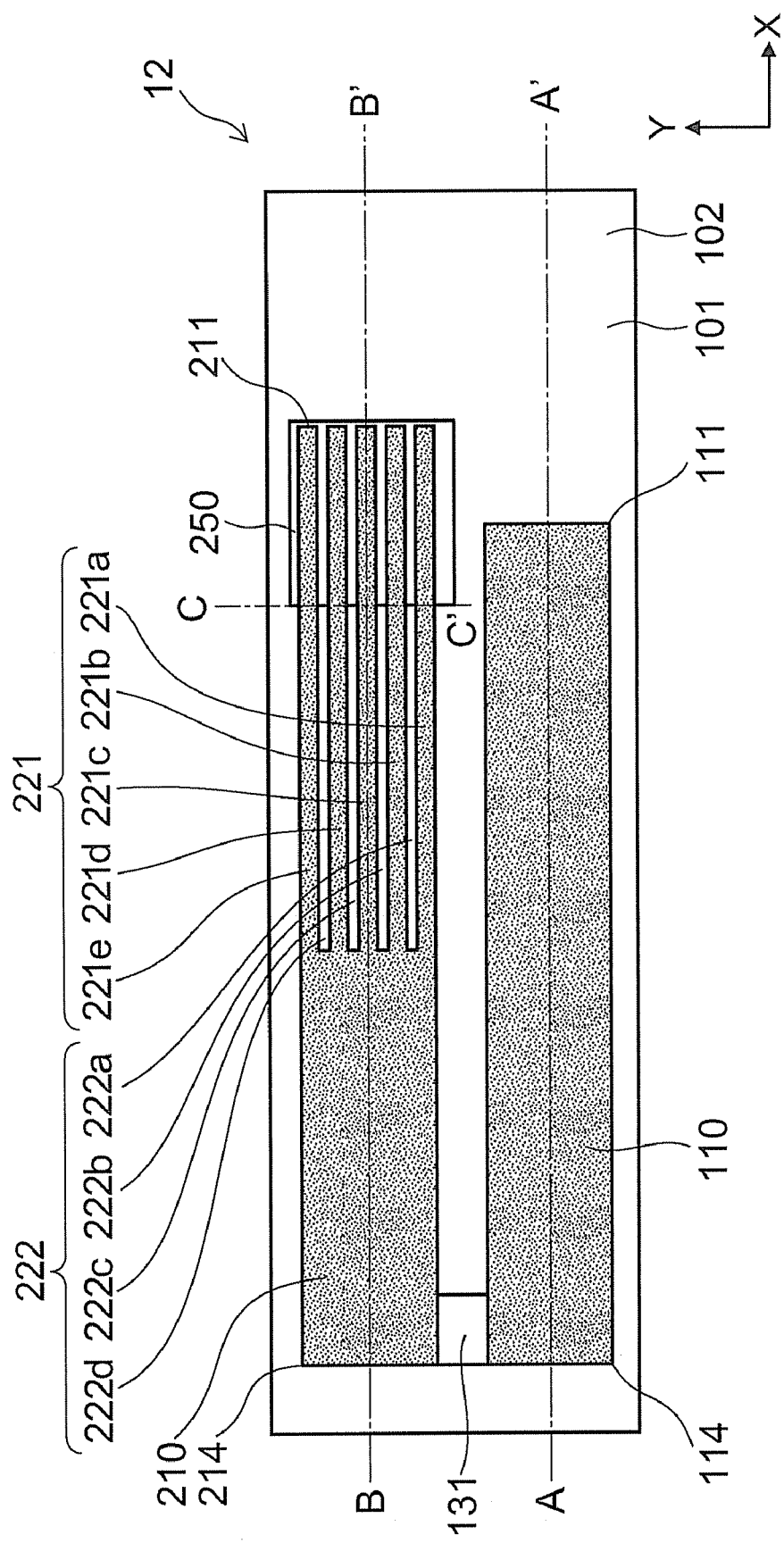
FIG. 13 is a schematic plan view illustrating another structure of the actuator of the first embodiment of this invention.

FIG. 13 is a schematic plan view illustrating another structure of the actuator of the first embodiment of this invention.

As shown in FIG. 13, in the actuator 12 of another example according to the first embodiment, in the second beam 210, four first slits 222 (222a to 222d) extending to the direction from the first action end 211 to the second connective end 214 are provided, and five first division portions 221 (221a to 221e) divided thereby are provided. And, the first slits 222 (222a to 222d), namely, the first division part 221 (221a to 221e) is set to be the length from the first action end 211 to the middle of the connective part 131. And, the first fixed electrode 250 is provided to be opposed to a part of the first division part 221 of the second beam 210 on a side of the first action end 211. That is, the length of X axis direction of the first slit 222 (222a to 222d) or the first division part 221 (221a to 221e) is longer than the length of X axis direction of the first action part 240 opposed to the first fixed electrode 250.

Also in the actuator 12 having this structure, the effect of warpage of the beam can be substantially dissolved, and the maximum capacitance is large, and the shape change of capacitance in the vicinity of the maximum capacitance can be relaxed.

Number or length of X axis direction of the first slit 222 and the first division part 221 provided in the second beam 210 can be appropriately set according to, residual strain or mechanical strength of the stacked film composing the second beam 210, width of the first slit 222 (length of Y axis direction), width of the first division part 221 (length of Y axis direction), processing accuracy of the production process, requirement specification of the maximum capacitance, requirement specification of precipitousness of applied voltage-capacitance characteristics, and so forth.

Figure 14A:
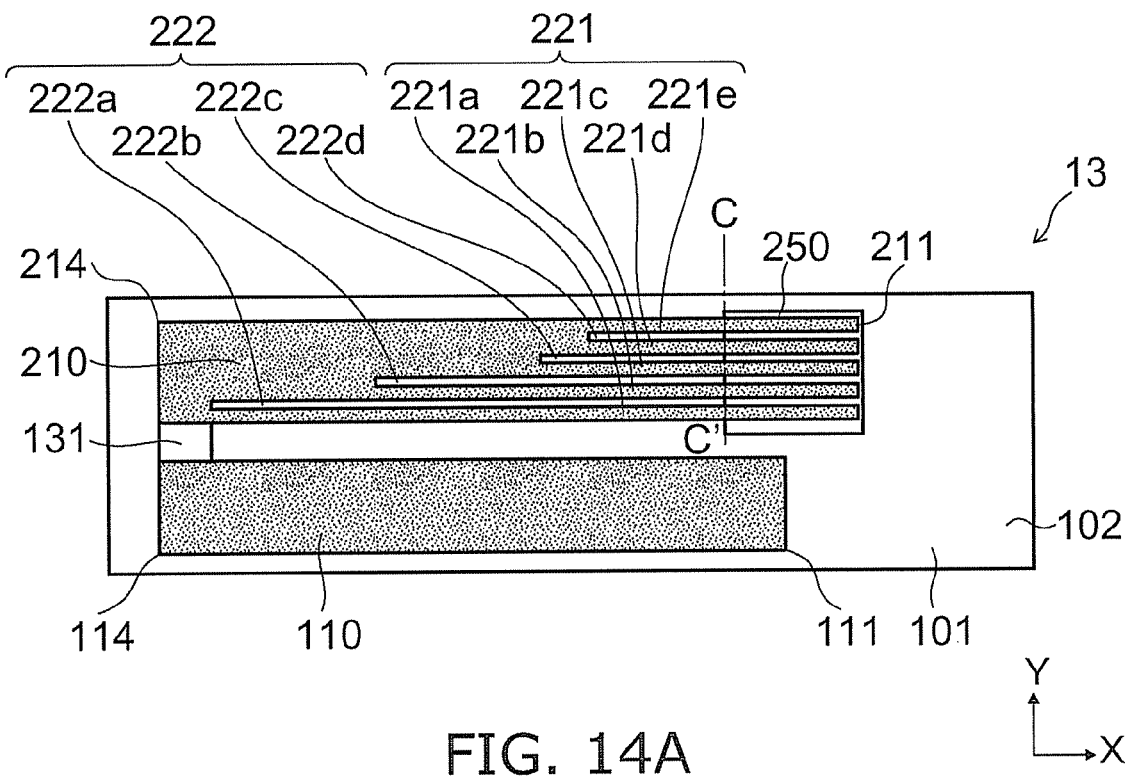
FIGS. 14A and 14B are schematic plan views illustrating other structures of the actuator of the first embodiment of this invention.
Figure 14B:
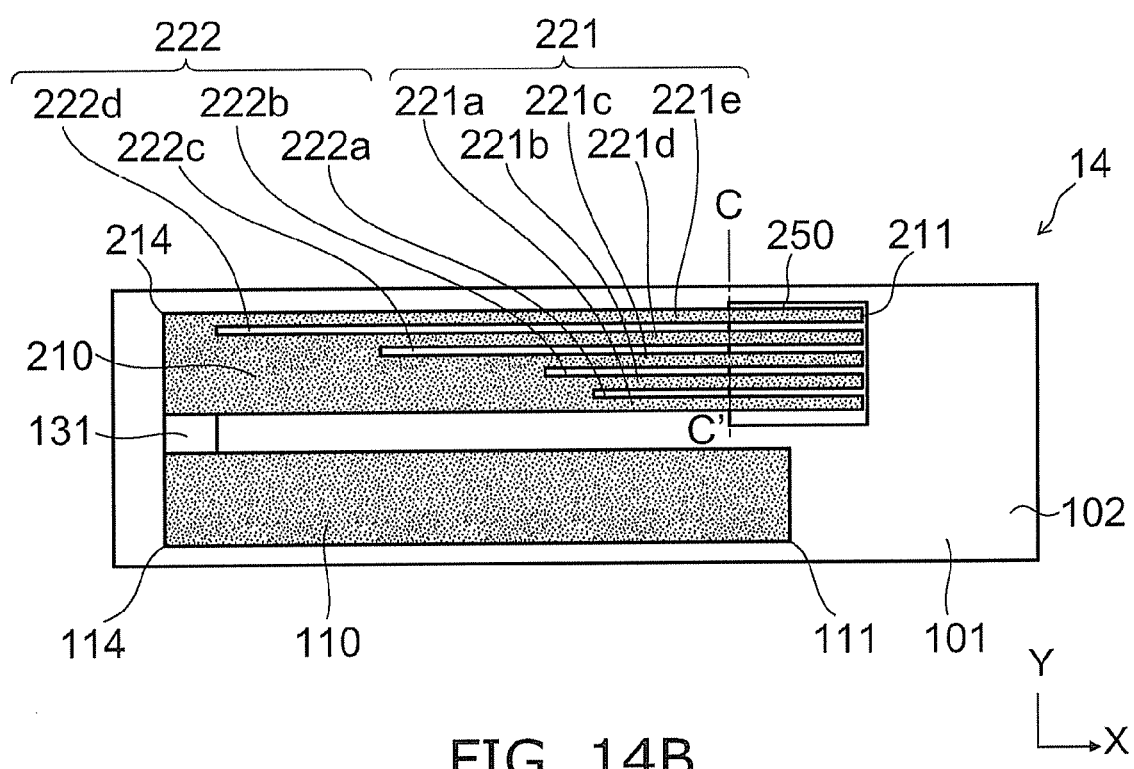

FIGS. 14A and 14B are schematic plan views illustrating other structures of the actuator of the first embodiment of this invention.

As shown in FIGS. 14A and 14B, in the actuators 13, 14 of other examples according to the first embodiment, in the second beam 210, four first slits 222 (222a to 222d) extending to the direction from the first action end 211 toward the second connective end 214 are provided, and five first division portions 221 (221a to 221e) divided thereby are provided. And, lengths of the first slits 222 (222a to 222d), namely, the first division part 221 (221a to 221e) are different from one another.

In the actuator 13 illustrated in FIG. 14A, the first slit 222a (division portion 221a) of the first beam 110 side is long, and length of the first slit 222 (first division part 221) is shorter as the slit is remoter from the first beam 110. That is, freedom degree of movement of the first division part 221 of the first beam 110 side is higher, and the freedom degree of the movement is lower as the first division part 221 is remoter from the first beam 110.

By contrast, in the actuator 14 illustrated in FIG. 14B, the first slit 222a (division portion 221a) of the first beam 110 side is short, and length of the first slit 222 (first division part 221) is longer as the slit is remoter from the first beam 110. That is, freedom degree of movement of the first division part 221 of the first beam 110 side is lower, and the freedom degree of the movement is higher as the first division part 221 is remoter from the first beam 110.

As described above, by changing the freedom degree of each of the movements of the plurality of division portions 221, the applied voltage-capacitance characteristics can be precipitous or slack.

Furthermore, by appropriately changing length of the plurality of first slits 222 (a plurality of first division portions 221), the applied voltage-capacitance characteristics can be a discretionary shape.

In this embodiment, when the first fixed electrode 250 is provided to be opposed to a part of the first division part 221 on a side of the first action end 211 and three or more first division portions 221 are provided by the plurality of first slits as described above and the lengths thereof is different from each other, it is sufficient that any one of the first division portions 221 is longer than the length of the first action part 240.

Furthermore, widths of the division portions 221 (lengths of Y axis direction) divided by the first slits 222 can also be discretionally set.

Figure 15A:
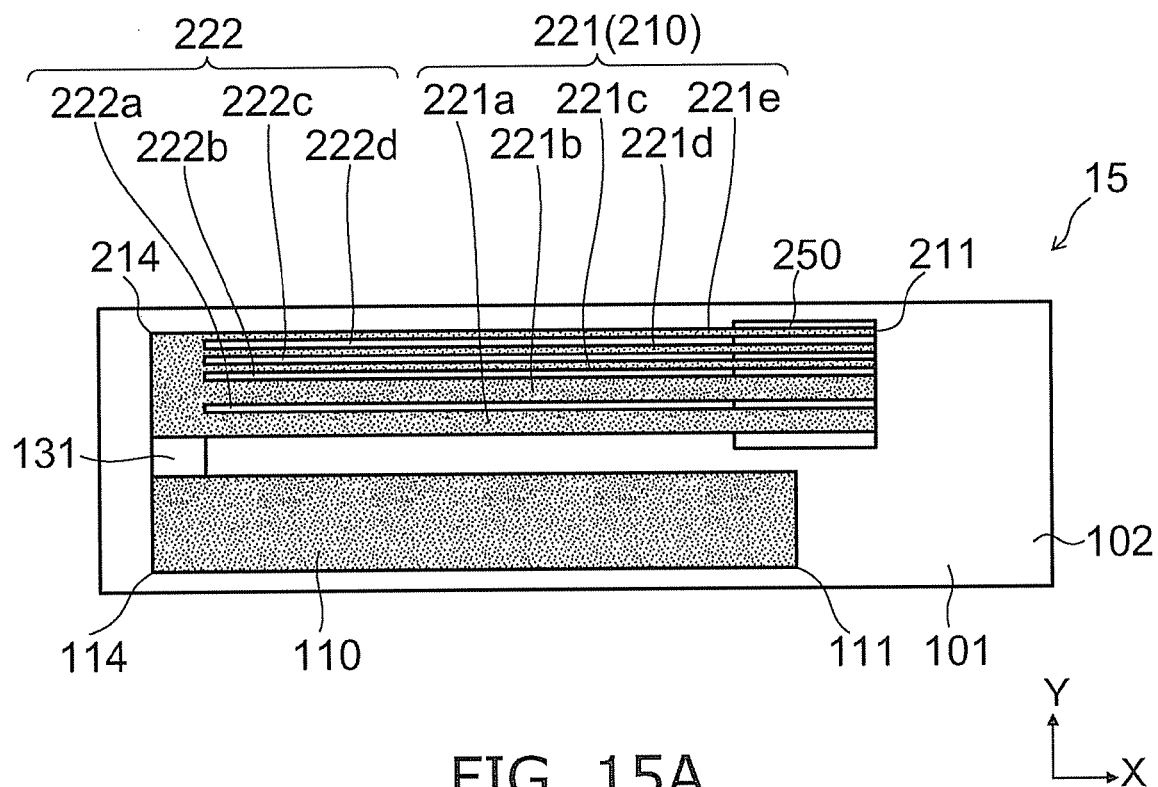
FIGS. 15A and 15B are schematic plan views illustrating other structures of the actuator of the first embodiment of this invention.
Figure 15B:
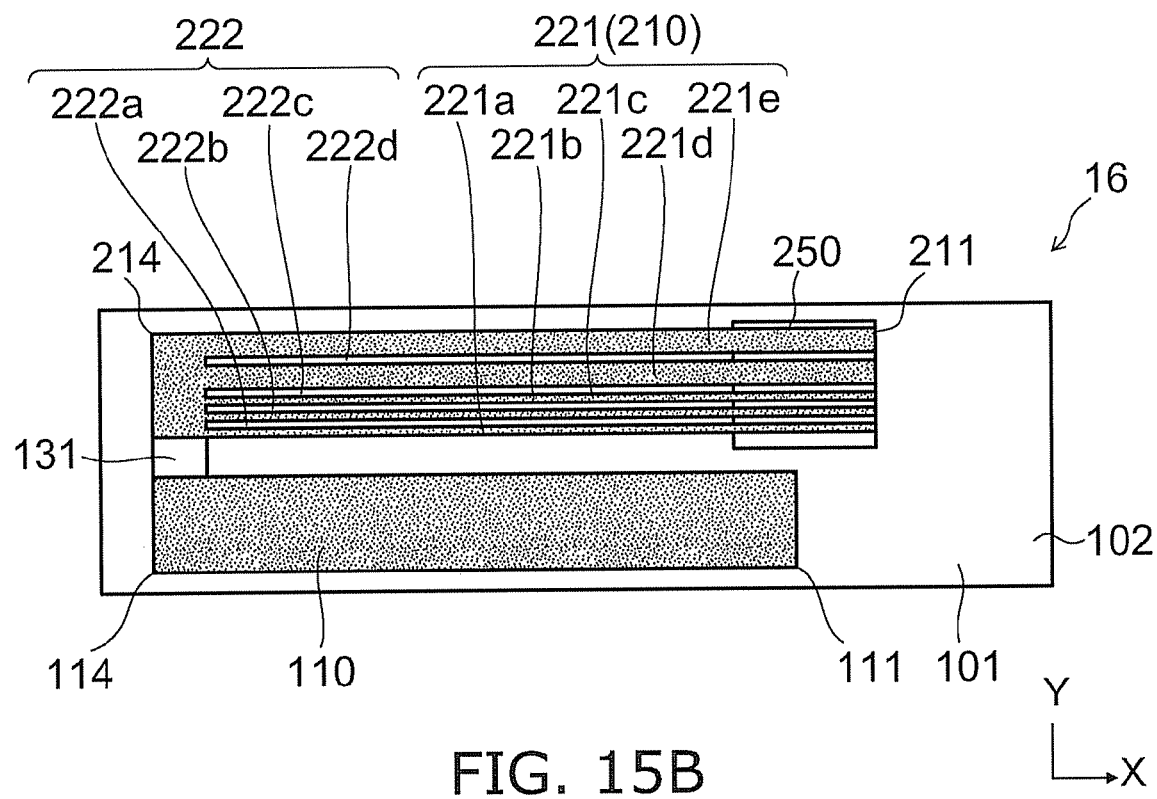

FIGS. 15A and 15B are schematic plan views illustrating other structures of the actuator of the first embodiment of this invention.

As shown in FIGS. 15A and 15B, in the actuators 15, 16 of other examples according to the first embodiment, in the second beam 210, four first slits 222 (222a to 222d) extending to the direction from the first action end 211 toward the second connective end 214 are provided, and five first division portions 221 (221a to 221e) divided thereby are provided. And, widths of division portions 221a to 221e of the first division part 221 (lengths of Y axis direction) are different.

In the actuator 15 illustrated in FIG. 15A, widths of the division portions 221a, 221b of the first beam 110 side are wide and widths of the division portions 221c to 221e of the far side from the first beam 110 are narrow. That is, freedom degree of movement of the division portions of the first beam 110 side is high, and freedom degree of movement of the far division portions from the first beam 110 is low.

By contrast, in the actuator 16 illustrated in FIG. 15B, widths of the division portions 221a to 221c of the first beam 110 side are narrow and widths of the division portions 221d, 221e of the far side from the first beam 110 are wide. That is, freedom degree of movement of the division portions of the first beam 110 side is high, and freedom degree of movement of the far division portions from the first beam 110 is low.

As described above, by changing the freedom degree of each of the movements of the plurality of division portions 221, the applied voltage-capacitance characteristics can be precipitous or slack.

Furthermore, by appropriately changing widths of the plurality of the first division portions 221, the applied voltage-capacitance characteristics can be a discretionary shape.

Furthermore, lengths and widths of the plurality of the first division portions 221 may be changed at the same time.

Moreover, widths of the plurality of the first slits 222 may be changed.

The first fixed part 140 can be formed by a material composing the first beam 110.

Figure 16:
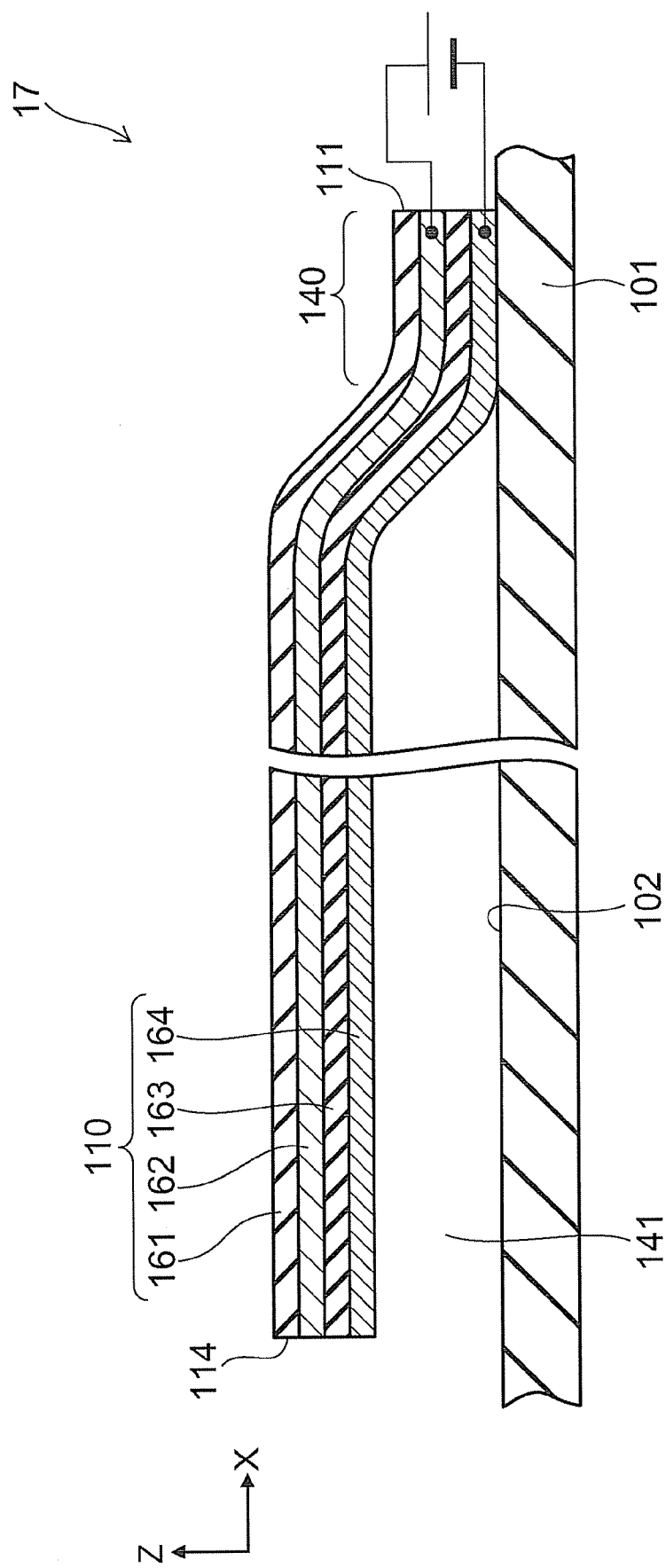
FIG. 16 is a sectional view of line A-A' of FIG. 1 illustrating another structure of the actuator according to the first embodiment of this invention.

FIG. 16 is a sectional view of line A-A' of FIG. 1 illustrating another structure of the actuator according to the first embodiment of this invention.

The actuator 17 according to the first embodiment of this invention illustrated in FIG. 16 has the same structure as the actuator 10 illustrated in FIG. 1, except for the sectional structure of the first beam 110, and therefore, only the sectional structure of the first beam 110 will be explained.

As shown in FIG. 16, in the actuator 17, the first beam 110 is bended to the thickness direction (Z axis direction) of the first beam 110 in a part of the first fixed end 111. And, this part connects the first beam 110 and the substrate 101 and supports the first beam 110 above the main surface 102 of the substrate 101 with the gap 141. That is, the part bended in the vicinity of the first fixed end 111 out of the first beam 110 is the first fixed end 140. Also, in the actuator 17 having such a structure, as with the actuator 10, there can be provided an actuator in which by reducing the effect of warpage of the beams, the maximum capacitance is large and the precipitous change of the capacitance in the vicinity of the maximum capacitance is relaxed.

The actuator 17 illustrated in FIG. 16 can be obtained by, for example, forming the first fixed electrode 250 and the first dielectric film 253 thereon in a predetermined shape on the main surface 102 of the substrate 101, then forming a sacrifice layer of a predetermined pattern, then sequentially depositing to form a layer to be the lower electrodes, a layer to be the piezoelectric films, a layer to be the upper electrodes, and a layer to be support films, patterning the deposited layers to be a predetermined shape, forming the first beam 110, the second beam 210, and the first connective part 131, and then removing the sacrifice layer.

In the actuator 10 illustrated in FIG. 1 or the actuator 17 illustrated in FIG. 16, the first beam 110 and the second beam 210 have a sectional structure illustrated in FIGS. 2, 3, and 16, namely, a monomorph structure but is not limited thereto. That is, it is sufficient that the first beam 110 and the second beam 210 contain a piezoelectric film sandwiched two electrodes, and the beams can have various structures such as a bimorph structure and asymmetric bimorph structure, as well as the monomorph structure.

Figure 17:
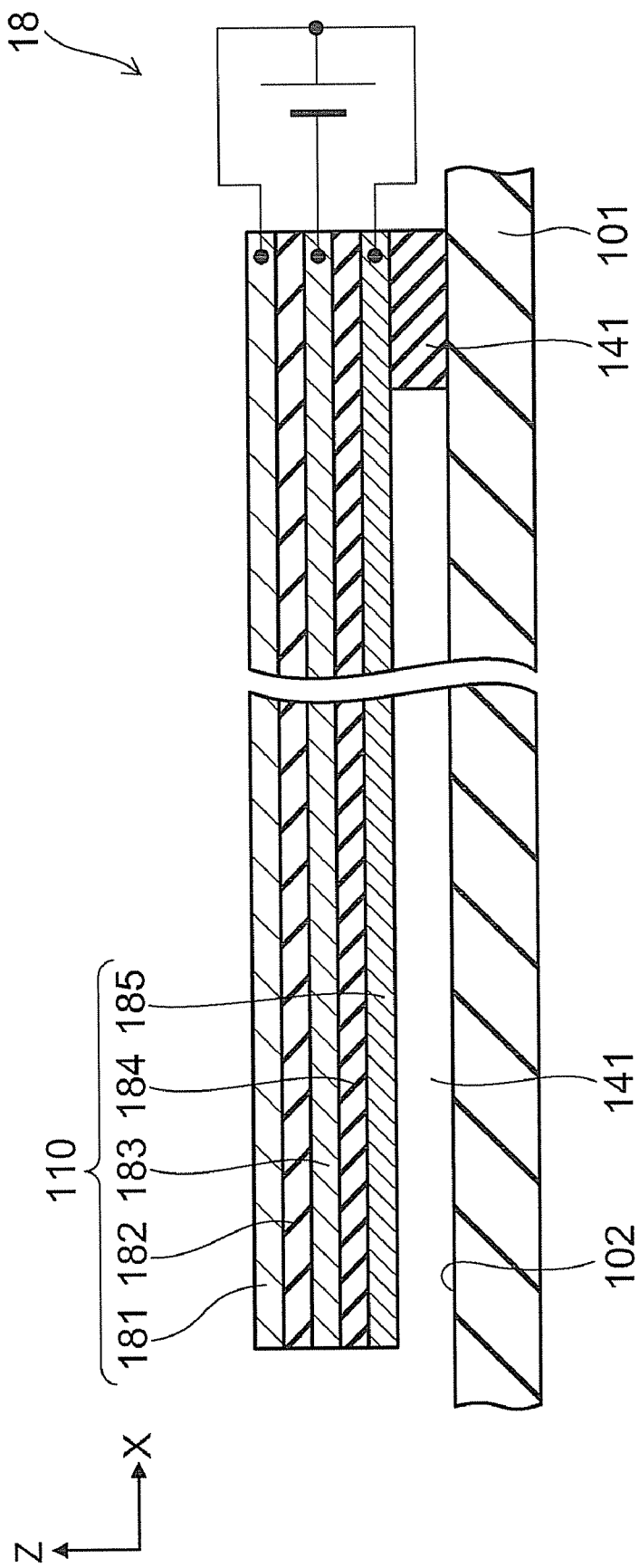
FIG. 17 is a sectional view of line A-A' of FIG. 1 illustrating another structure of the actuator according to the first embodiment of this invention.

FIG. 17 is a sectional view of line A-A' of FIG. 1 illustrating another structure of the actuator according to the first embodiment of this invention.

Figure 18:
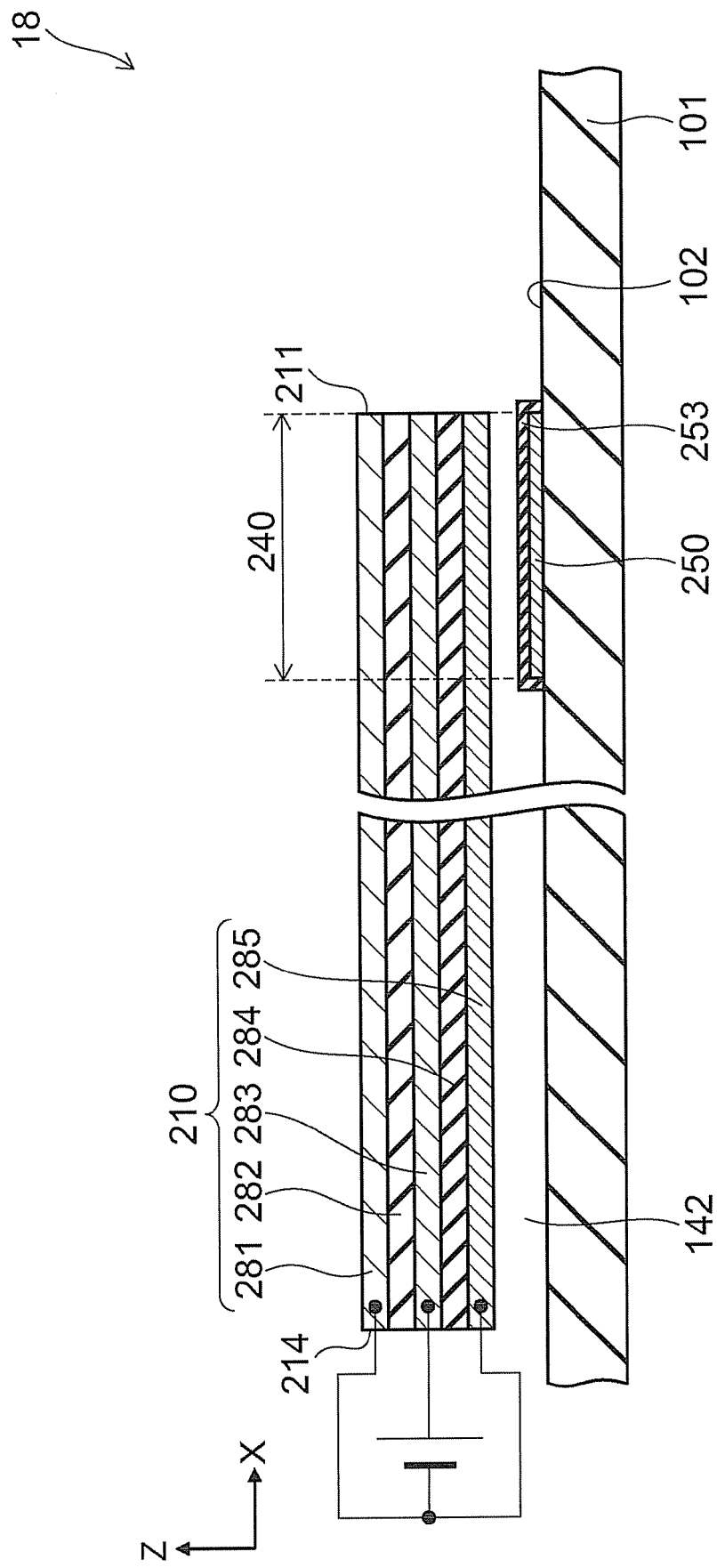
FIG. 18 is a sectional view of line B-B' of FIG. 1 illustrating another structure of the actuator according to the first embodiment of this invention.

FIG. 18 is a sectional view of line B-B' of FIG. 1 illustrating another structure of the actuator according to the first embodiment of this invention.

That is, in another actuator 18 according to the first embodiment of this invention, the first beam 110 and the second beam 210 have a bimorph structure in the actuator 10 illustrated in FIG. 1, and planar shape and so forth are the same as FIG. 1.

As shown in FIG. 17, in another actuator 18 according to the first embodiment of this invention, the first beam 110 has a first lower electrode 185 opposed to the main surface 102 of the substrate 101, a first upper electrode 181 opposed to the first lower electrode 185, and a first piezoelectric film 184 sandwiched between the first lower electrode 185 and the first upper electrode 181. And, the first beam 110 further has a first intermediate electrode 183 provided between the first piezoelectric film 184 and the first upper electrode 181 and a first upper piezoelectric film 182 provided between the first intermediate electrode 183 and the first upper electrode 181. That is, the first beam 110 has a structure in which the first lower electrode 185, the first piezoelectric film 184, the first intermediate electrode 183, the first upper piezoelectric film 182, and the first upper electrode 181 are stacked.

On the other hand, as shown in FIG. 18, the second beam 210 has a second lower electrode 285 opposed to the main surface 102 of the substrate 101, an upper electrode 281 opposed to the second lower electrode 285, and a second piezoelectric film 284 sandwiched between the second lower electrode 285 and the second upper electrode 281. And, the second beam 210 further has a second intermediate electrode 283 provided between the second piezoelectric film 284 and the second upper electrode 281 and a second upper piezoelectric film 282 provided between the second intermediate electrode 283 and the second upper electrode 281. That is, the second beam 210 has a structure in which the second lower electrode 285, the second piezoelectric film 284, the second intermediate electrode 283, the second upper piezoelectric film 282, and the second upper electrode 281 are stacked.

The first lower electrode 185 and the second lower electrode 285 can be the same layer and can contain the same material. Moreover, the first piezoelectric film 184 and the second piezoelectric film 284 can be the same layer and can contain the same material. Moreover, the first intermediate electrode 183 and the second intermediate electrode 283 can be the same layer and can contain the same material. Moreover, the first upper piezoelectric film 182 and the second upper piezoelectric film 282 can be the same layer and can contain the same material. And, the first upper electrode 181 and the second upper electrode 281 can be the same layer and can contain the same material. However, this invention is not limited thereto.

Furthermore, the first connective part 131 can contain the respective and substantially same layers as the first lower electrode layer composing the first lower electrode 185, the first piezoelectric film layer composing the first piezoelectric film 184, the first intermediate electrode layer composing the first intermediate electrode 183, the first upper piezoelectric film layer composing the first upper piezoelectric film 182, and the first upper electrode layer composing the first upper electrode 181. However, this invention is not limited thereto.

And, in the actuator 18 illustrated in the FIGS. 17 and 18, voltage is applied between the first lower electrode 185 and the first intermediate electrode 183 and between the first intermediate electrode 183 and the first upper electrode 181. Moreover, voltage is applied between the second lower electrode 285 and the second intermediate 283 and between the second intermediate electrode 283 and the second upper electrode 281. And, polarity of the voltage applied between the respective films of the first beam 110 and polarity of the voltage applied between the respective films of the second beam 210 are reverse.

Thereby, when the first piezoelectric film 184 constricts (extends), the first upper piezoelectric film 182 extends (constricts), and bending is generated in the first beam 110, and when the second piezoelectric film 284 extends (constricts), the second upper piezoelectric film 282 constricts (extends). Thereby, the distance between the first action part 240 and the first fixed electrode 250 can be changed.

In the actuator 18, the second beam 210 is provided with a long division part 221, and thereby, the effect of warpage of the beam can be substantially dissolved, and the maximum capacitance is large, and the actuator 18 has the effect that of relaxing the precipitous change of capacitance in the vicinity of the maximum capacitance and further has a bimorph structure, and therefore, the driving voltage thereof can be reduced more than that of the actuator 10 having a monomorph structure.

The actuators 11 to 17 illustrated in FIGS. 11, 13 to 16 can also have the bimorph structure illustrated in FIGS. 17 and 18, and also in this case, the driving voltage can be reduced.

Second Embodiment

Figure 19:
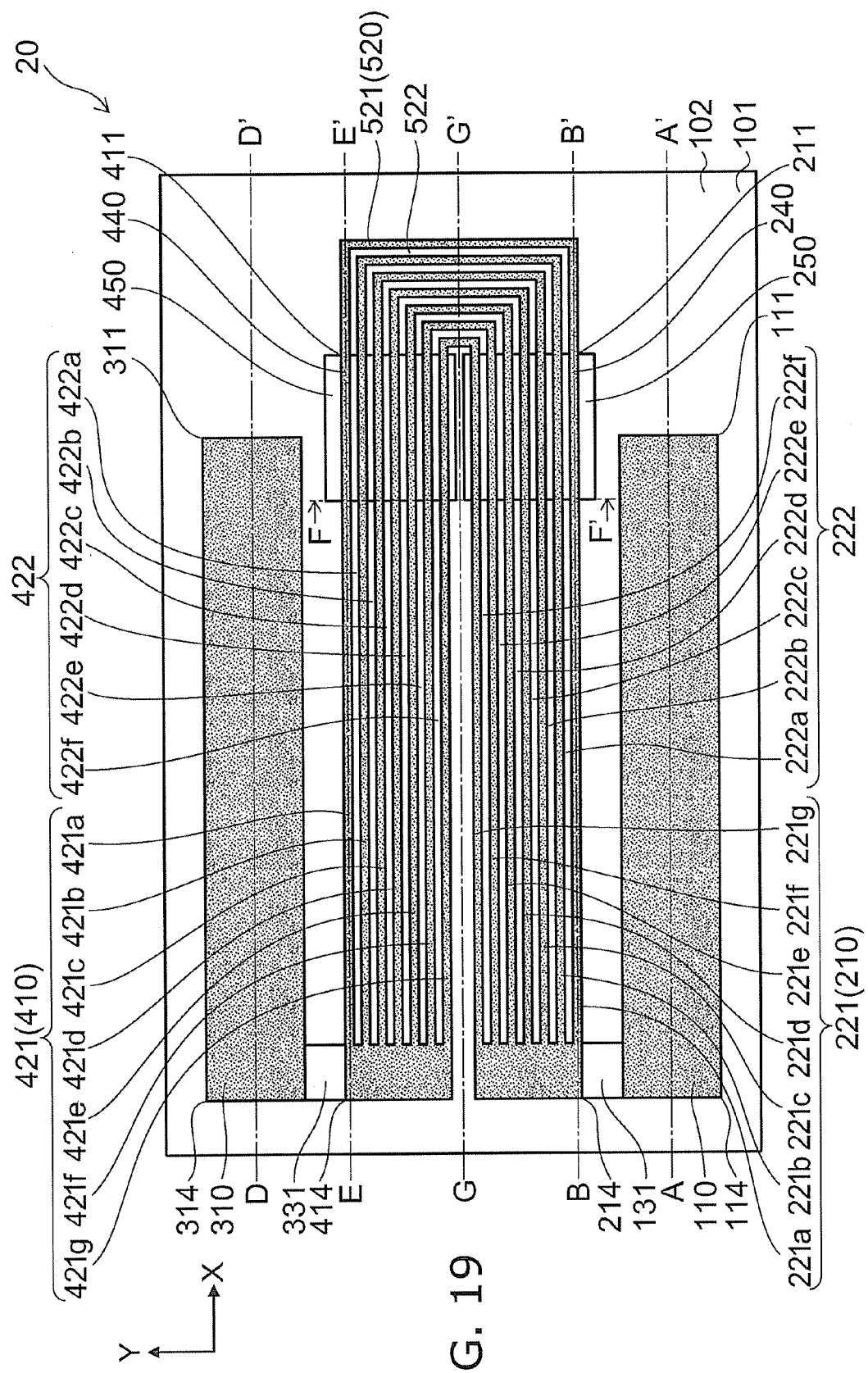
FIG. 19 is a schematic plan view illustrating a structure of an actuator according to a second embodiment of this invention.

FIG. 19 is a schematic plan view illustrating a structure of an actuator according to a second embodiment of this invention.

Figure 20:
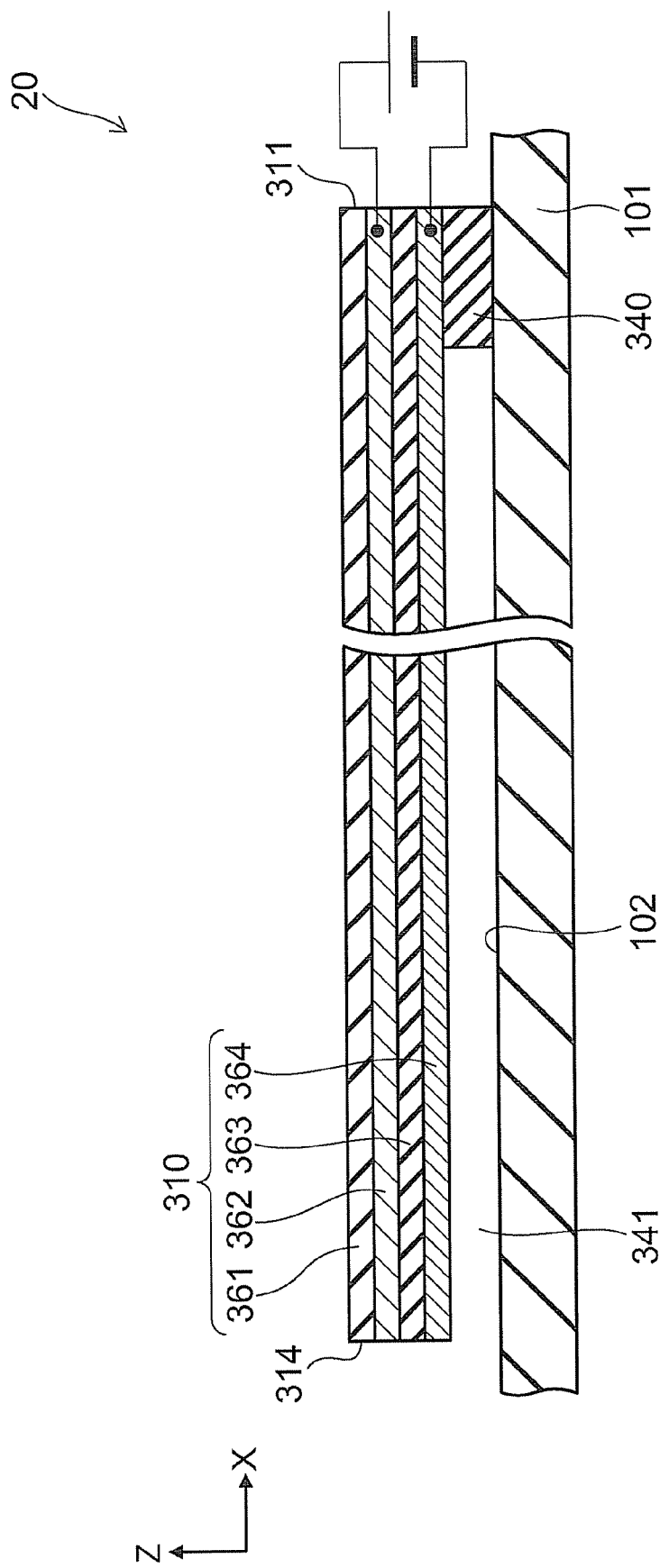
FIG. 20 is a sectional view of line D-D' of FIG. 19.
Figure 21:
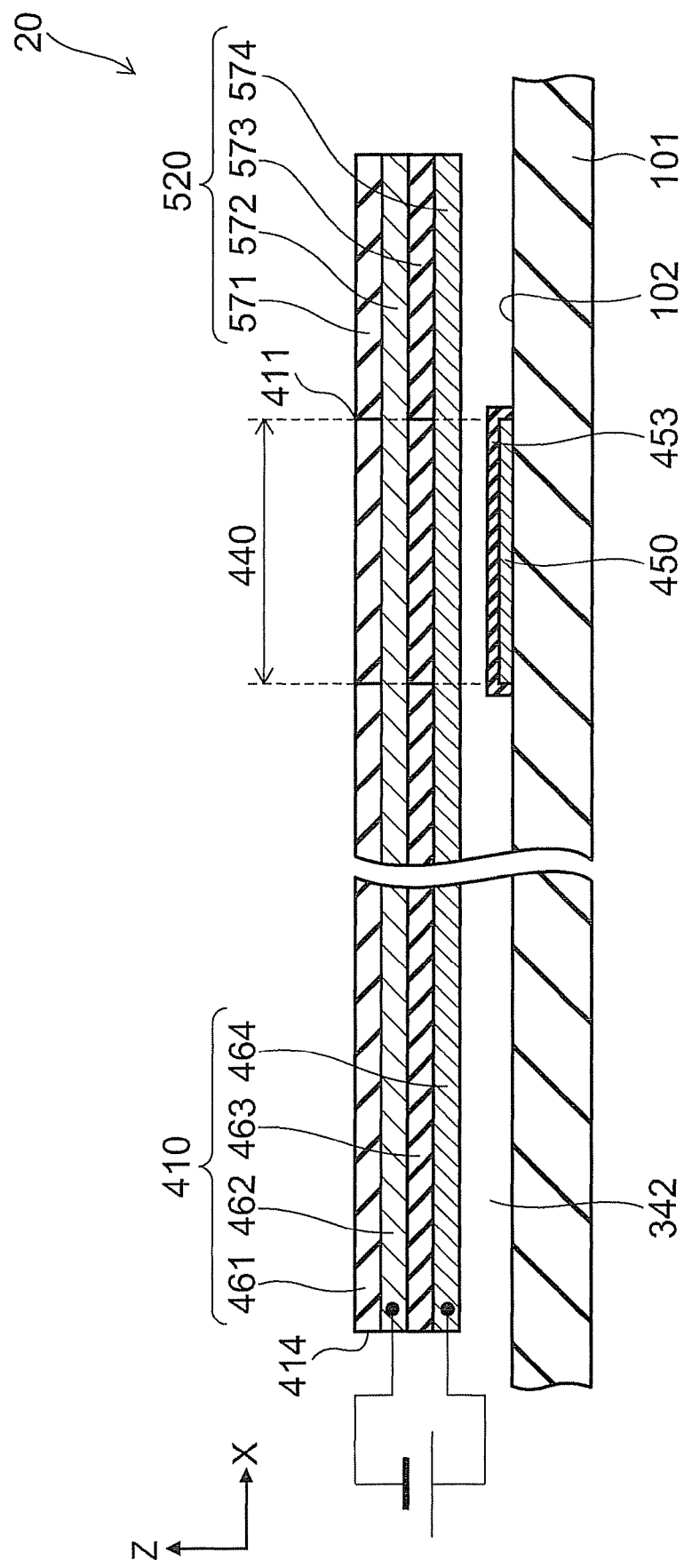
FIG. 21 is a sectional view of line E-E' of FIG. 19.

FIG. 20 is a sectional view of line D-D' of FIG. 19.
FIG. 21 is a sectional view of line E-E' of FIG. 19.

As shown in FIG. 19, an actuator 20 according to the second embodiment of this invention has a first beam 110, a second beam 210, and a first connective part 131. Moreover, although not shown in the figure, a first fixed electrode 250 and a first fixed part 140 are further included. The first beam 110, the second beam 210, the first connective part 131, the first fixed electrode 250, and the first fixed part 140 can be the same ones as explained in FIGS. 2, 3, and 11, and therefore, the explanation thereof will be omitted.

And, as shown in FIGS. 19 to 21, the actuator 20 further has a third beam 310, a fourth beam 410, a second connective part 331, a second fixed electrode 450, and a second fixed part 340 having the analogous structures to the first beam 110, the second beam 210, the first connective part 131, the first fixed electrode 250 and the first fixed part 140, and has a third connective part 520 connecting a first division part 221 of the second beam 210 and a second division part 421 of the fourth beam 410. Hereinafter, these components further provided from the actuator 10 will be explained.

The third beam 310 extends from the second fixed end 311 to the third connective end 314 and is provided in parallel to the first beam 110 above the main surface 102 of the substrate 101. And, there is provided the second fixed part 340 connecting the second fixed end 311 and the main surface 102 of the substrate 101 and supporting the third beam 310 above the main surface 102 of the substrate 101 with a gap 341. That is, the third beam 310 is held by the third fixed part 340 above the substrate 101 with the gap 341.

Moreover, the fourth beam 410 extends from the fourth connective end 414 to the second action end 411 and is provided in parallel to the third beam 310 between the third beam 310 and the second beam 210.

And, there is provided the second connective part 331 connecting the third connective end 314 of the third beam 310 and the fourth connective end 414 of the fourth beam 410 and holding the fourth beam 410 above the main surface 102 of the substrate 101 with a gap 342. That is, the fourth beam 410 is held through the second connective part 331 and the third beam 310 by the second fixed part 340 above the main surface 102 of the substrate 101 with the gap 342.

And, the fourth beam 410 has the second division part 421 divided by a second slit 422 provided to extend to the direction from the second action end 411 toward the fourth connective end 414. In the example shown in FIG. 19, the second slit 422 has six slits 422$a$ to 422$f$, and the second division part 421 has division portions 421$a$ to 421$g$ that are seven division portions.

And, the second fixed electrode 450 is provided on the main surface 102 of the substrate 101 so as to be opposed to a part of the second division part 421 of the fourth beam 410 on a side of the second action end 411. That is, the length of the second slit 422 and the second division part 421 is set to be longer than the length of X axis direction of the second action part 440 formed by opposing of the fourth beam 410 and the second fixed electrode 450 (extending direction of the fourth beam 410). A part opposed to the second fixed electrode 450 of the fourth beam 410 becomes the second action part 440. That is, the part opposed to the second fixed electrode 450 of the second division part 421 becomes the second action part 440. On a surface opposed to the fourth beam 410 of the second fixed electrode 450, a second dielectric film 453 can be provided.

And, as shown in FIG. 20, the third beam 310 has a third lower electrode 364 opposed to the main surface 102 of the substrate 101 and a third upper electrode 362 opposed to the third lower electrode 364, and a third piezoelectric film 363 provided between the third lower electrode 364 and the third upper electrode 362. Moreover, in the upper side of the third upper electrode 362, a support film 361 is provided.

Moreover, as shown in FIG. 21, the fourth beam 410 has a fourth lower electrode 464 opposed to the main surface 102 of the substrate 101, a fourth upper electrode 462 opposed to the lower electrode 464, a fourth piezoelectric film 463 provided between the fourth lower electrode 464 and the fourth upper electrode 462. Moreover, in the upper side of the fourth upper electrode 462, a support film 461 is provided.

And, the third connective part 520 connects the first division part 221 and the second division part 421. In the actuator 20 illustrated in FIG. 19, the third connective part 520 is provided with the same number of the third slits 522 as the first slits 222 and the second slits 422 that have the substantially same width as the first slits 222 and the second slits 422. That is, the third connective part 520 has a plurality of the third division portions 521 divided by the third slits 522.

In the example shown in FIG. 21, the third connective part 520 has a structure in which a fifth lower electrode 574, a fifth piezoelectric film 573, a fifth upper electrode 572, and a fifth support film 571 are sequentially stacked, and the fifth lower electrode 574, the fifth piezoelectric film 573, the fifth upper electrode 572, and the fifth support film 571 are the same layers as the fourth lower electrode 464, the fourth piezoelectric film 463, the fourth upper electrode 462, and the fourth support film 461, respectively. However, this invention is not limited thereto.

For the third beam 310, the fourth beam 410, the second connective part 331 and the third connective part 520, the same layers as the above-described layers used in the first beam 110, the second beam 210 and the first connective part 131 can be used and therefore the detailed explanation thereof will be omitted. Moreover, for the second fixed electrode 450 and the second fixed part 340, the same layers as the above-described layers used in the first fixed electrode 250 and the first fixed part 140 and therefore the detailed explanation thereof will be omitted. Moreover, for each of the sizes of the above-described third beam 310, the fourth beam 410 and the second connective part 331, each of the sizes of the first beam 110, the second beam 210 and the first connective part 131 illustrated in the explanation of FIG. 1 can be used. However, this invention is not limited thereto. The interval between the second beam 210 and the fourth beam 410 can be, for example, 10 μm, but this invention is not limited thereto.

As shown in FIG. 19, the first action end 211 and the second action end 411 are in the regions opposed to the first fixed electrode 250 and the second fixed electrode 450 of the second beam 210 and the fourth beam 410 respectively, namely, in the ends of the first action part 240 and the second action part 440 in the far side from the second connective end 214 and the fourth connective end 414. And, the farther part than the first action end 211 from the second connective end 214 (right side more than the first action end 211 toward the page space of FIG. 19) and the farther part than the second action end 411 from the fourth connective end 414 (right side more than the second action end 411 toward the page space of FIG. 19) are the third connective part 520. That is, the first division part 221 of the second beam 210 and the second division part 421 of the fourth beam 410 are to the first action end 211 and to the second action end 411 respectively, and the right side more than the places indicated in this figure is the third connective part 520.

Figure 22:
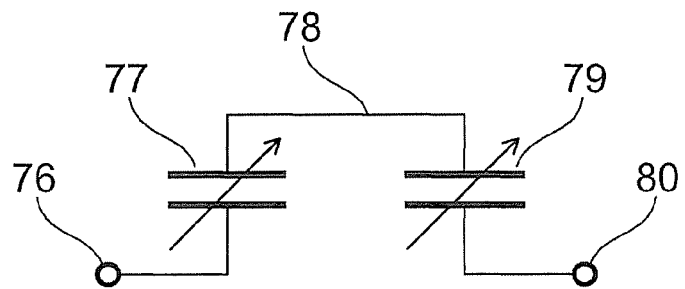
FIG. 22 is a circuit diagram illustrating an electric circuit of the actuator according to the second embodiment of this invention.

FIG. 22 is a circuit diagram illustrating an electric circuit of the actuator according to the second embodiment of this invention.

In FIG. 22, a terminal 76 corresponds to the first fixed electrode 250, and a terminal 80 corresponds to the second fixed electrode 450, and a variable capacitor 77 corresponds to capacitance between the first action part 240 and the first fixed electrode 250, and a variable capacitor 79 corresponds to capacitance between the second action part 440 and the second fixed electrode 450, and a line 78 corresponds to the third connective part 520.

As shown in FIG. 22, the actuator 20 according to the second embodiment of this invention can compose a variable capacitor in which the variable capacitors 77, 79 are serially connected, and the capacitance thereof can be controlled by voltage applied to each of the piezoelectric films.

Figure 23:
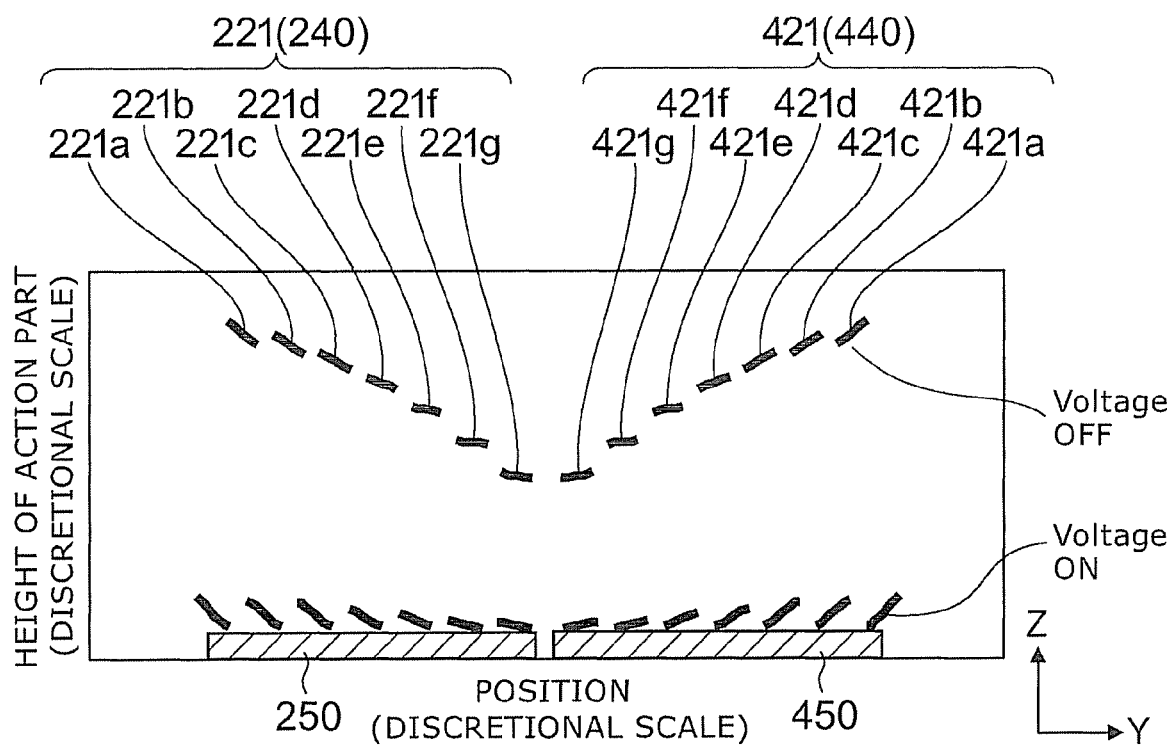
FIG. 23 is a schematic sectional view illustrating the characteristics of the actuator according to the second embodiment of this invention.

FIG. 23 is a schematic sectional view illustrating the characteristics of the actuator according to the second embodiment of this invention.

FIG. 23 is a sectional view schematically showing line F-F' of FIG. 19, and the horizontal axis represents position of Y axis direction and the vertical axis represents position of Z axis direction. And, FIG. 23 shows the states of the first action part 240 of the second beam 210 (first division part 221) and the second action part 440 of the fourth beam 410 (second division part 421) when the applied voltages to the first piezoelectric film 163, the second piezoelectric film 263, the third piezoelectric film 363 and the fourth piezoelectric film 463 are OFF and ON.

As shown in FIG. 23, in the actuator 20, in OFF, warpage of each of the action parts (position from the fixed electrode) is discretely changed according to each of the division portions 221a to 221g, 421a to 421g. And, in ON, each of the division portions 221a to 221g of the first division part 221 and each of the division portions 421a to 421g of the second division part 421 contact the first fixed electrode 250 (through the first dielectric film 253) and the second fixed electrode 450 (through the second dielectric film 453), respectively. Therefore, in the first action part 240 of the second beam 210, the area in which the second lower electrode 264 and the first fixed electrode 250 are approximated is large, and in the second action part 440 of the fourth beam 410, the area in which the fourth lower electrode 464 and the second fixed electrode 450 are approximated is large. Thereby, the maximum capacitance formed by the first action part 240 and the first fixed electrode 250 and by second action part 440 and the second fixed electrode 450 can be large. Specifically, the capacitance between the first fixed electrode 250 and the second fixed electrode 450, namely, the maximum capacitance between the terminal 76 and the terminal 80 illustrated in FIG. 22 was 0.9 pF.

Figure 24:
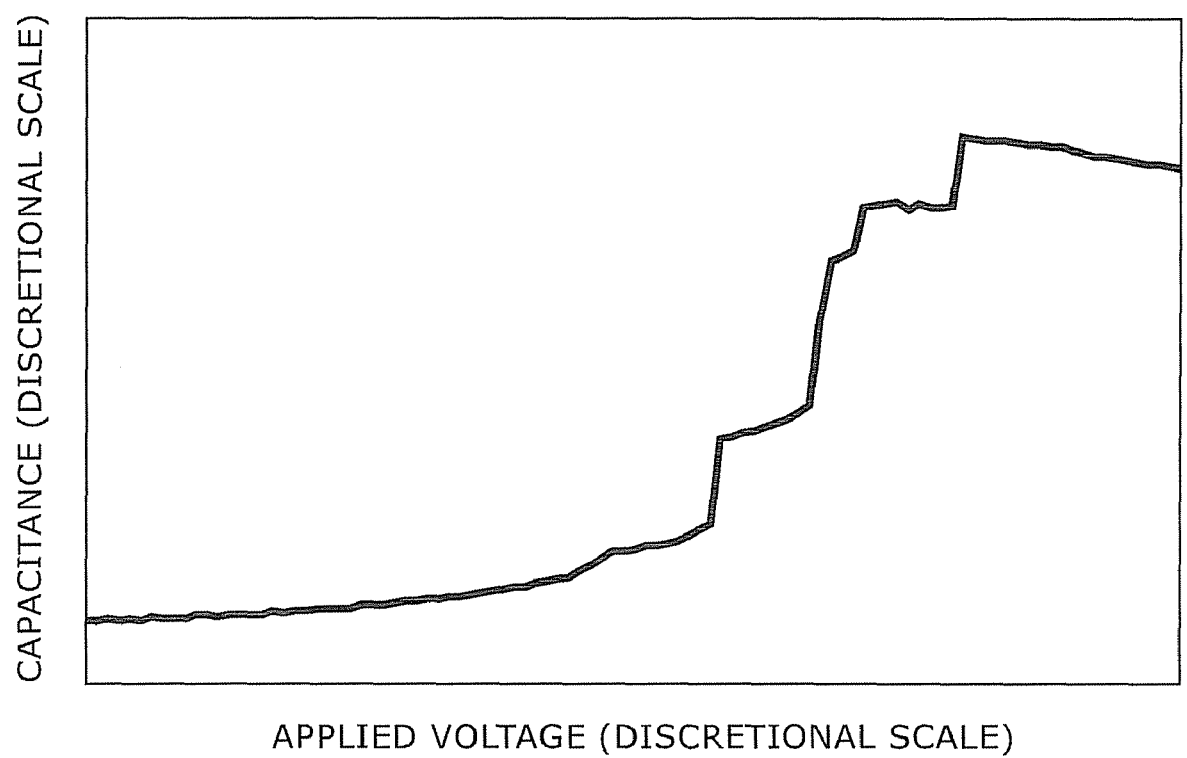
FIG. 24 is a graphic view illustrating the characteristics of the actuator according to the second embodiment of this invention.

FIG. 24 is a graphic view illustrating the characteristics of the actuator according to the second embodiment of this invention.

The horizontal axis of FIG. 24 represents voltage applied to the first to fourth piezoelectric films 163, 263, 363, and 463, and the vertical axis represents capacitance in which capacitance between the first action part 240 of the second beam 210 and the first fixed electrode 250 and capacitance between the second action part 440 of the fourth beam 410 and the second fixed electrode 450 are serially connected.

As shown in FIG. 24, in the actuator 20 according to this embodiment, the applied voltage-capacitance characteristic is changed step-by-step and discretely according to movements of the first action part 240 and the second action part 440 that are formed by the first division part 221 and the second division part 421 and that are divided into plurality. That is, as illustrated in FIG. 23, it is thought that in OFF, warpage of each of the action parts (position from the fixed electrode) is changed step-by-step and discretely according to each of the division portions, and therefore, with respect to increase of the applied voltage to the piezoelectric film, each of the division portions 221a to 221g, 421a to 421g comes to sequentially contact the fixed electrode side, and therefore, the capacitance changes step-by-step and discretely with respect to the applied voltage. As described above, by this embodiment, it becomes possible to control the capacitance in the vicinity of the maximum capacitance, which is conventionally difficult to be controlled, and the control property of capacitance by the driving voltage can be drastically improved.

Third and Fourth Comparative Examples

Figure 25:
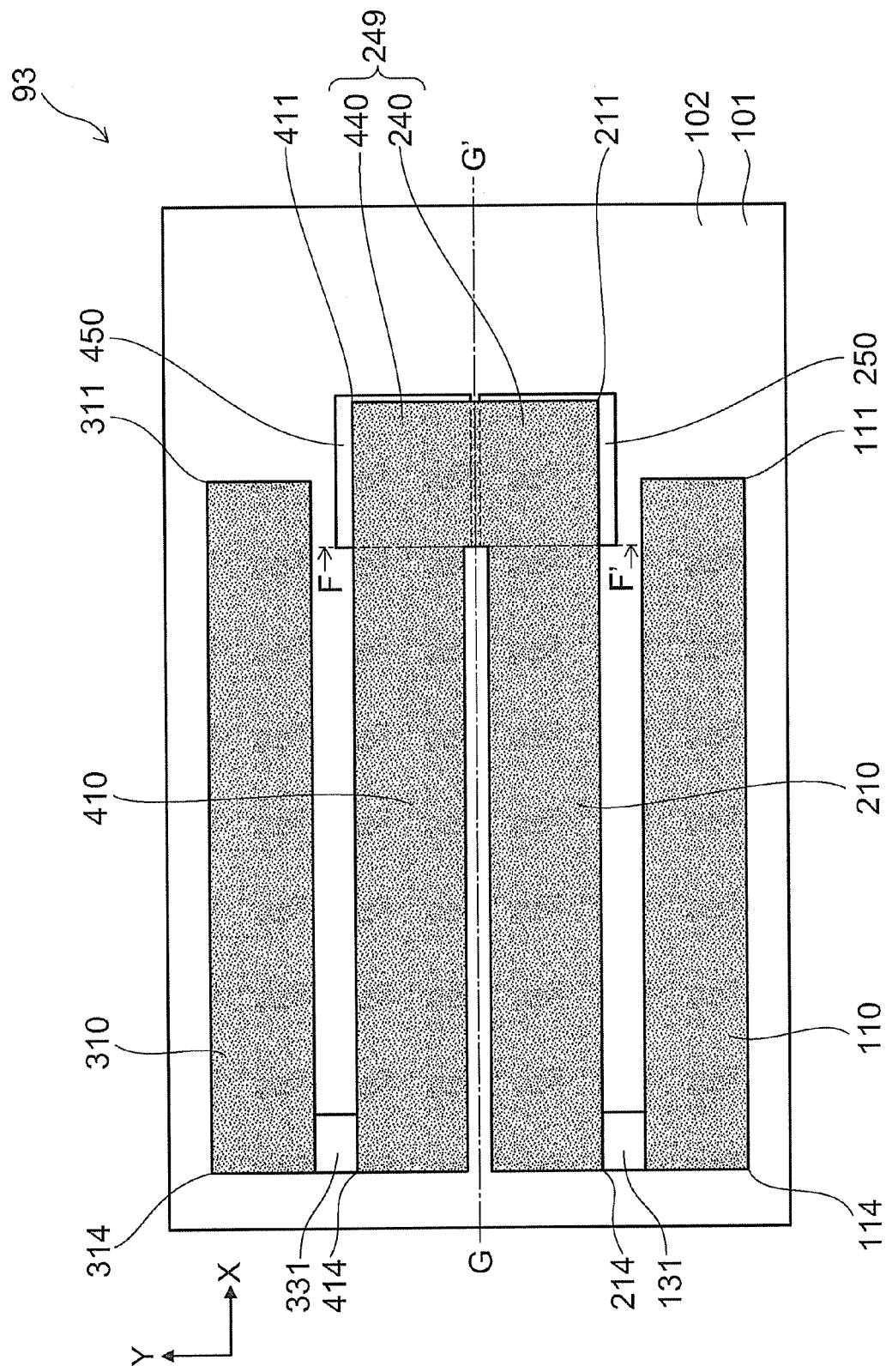
FIG. 25 is a schematic plan view illustrating structures of actuators of a third comparative example.
Figure 26:
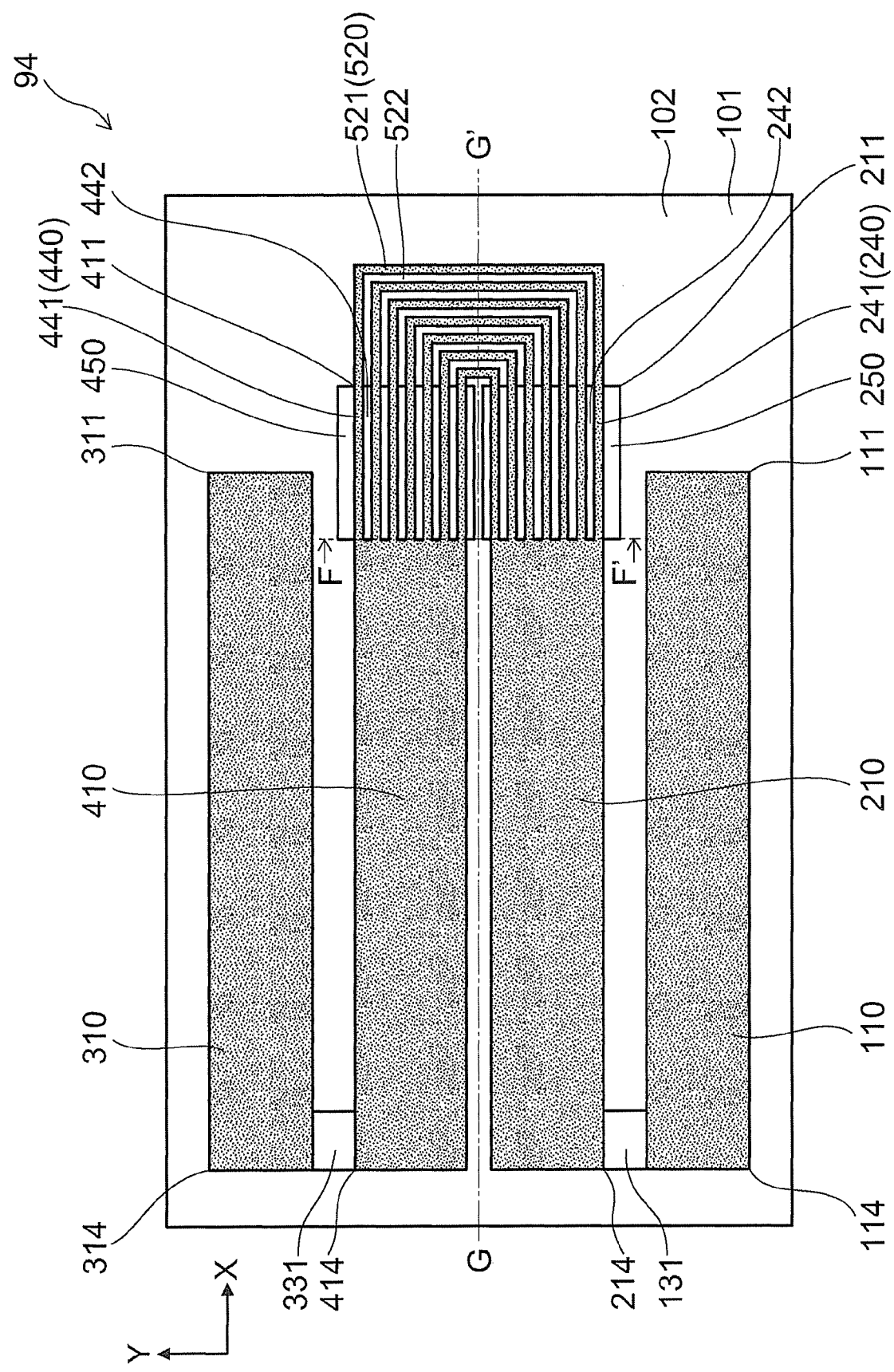
FIG. 26 is a schematic plan view illustrating structures of actuators of a fourth comparative example.

FIGS. 25 and 26 are schematic plan views illustrating structures of actuators of third and fourth comparative examples, respectively.

As shown in FIG. 25, the actuator 93 of the third comparative example, the slits are not provided in the second beam 210 and the fourth beam 410 with respect to the actuator 20 illustrated in FIG. 19. Therefore, the third connective part 520 connecting the first division part 221 and the second division part 421 is also not provided. And, the first action part 240 and the second action part 440 are connected to be an action part 249.

Moreover, as shown in FIG. 26, in the actuator 94 of the fourth comparative example, length of the slits provided in the second beam 210 and the fourth beam 410 is short. That is, only in the first action part 240 opposed to the first fixed electrode 250 of the second beam 210, the first slits 242 are provided and the first division part 241 divided by the first slits 242 is provided. And, only in the second action part 440 opposed to the first fixed electrode 250 of the fourth beam 410, the second slits 442 are provided and the second division part 441 divided by the second slits 442 is provided. That is, in the actuator 94 of the fourth comparative example, the first fixed electrode 250 is provided to be opposed to the entirety of the first division part 241 of the second beam 210, and the second fixed electrode 450 is provided to be opposed to the entirety of the second division part 441 of the fourth beam 410.

As shown in FIG. 26, in the farther part than the first action end 211 from the second connective end 214 and in the farther part than the second action end 411 from the fourth connective end 414, the third connective part 520 is provided, and the third connective part 520 has the third division part 521 divided by the third slits 522. Here, the first division part 241 is to the end of the far side from the second connective end 214 of the first action part 240, and the second division part 441 is to the end of the far side from the fourth connective end 414 of the second action part 440. Therefore, the first and second fixed electrodes 250, 450 are provided to be opposed to the respective entireties of the first and second division parts 241, 441. The division part in the farther sides than the first action end 211 and the second action end 411 from the second connective end 214 and the fourth connective end 414 respectively are the third division part 521 of the third connective part 520 and not the first and second division parts 241, 441.

And, the actuator 93 of third comparative example and the actuator 94 of the fourth comparative example have the same structures as the actuator 20 according to the second embodiment illustrated in FIG. 19, except for the planar shape of the second beam 210 and the planar shape of the fourth beam 410.

Figure 27A:
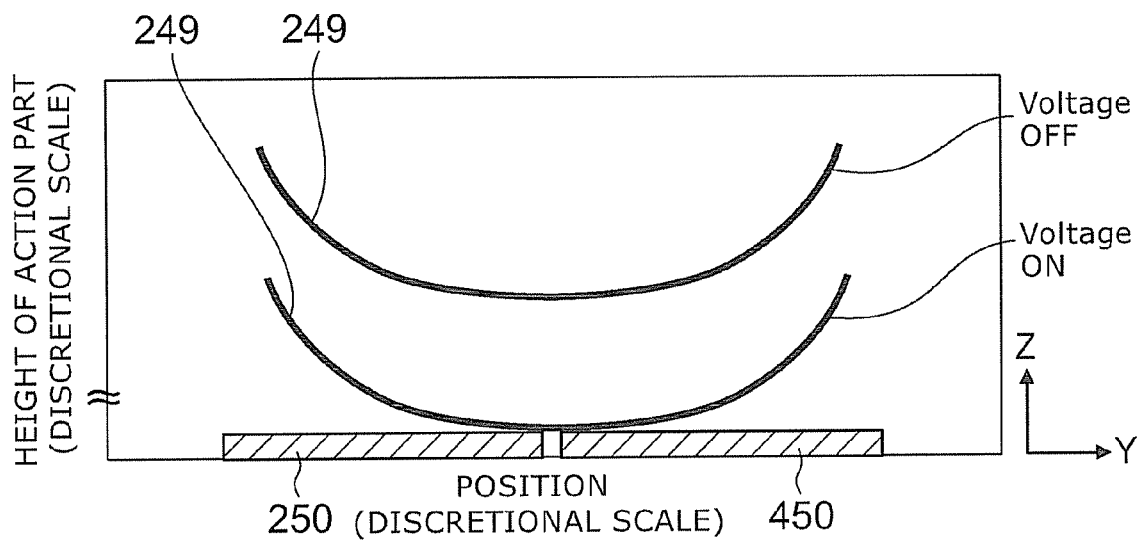
FIGS. 27A and 27B are schematic sectional views illustrating characteristics of actuators of third and fourth comparative examples, respectively.
Figure 27B:
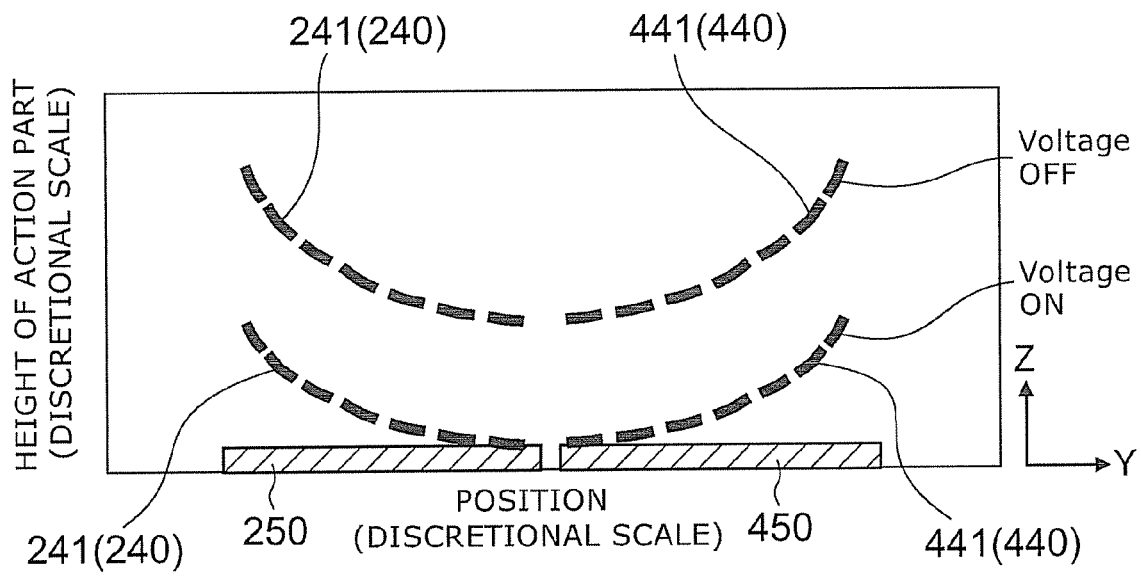

FIGS. 27A and 27B are schematic sectional views illustrating characteristics of actuators of third and fourth comparative examples, respectively.

That is, FIGS. 27A and 27B are sectional views schematically showing line F-F' of FIGS. 25 and 26, and the horizontal axis represents position of Y axis direction and the vertical axis represents position of Z axis direction. And, FIGS. 27A and 27B show the states of the action part 240 of the second beam 210 and the second action part 440 of the fourth beam 410 when the applied voltages to the respective piezoelectric films are OFF and ON.

As shown in FIG. 27A, in the actuator 93 of the third comparative example, the first action part 240 of the second beam 210 and the second action part 440 of the fourth beam 410 are connected to be the action part 249, the action part 249 is bended in a concave hyperbolic shape. And, in ON, a part of the curve of the action part 249 contacts the first fixed electrode 250 and the second fixed electrode 450 (through the first and second dielectric films 253, 453), and the area in which the action part 249, and the first fixed electrode 250 and the second fixed electrode 450 are approximated is small. Therefore, the maximum capacitance is small. Specifically, the maximum capacitance of the actuator 93 was 0.18 pF.

On the other hand, as shown in FIG. 27B, in the actuator 94 of the fourth comparative example, the first action part 240 and the second action part 440 are provided with the first slit 242 and the second slit 442 respectively, and thereby, the first division part 241 and the second division part 441 are provided. Therefore, the area of the part in which the first action part 240 and the first fixed electrode 250 are approximated and the area of the part in which the second action part 440 and the second fixed electrode 450 are approximated are larger than those of the third comparative example, and the maximum capacitance can be also larger than that of the third comparative example. However, specifically, the maximum capacitance of the actuator 94 was 0.2 pF, and the improvement degree thereof was smaller than that of this embodiment. It is thought that this is because in the actuator 94 of the fourth comparative example, the lengths of the first slit 241 and the second slit 421 are short and therefore as shown in FIG. 27, the warpage of the hyperbolic beams is left in the first action part 240 and the second action part 440, and therefore, freedom degree of movement of the division parts is low.

By comparing these characteristics of FIGS. 27A and 27B of the third and fourth comparative examples with FIG. 23 of this embodiment, it can be seen that in the actuator 20 according to this embodiment, in ON, the first division part 221 and the first fixed electrode 250 can be approximated with a large area, and the second division part 421 and the second fixed electrode 450 can be approximated with a large area. Thereby, as described above, the maximum capacitance of the actuator 20 becomes 0.9 pF, which is 4.5 times larger than that of the fourth comparative example. This is because in this embodiment, each of lengths of the first slit 222 and the first division part 221, and the second slit 422 and the second division part 421 is longer than that of the fourth comparative example, and therefore, freedom degree of movement of the first division part 221 and the second division part 421 is more enhanced. And, each of the division parts moves step-by-step and discretely and in order according to the applied voltage, and therefore, the curve of the applied voltage-capacitance characteristics can be relaxed.

As described above, according to this embodiment, there can be obtained an actuator in which the effect of the warpage of the beams can substantially dissolved and the maximum capacitance is large and the precipitous change of capacitance in the vicinity of the maximum capacitance is relaxed.

In the above-described example, voltage of the same polarity is applied between the first lower electrode 164 and the first upper electrode 162 and between third lower electrode 364 and third upper electrode 362, and voltage of the same polarity is applied between the second lower electrode 264 and the second upper electrode 262 and between the fourth lower electrode 464 and the fourth upper electrode 462, and voltage of different polarities between the former group and the latter group from each other is applied. However, this invention is not limited thereto. That is, it is possible to drive the actuator by applying voltage only between the first lower electrode 164 and the upper electrode 162 and between the third lower electrode 364 and the third upper electrode 362, or by applying voltage only between the second lower electrode 264 and the upper electrode 262 and between the fourth lower electrode 464 and the fourth upper electrode 462.

Moreover, in the applied voltage-capacitance characteristics illustrated in FIG. 24, the capacitance between the first fixed electrode 250 and the second fixed electrode 450, namely, the capacitance in which the capacitor formed by the first action part 240 and the first fixed electrode 250 and the capacitor formed by the second action part 440 and the second fixed electrode 450 are serially connected is shown, but the actuator can also be used by connecting the first fixed electrode 250 and the second fixed electrode 450.

Figure 28:
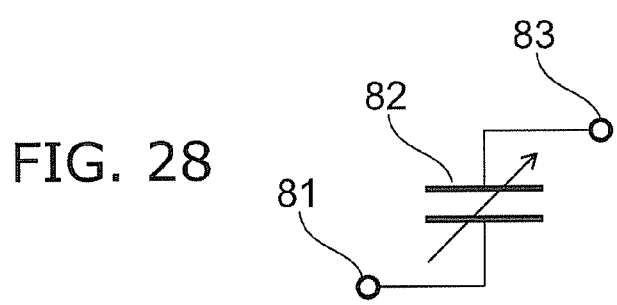
FIG. 28 is a circuit diagram illustrating another electric circuit of the actuator according to the second embodiment of this invention.

FIG. 28 is a circuit diagram illustrating another electric circuit of the actuator according to the second embodiment of this invention.

As shown in FIG. 28, in another usage of the actuator 20 according to the second embodiment of this invention, one fixed electrode is made by connecting the first fixed electrode 250 and the second fixed electrode 450, and capacitance of capacitor formed by this fixed electrode and the first action part 240 and the second action part 440 is utilized. In this case, the terminal 81 is the fixed electrode connecting the first fixed electrode 250 and the second fixed electrode 450, and the terminal 83 is the first action part 240 and the second action part 440, and the variable capacitor 82 is the capacitance between the fixed electrode connecting the first fixed electrode 250 and the second fixed electrode 450, and the first action part 240 and the second action part 440.

In the above-described actuator 20, the first beam 110, the second beam 210, the third beam 310, and the fourth beam 410 have a monomorph structure but are not limited thereto. That is, it is sufficient that these beams include a piezoelectric film sandwiched between two electrodes, and the beams can have various structures such as a bimorph structure and asymmetric bimorph structure, as well as the monomorph structure.

Figure 29:
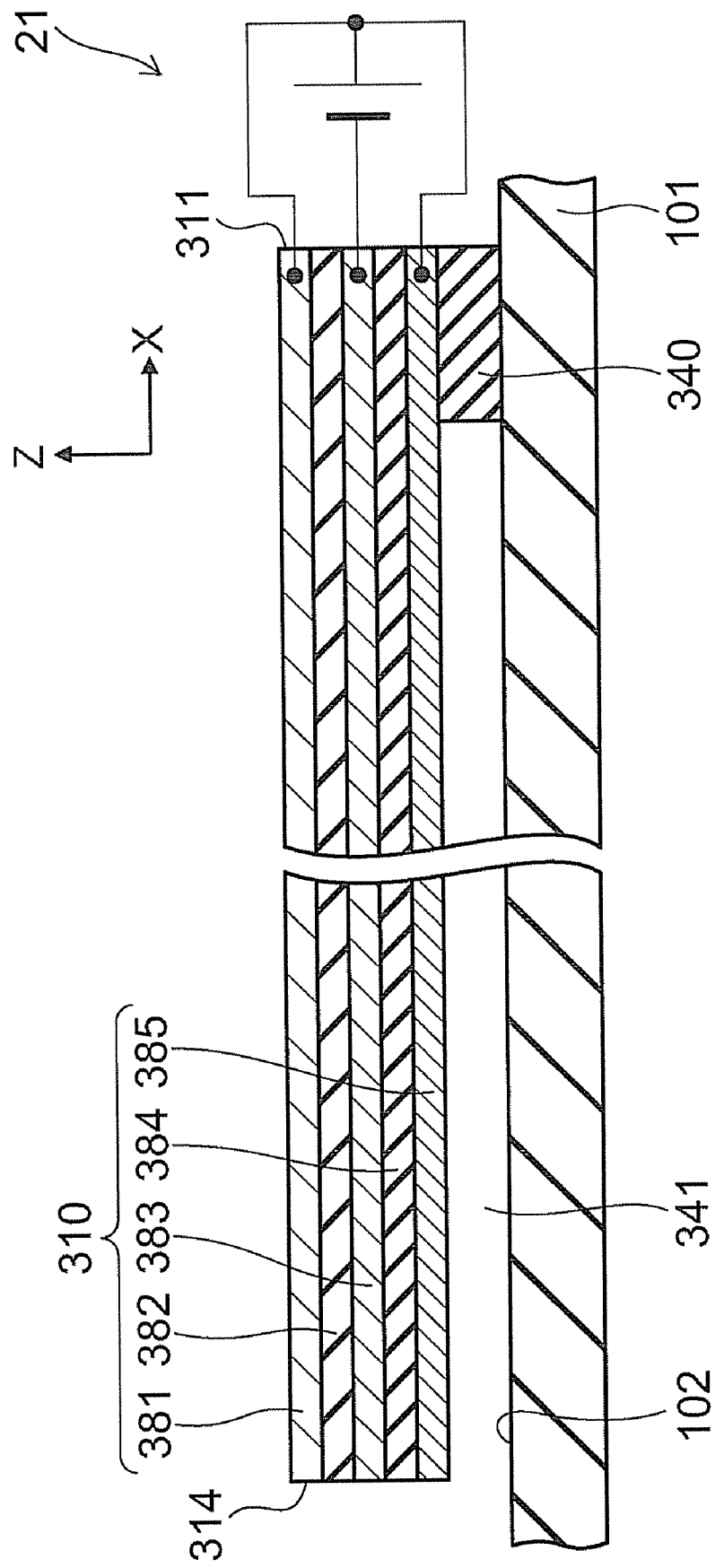
FIG. 29 is a sectional view of line D-D' of FIG. 19 illustrating another structure of the actuator according to the second embodiment of this invention.

FIG. 29 is a sectional view of line D-D' of FIG. 19 illustrating another structure of the actuator according to the second embodiment of this invention.

Figure 30:
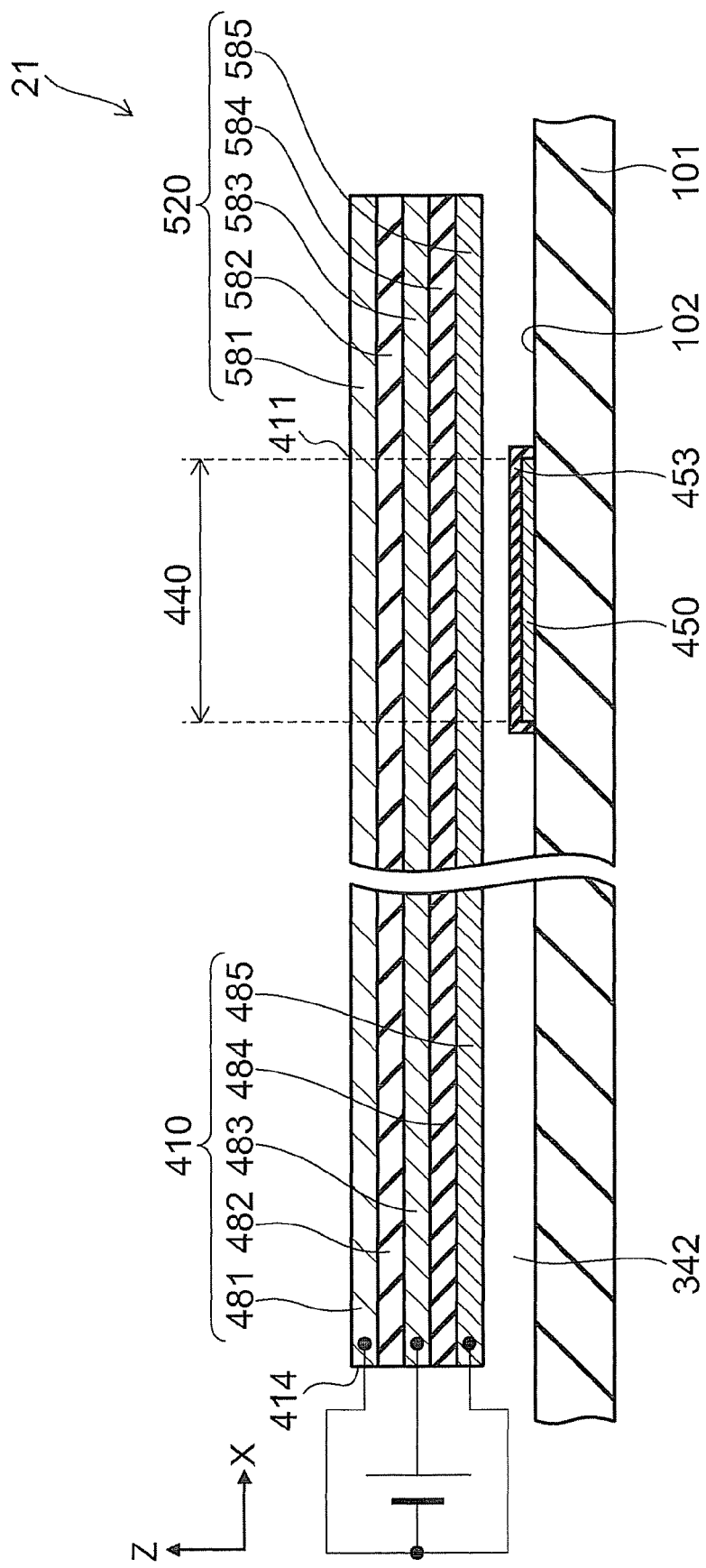
FIG. 30 is a sectional view of line E-E' of FIG. 19 illustrating another structure of the actuator according to the second embodiment of this invention.

FIG. 30 is a sectional view of line E-E' of FIG. 19 illustrating another structure of the actuator according to the second embodiment of this invention.

That is, in another actuator 21 according to the second embodiment, each of the beams has a bimorph structure in the actuator 20 illustrated in FIG. 19, and the planar shape and so forth are the same as FIG. 19.

As shown in FIG. 29, in another actuator 21 according to the second embodiment of this invention, the third beam 310 has a third lower electrode 385 opposed to the main surface 102 of the substrate 101, a third upper electrode 381 opposed to the third lower electrode 385, and a third piezoelectric film 384 sandwiched between the third lower electrode 385 and the third upper electrode 381. And, the third beam 310 further has a third intermediate electrode 383 provided between the third piezoelectric film 384 and the third upper electrode 381 and a third upper piezoelectric film 382 provided between the third intermediate electrode 383 and the third upper electrode 381. That is, the third beam 310 has a structure in which the third lower electrode 385, the third piezoelectric film 384, the third intermediate electrode 383, the third upper piezoelectric film 382, and the third upper electrode 381 are stacked.

The sectional structure of the first beam 110, namely, A-A' line section can be the same as FIG. 29.

As shown in FIG. 30, in another actuator 21, the fourth beam 410 has a fourth lower electrode 485 opposed to the main surface 102 of the substrate 101, a fourth upper electrode 481 opposed to the fourth lower electrode 485, and a fourth piezoelectric film 484 sandwiched between the fourth lower electrode 485 and the fourth upper electrode 481. And, the fourth beam 410 further has a fourth intermediate electrode 483 provided between the fourth piezoelectric film 484 and the fourth upper electrode 481 and a fourth upper piezoelectric film 482 provided between the fourth intermediate electrode 483 and the fourth upper electrode 481. That is, the fourth beam 410 has a structure in which the fourth lower electrode 485, the fourth piezoelectric film 484, the fourth intermediate electrode 483, the fourth upper piezoelectric film 482, and the fourth upper electrode 481 are stacked.

Moreover, the third connective part 520 has a structure in which a fifth lower electrode 585, a fifth piezoelectric film 584, a fifth intermediate electrode 583, a fifth upper piezoelectric film 582, and a fifth upper electrode 581 are stacked, and the fifth lower electrode 585, the fifth piezoelectric film 584, the fifth intermediate electrode 583, the fifth upper piezoelectric film 582, and the fifth upper electrode 581 are the same layers as the fourth lower electrode 485, the fourth piezoelectric film 484, the fourth intermediate electrode 483, the fourth upper piezoelectric film 482, and the fourth upper electrode 481, respectively. However, this invention is not limited thereto.

The sectional structure of the second beam 210, namely, B-B' line section can be the same as FIG. 30.

The first to fifth lower electrodes 185, 285, 385, 485, and 585 can be the same layer and can contain the same material. Moreover, the first to fifth piezoelectric films 184, 284, 384, 484, and 584 can be the same layer and can contain the same material. Moreover, the first to fifth intermediate electrodes 183, 283, 383, 483, and 583 can be the same layer and can contain the same material. Moreover, the first to fifth upper piezoelectric films 182, 282, 382, 482, and 582 can be the same layer and can contain the same material. Moreover, the first to fifth upper electrodes 181, 281, 381, 481 and 581 can be the same layer and can contain the same material. However, this invention is not limited thereto.

Furthermore, the first connective part 131 and the second connective part 331 can have the same stacked structure as the stacked structure composing each of the above-described beams. However, this invention is not limited thereto.

In the actuator 21, the effect of the warpage of the beam can substantially dissolved, and the maximum capacitance becomes large, and the actuator 21 has the effect of relaxing the precipitous change of capacitance in the vicinity of the maximum capacitance and further has a bimorph structure, and therefore, can reduce the driving voltage more than the actuator 20 having a monomorph structure.

Also, in the above-described actuators 20, 21, the first fixed part 140 and the second fixed part 340 can be composed by the first beam 110 and the third beam 310, respectively, similarly to the actuator 17 illustrated in FIG. 16.

Moreover, in this embodiment, number and length (length of X axis direction) and width (length of Y axis direction) of the first slits 222 and the second slits 422, namely, the first division part 221 and the second division part 421 that are formed by the slits are discretional. Hereinafter, the examples will be explained.

Figure 31:
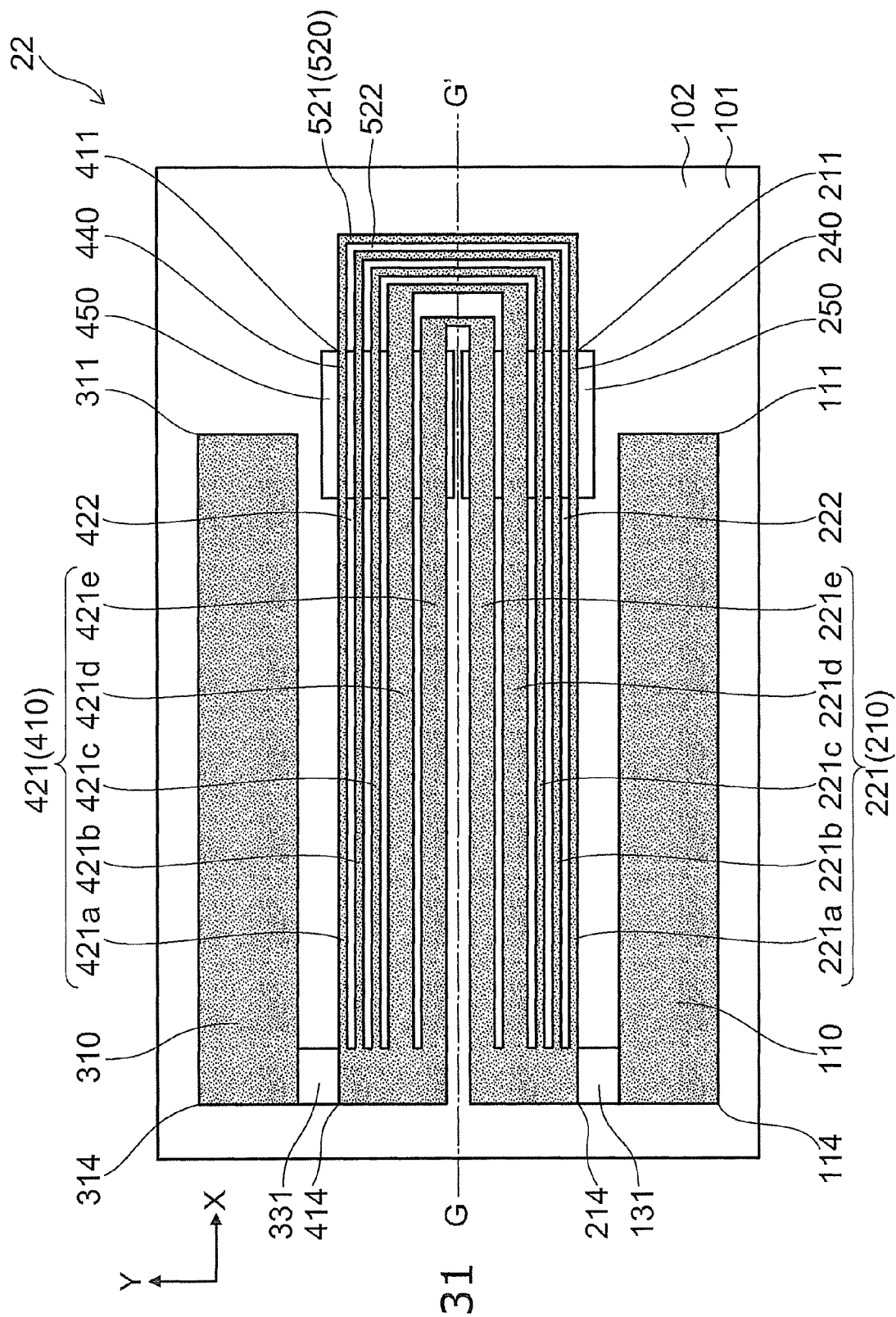
FIG. 31 is a schematic plan view illustrating another structure of the actuator according to the second embodiment of this invention.

FIG. 31 is a schematic plan view illustrating another structure of the actuator according to the second embodiment of this invention.

As shown in FIG. 31, in the actuator 22 of another example of the second embodiment of this invention, the widths of the division portions 221a to 221e of the first division part 221 are different. That is, the division portions (221a to 221c) of the first beam 110 side of the first division part 221 are narrow, and the division portions (221d, 221e) of the far side from the first beam 110 side of the first division part 221 are wide. And, the division portions (421a to 421c) of the third beam 310 side of the second division part 421 are narrow, and the division portions (421d, 421e) of the far side from the third beam 310 side of the second division part 421 are wide. As described above, by changing the width of each of the division portions, the applied voltage-capacitance characteristics can be controlled to be a discretional shape.

Figure 32:
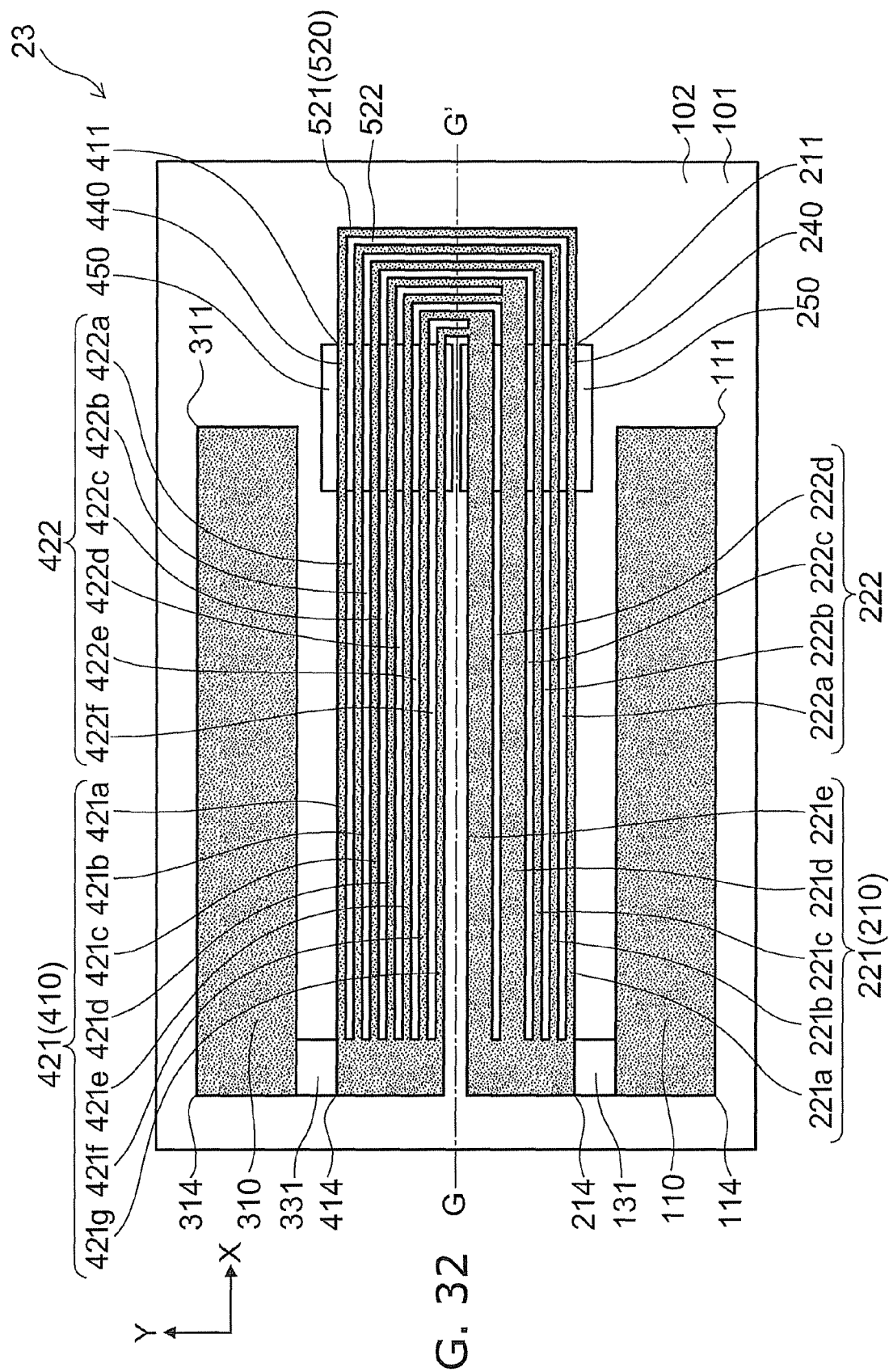
FIG. 32 is a schematic plan view illustrating another structure of the actuator according to the second embodiment of this invention.

FIG. 32 is a schematic plan view illustrating another structure of the actuator according to the second embodiment of this invention.

As shown in FIG. 32, in the actuator 23 of another example of the second embodiment of this invention, the division portions 421a to 421g of the second division part 421 have the same width but the division portions 221a to 221e of the first division part 221 have different width. And the number of the first division portions 221 and number of the second division portions 421 are different. And, in connecting the first division part 221 and the second division part 421, the third connective part 520 connects two division portions (421f, 421g) of the second division part 421 and one division portion (221e) of the first division part 221. Moreover, the third connective part 520 connects two division portions (421d, 421e) of the second division part 421 and one division portion (221d) of the first division part 221. As described above, the third connective part 520 has discretional connection number and structure of each of the division portions in connecting the first division part 221 and the second division part 421.

Figure 33:
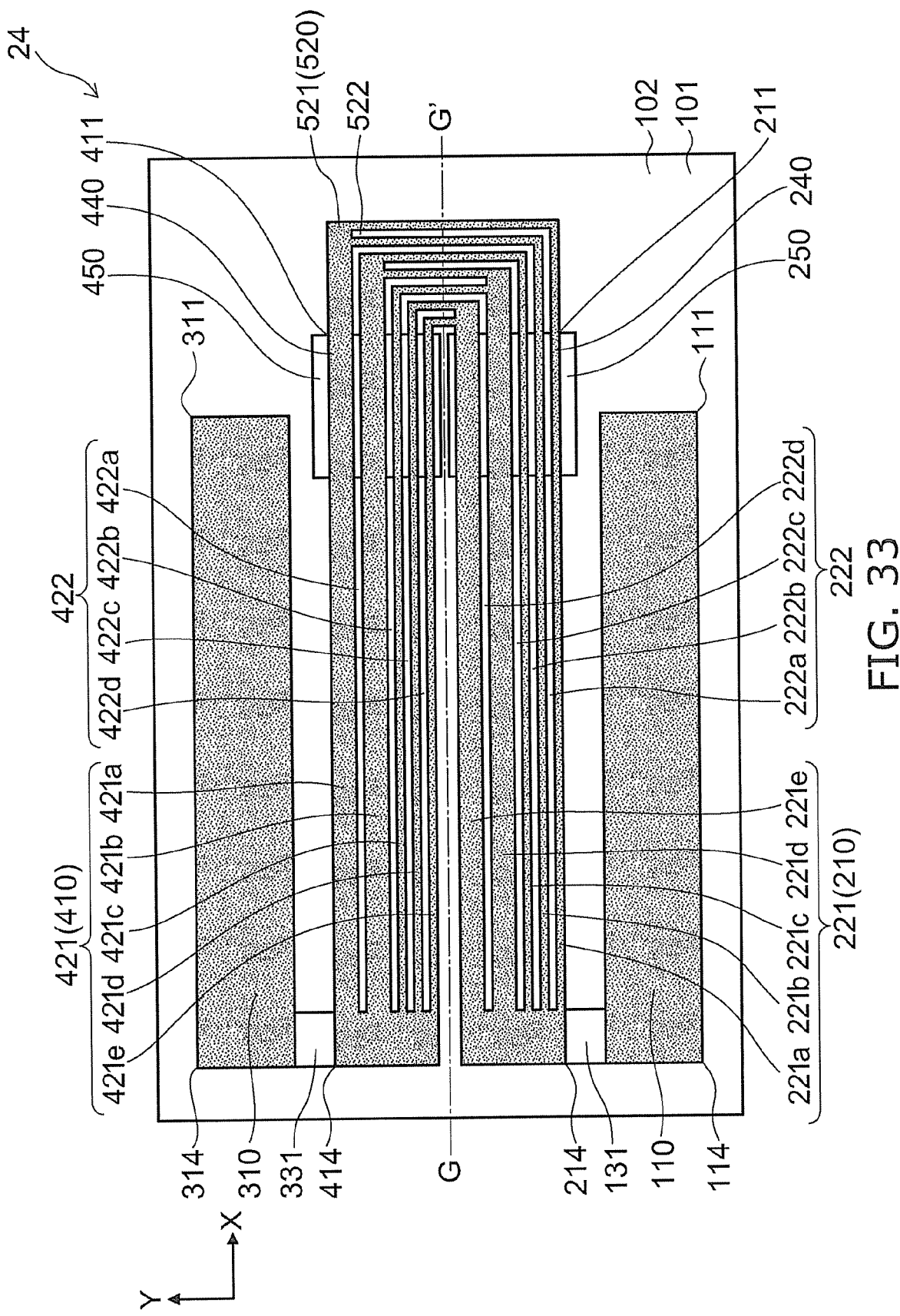
FIG. 33 is a schematic plan view illustrating another structure of the actuator according to the second embodiment of this invention.

FIG. 33 is a schematic plan view illustrating another structure of the actuator according to the second embodiment of this invention.

As shown in FIG. 33, in the actuator 24 of another example of the second embodiment of this invention, the width of the division portions 221a to 221e of the first division part 221 are different. That is, the division portions (221a to 221c) of the first beam 110 side of the first division part 221 are narrow, and the division portions (221d, 221e) of the far side from the first beam 110 side of the first division part 221 are wide. And, the division portions (421a, 421b) of the third beam 310 side of the second division part 421 are wide, and the division portions (421c to 421e) of the far side from the third beam 310 side of the second division part 421 are narrow. As described above, by changing the width of each of the division portions, the applied voltage-capacitance characteristics can be controlled to be a discretional shape.

In various examples according to this embodiment, in the actuators 20, 22 illustrated in FIGS. 19 and 31, the structures of the first to fourth beams are symmetric with respect to the central line G-G' between the second beam 210 and the fourth beam 410. In this case, warpage of Y axis is cancelled and each of the division portions of the first division part 221 and the second division part 421 becomes symmetric with respect to the central line G-G'. Thereby, stable operation can be obtained.

On the other hand, in the actuators 23, 24 illustrated in FIGS. 32 and 33, the first beam 110 and the third beam 310 are symmetric with respect to the central line G-G' between the second beam 210 and the fourth beam 410 but the structure of the second beam 210 and the fourth beam 410 is asymmetric with respect to the central line G-G'. As described above, when the second beam 210 and the fourth beam 410 are asymmetric with respect to the central line G-G', the movements of the second beam 210 and the fourth beam 410 become asymmetric. And the respective movements of the first division part 221 and the second division part 421 can be asymmetric, and thereby, the shape of the curve of applied voltage-capacitance characteristics can be discretionarily changed.

The first beam 110 and the third beam 310 can also be asymmetric with respect to the central line G-G' between the second beam 210 and the fourth beam 410.

Moreover, the first connective part 131 and the second connective part 331 can be symmetric with respect to the central line G-G' between the second beam 210 and the fourth beam 410. Moreover, the parts can also be asymmetric.

And, the third connective part 520 can be symmetric with respect to the central line G-G' between the second beam 210 and the fourth beam 410. Moreover, the part can also be asymmetric.

Moreover, in this embodiment, the third connective part 520 connects the first division part 221 and the second division part 421, and all of the divided division portions can be connected to one another, and some division portions can also be connected.

Figure 34:
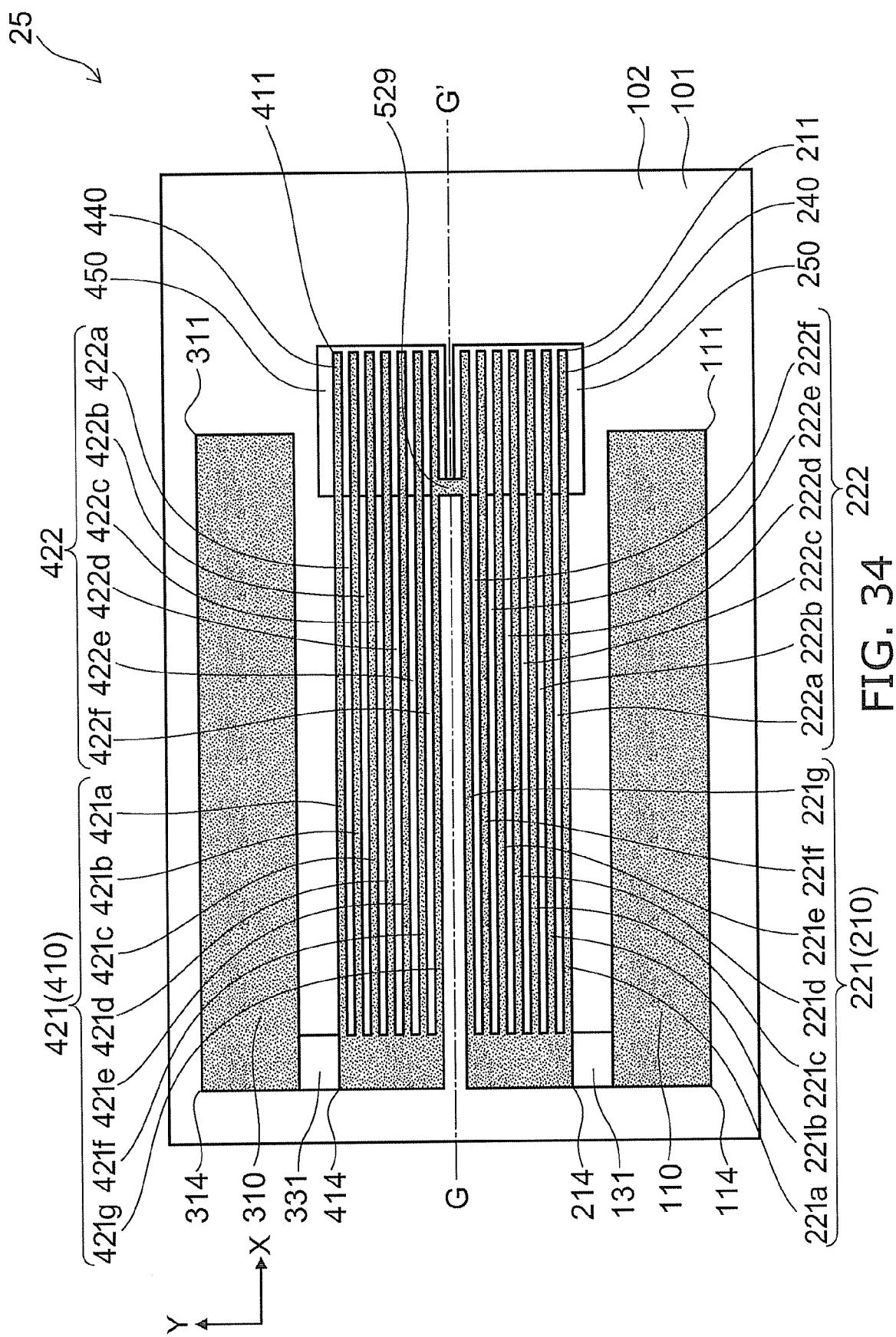
FIG. 34 is a schematic plan view illustrating another structure of the actuator according to the second embodiment of this invention.

FIG. 34 is a schematic plan view illustrating another structure of the actuator according to the second embodiment of this invention.

As shown in FIG. 34, in the actuator 25 of another example according to the second embodiment of this invention, only the division portion 221g of the first division part 221 and the division portion 421g of the second division part 421 are connected by the third connective part 529. As described above, only some of the division portions may be connected.

Figure 35A:
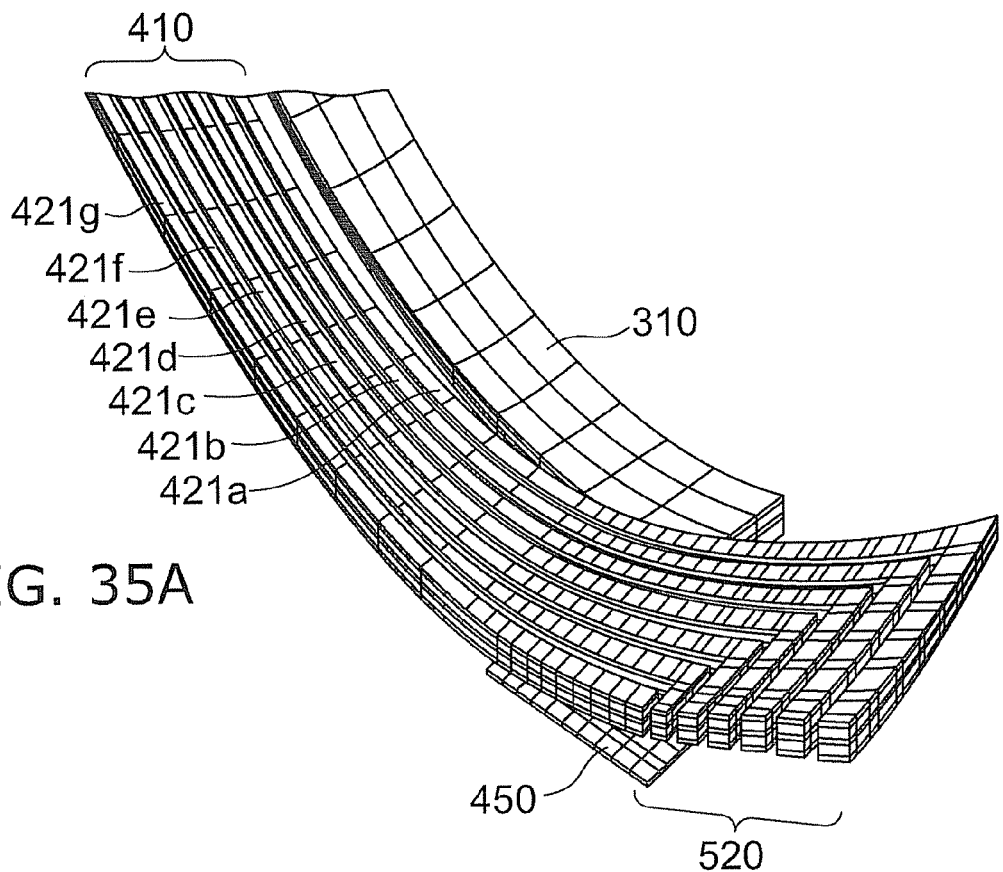
FIGS. 35A and 35B are schematic views illustrating operations of the actuator according to the second embodiment of this invention.
Figure 35B:
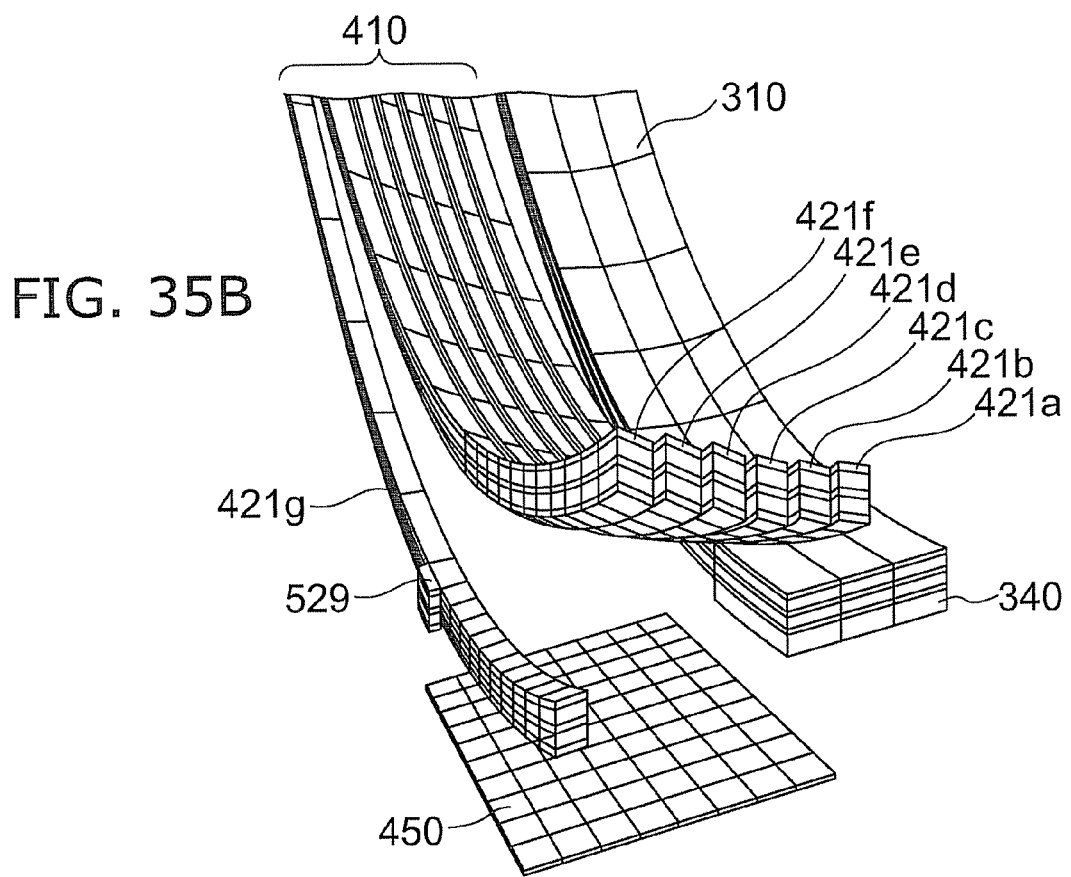

FIGS. 35A and 35B are schematic views illustrating operations of the actuator according to the second embodiment of this invention.

FIG. 35A illustrates a simulation result of the OFF state of the second action part 440 of the actuator 20 illustrated in FIG. 19, and the FIG. 35B illustrates a simulation result of the OFF state of the second action part 440 of the actuator 25 illustrated in FIG. 34. The state of each of the first action part 240 connected to the second action part 440 is symmetric with the state of the second action part 440, and therefore, in these figures, only the second action part 440 are drawn.

As shown in FIG. 35A, in the actuator 20 in which the division portions 221a to 221g of the first division part 221 and the division portions 421a to 421g of the second division part 421 are connected respectively, each of the division portions is continuously and gradually located in the lower direction (direction getting near to the second fixed electrode 450) as the division portion is nearer to the division portion 421g from the division portion 421a. And, the distance between the second action part 440 and the second fixed electrode 450 in every division portion 421a to 421g is relatively near, and the distance between the second action part 440 and the second fixed electrode 450 is continuously changed.

By contrast, as shown in FIG. 35B, in the actuator 25 in which only the division portion 221g and the division portion 421g are connected, only the division portion 421g has a near distance between the division portion and the second fixed electrode 450, and the other division portions 421a to 421f have long distances between the division portion and the second fixed electrode 450. And, the distance is the maximum in the division portion 421f and is the minimum in the division portion 421a.

Therefore, in the actuator 20 in which the division portions 221a to 221g of the first division part 221 and the division portions 421a to 421g of the second division part 421 are connected respectively, each of the division portions has characteristics of sequentially moving to the direction of the fixed electrode, and because the distance between the action part and the fixed electrode can be small, the driving voltage can be low. On the other hand, in the case of the actuator 25 in which only some of the division portions 221a to 221g of the first division part 221 and some of the division portions 421a to 421g of the second division part 421 are connected, the distances from the fixed electrodes between the connected division portion and the non-connected division portion are largely different, and therefore, the operation voltages of the movements of the division portions can be largely different. Therefore, the curve of the applied voltage-capacitance characteristics can be relaxed, and by utilizing this, the applied voltage-capacitance characteristics can be discretionarily changed.

In FIG. 34, one pair of the division portion 221a of the first division part 221 and the division portion 421g of the second division part 421 is connected, but the number of pair to be connected is discretional. And, by the number connecting the first division portions 221 and the second division portions 421, the positions of the division portions (height from the fixed electrode) can be changed. Moreover, the position connecting the division portions is also discretional. Furthermore, as well as number or position for the connection, size or film structure or the like of the third connective part 520 connecting the division portions can also change the positions of the division portions (height from the fixed electrode).

Each of the beams of the above-described actuators 22 to 25 can have a bimorph structure whose sectional structure is illustrated in FIGS. 29, 30.

Third Embodiment

Figure 36:
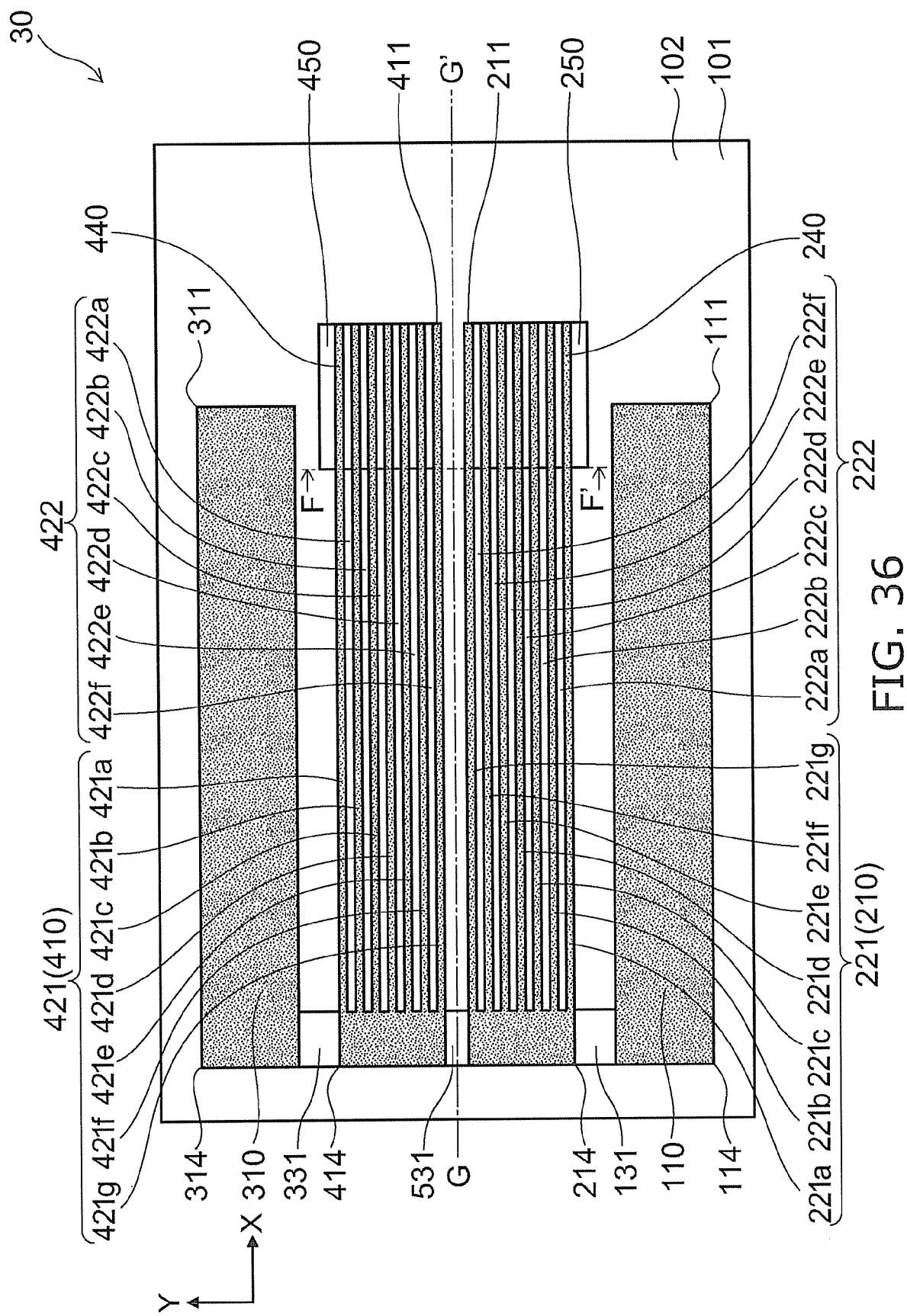
FIG. 36 is a schematic plan view illustrating a structure of an actuator according to a third embodiment of this invention.

FIG. 36 is a schematic plan view illustrating a structure of an actuator according to a third embodiment of this invention.

As shown in FIG. 36, the actuator 30 according to the third embodiment of this invention has the first beam 110, the second beam 210, the first connective part 131, the third beam 310, the fourth beam 410, and the second connective part 331. Moreover, although not shown, the first fixed electrode 250, the first fixed part 140, the second fixed electrode 450, and the second fixed part 340 are included. These can be the same as ones explained in the second embodiment and therefore the explanation thereof will be omitted.

And, the actuator 30 further includes a fourth connective part 531 connecting the second connective end 214 of the second beam 210 and the fourth connective end 414 of the fourth beam 410.

That is, in the actuator 30, the fourth connective part 531 connecting the second and fourth connective ends 214 and 414 is provided instead of the third connective part 520 connecting the both action ends in the actuator 20. That is, two pairs of the actuators 11 illustrated in FIG. 11 are provided and connected by the connective ends thereof.

Figure 37:
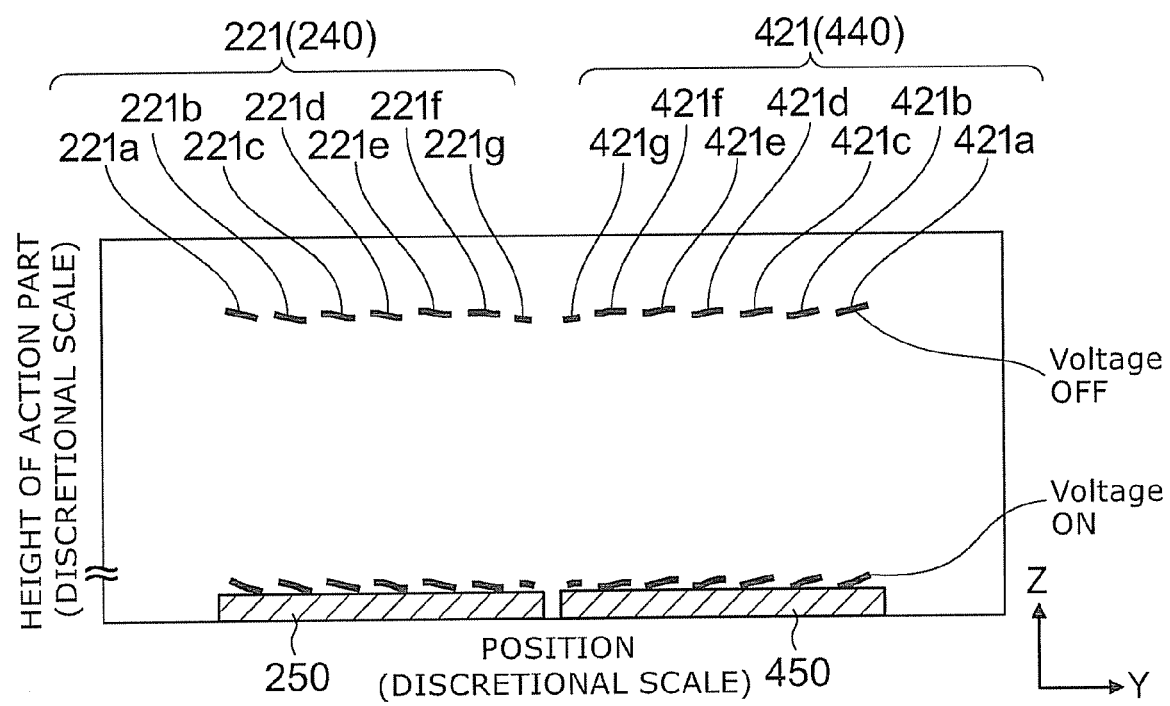
FIG. 37 is a schematic sectional view illustrating characteristics of the actuator according to the third embodiment of this invention.

FIG. 37 is a schematic sectional view illustrating characteristics of the actuator according to the third embodiment of this invention.

FIG. 37 is a sectional view schematically showing line F-F' of FIG. 36, and the definition of the figure is the same as the definition of the FIG. 23.

As shown in FIG. 37, in the actuator 30, in OFF, warpage of each of the action parts 240, 440 is substantially dissolved, and positions from the first fixed electrode 250 and the second fixed electrode 450 of the first division portions 221a to 221g and the second division portions 421a to 421g are approximately the same. It is thought that this is because by providing two pairs of the actuators 11 illustrated in FIG. 11 and connecting the pairs by the connective end, the warpage of the beams of Y axis direction is cancelled. And, in ON, each of the division portions 221a to 221g of the first division part 221 and each of the division portions 421a to 421g of the second division part 421 contact the first fixed electrode 250 (through the first dielectric film 253) and the second fixed electrode 450 (through the second dielectric film 453), respectively. Therefore, in the first action part 240 of the second beam 210, the area in which the second lower electrode 264 and the first fixed electrode 250 are approximated is large, and in the second action part 440 of the fourth beam 410, the area in which the fourth lower electrode 464 and the second fixed electrode 450 are approximated is large. Thereby, the maximum capacitance formed by the first action part 240 and the first fixed electrode 250 and by second action part 440 and the second fixed electrode 450 can be large. Specifically, the maximum capacitance can be 0.6 pF.

In the structure illustrated in the FIG. 36, in the case of the fifth comparative example of not providing the second beam 210 and the fourth beam 410 with the slits, the capacitance thereof was 0.1 pF. As described above, by the actuator 30 according to the third embodiment, the maximum capacitance that is six times larger than that of the fifth comparative example in which the slits is not provided can be obtained.

Moreover, in the actuator 30 according to this embodiment, the first and second action parts 240, 440 are divided into the first division part 221 (division portions 221a to 221g) and the second division part 421 (division portions 421a to 421g) respectively, and therefore, the division portions 221a to 221g and the division portions 421a to 421g move step-by-step and discretely, and therefore, the mildly changing applied voltage-capacitance characteristics can be obtained.

As described above, by this embodiment, there can be obtained an actuator in which the effect of the warpage of the beams is reduced and thereby the maximum capacitance is large and the precipitous change of capacitance in the vicinity of the maximum capacitance is relaxed In this embodiment, number and length (length of X axis direction) and width (length of Y axis direction) of the first slits 222 and the second slits 422, namely, the first division part 221 and the second division part 421 that are formed by the slits are discretional.

Moreover, the first to fourth beams 110, 210, 310, and 410 and the first, second, and fourth connective parts 131, 331, and 531 can be symmetric with respect to the central line G-G' between the second beam 210 and the fourth beam 410. Thereby, stable operation can be obtained. Moreover, they can be asymmetric. Thereby, the curve of the applied voltage-capacitance characteristics can be discretionally changed. Moreover, the beams 110, 210, 310, and 410 can have various structures such as a monomorph structure, a bimorph structure, and an asymmetric bimorph structure.

Furthermore, the structure of the second embodiment and the structure of the third embodiment may be combined. That is, it is possible that the third connective part 520 connecting the first division part 221 and the second division part 421 is provided and furthermore the fourth connective part 531 connecting the second connective end 214 of the second beam 210 and the fourth connective end 414 of the fourth beam 410 is provided.

Fourth Embodiment

Figure 38:
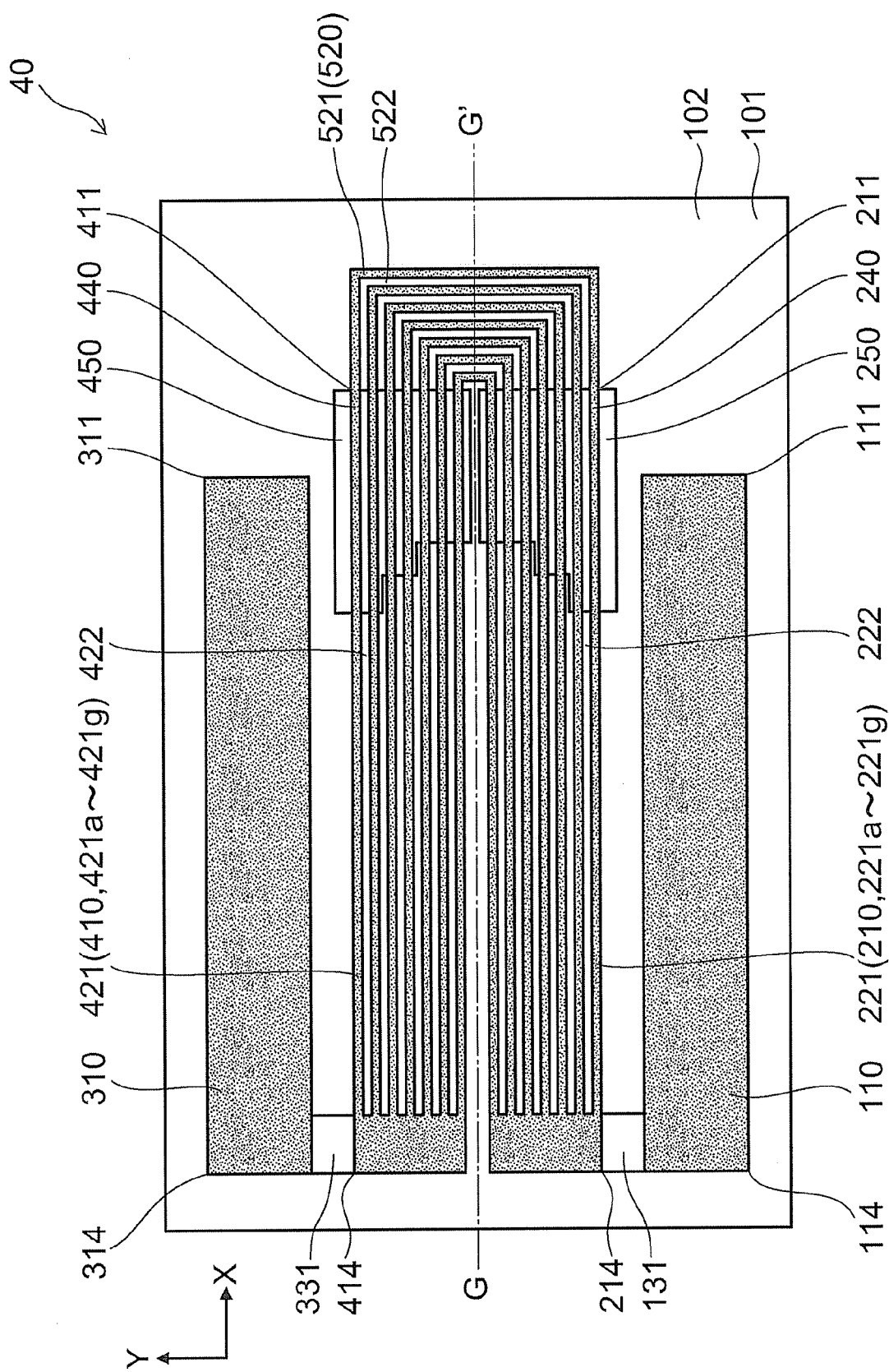
FIG. 38 is a schematic plan view illustrating a structure of the actuator according to a fourth embodiment of this invention.

FIG. 38 is a schematic plan view illustrating a structure of the actuator according to the fourth embodiment of this invention.

As shown in FIG. 38, in the actuator 40 according to the fourth embodiment of this invention, the planar shape of the first fixed electrode 250 and the second fixed electrode 450 is changed with respect to the actuator 20 illustrated in FIG. 19.

That is, the length of X axis direction of the first fixed electrode 250 and the second fixed electrode 450 is longer as the position in the fixed electrodes are remoter from the central line G-G' between the second beam 210 and the fourth beam 410. Thereby, the area of the divided action part formed by opposing of the division portions 221a to 221g and the division portions 421a to 421g to the first fixed electrode 250 and the second fixed electrode 450 respectively is changed to improve the control property of the applied voltage-capacitance characteristics.

When the length of X axis direction of the first fixed electrode 250 and the second fixed electrode 450 is changed according to distance (position) from the central line G-G', the first fixed electrode 250 and the second fixed electrode 450 are opposed to a part of the first division part 221 on a side of the first action end 211 and a part of the second division part 421 on a side of the second action end 411, respectively, in the respective positions. That is, it is sufficient that length of X axis direction of any one of the plurality of division portions of the first division part 221 and length of X axis direction of any one of the plurality of division portions of the second division part 421 are longer than the lengths of X axis direction of the first fixed electrode 250 and the second fixed electrode 450 in the positions from the central line G-G'.

Moreover, in FIG. 38, the length of X axis direction of the first fixed electrode 250 and the second fixed electrode 450 is longer as the position in the fixed electrodes are remoter from the central line G-G'. However, the reverse thereof is possible. Furthermore, the length of X axis direction of the first fixed electrode 250 and the second fixed electrode 450 not only monotonously increases or monotonously decreases but also can be changed according to the functions having various curves.

Fifth Embodiment

Figure 39:
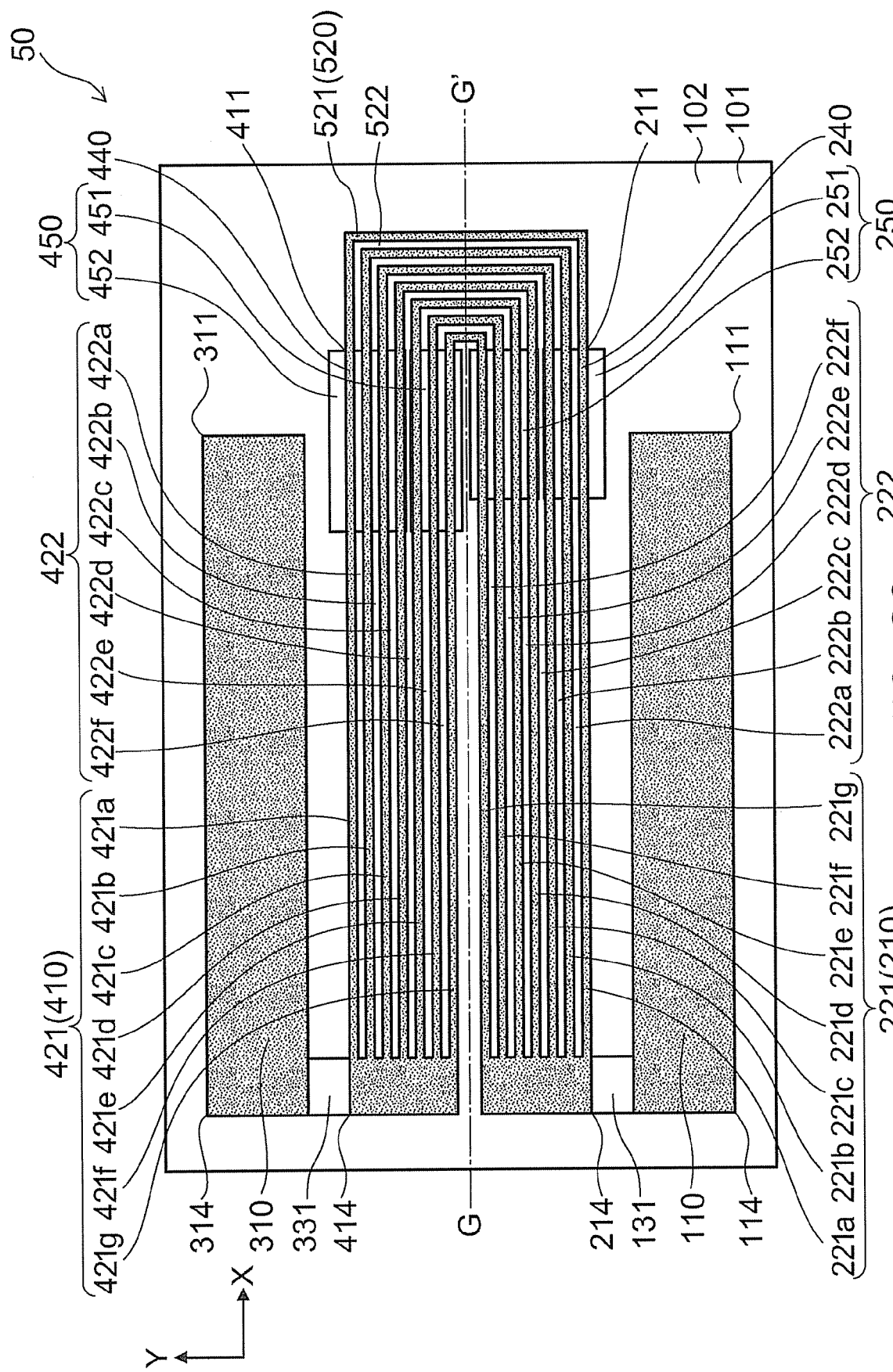
FIG. 39 is a schematic plan view illustrating a structure of the actuator according to a fifth embodiment of this invention.

FIG. 39 is a schematic plan view illustrating a structure of the actuator according to the fifth embodiment of this invention.

As shown in FIG. 39, in the actuator 50 according to the fifth embodiment of this invention, the planar shape of the first fixed electrode 250 and the second fixed electrode 450 is changed with respect to the actuator 20 illustrated in FIG. 19.

That is, the first fixed electrode 250 is divided into two and has division portions 251 and 252. Moreover, the second fixed electrode 450 is divided into two and has division portions 451 and 452. That is, the actuator 50 can have four variable capacitors by the four fixed electrodes of the division portions 251, 252, 451, and 452, and by the respective connection methods, the actuators having various applied voltage-capacitance characteristics can be obtained.

Furthermore, in FIG. 39, the length of X axis direction of the division portions 251 and 252 of the first fixed electrode 250 and the length of X axis direction of the division portions 451 and 452 of the second fixed electrode 450 are changed. Thereby, capacitance of the capacitor formed between the electrodes can be changed to further improve the control property of the applied voltage-capacitance characteristics.

In the case of the actuator 40 shown in FIG. 38, the planar shape of the first fixed electrode 250 and the planar shape of the second fixed electrode 450 are substantially symmetric with respect to a center line between the second beam 210 and the fourth beam 410 when viewed along a direction vertical to the main surface 102 of the substrate 101. In contrast, the planar shape of the first fixed electrode 250 and the planar shape of the second fixed electrode 410 are asymmetric with respect to the center line between the second beam 210 and the fourth beam 410.

The actuators 10 to 18 illustrated as described above have one-folded beam structure provided with the first beam 110 and the second beam 210, and the actuators 20 to 25, 30, 40, 50 have two-folded beam structure further provided with the third beam 310 an the fourth beam 410, but this embodiment is not limited thereto and may has a three-or-more-folded structure.

The actuators according to embodiments of this invention as described above can be used as a variable capacitor of piezoelectric driving type or a capacitive-type switch.

Moreover, various electronic circuits can be produced by using a variable capacitor or a high-frequency switch (capacitive-type switch) formed by the above-described actuator according to the embodiments of this invention.

Figure 40:
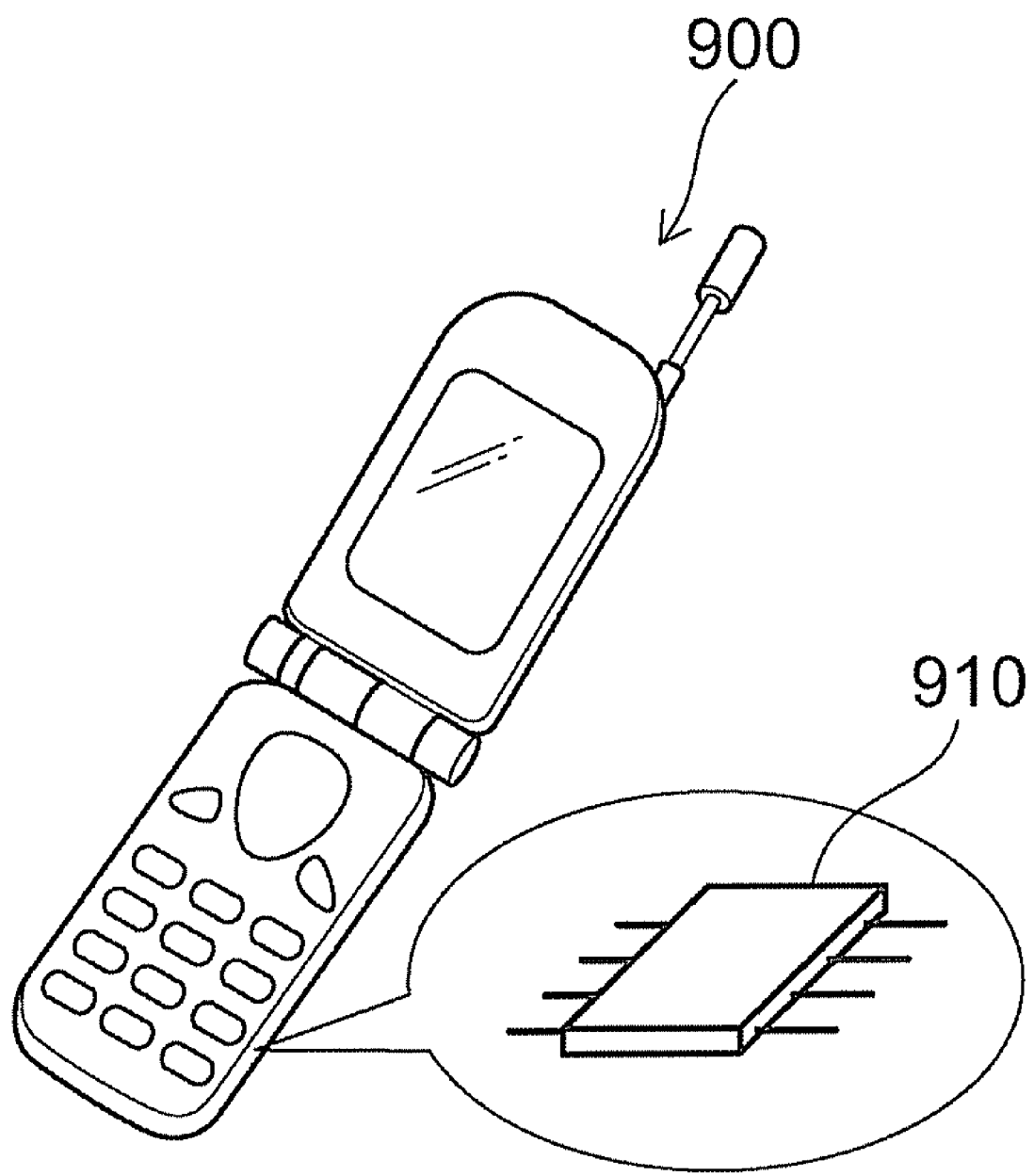
FIG. 40 is a schematic view illustrating an electronic circuit and an electronic hardware utilizing an actuator of an embodiment of this invention.

FIG. 40 is a schematic view illustrating an electronic circuit and an electronic hardware utilizing an actuator of an embodiment of this invention.

As shown in FIG. 40, an electronic circuit 910 in which a filter of variable frequency is housed can be produced by incorporating a variable capacitor produced by an actuator of an embodiment of this invention. Moreover, this electronic circuit 910 can be used in various types of electronic hardware 900 such as cellular phone.

As described above, embodiments of this invention has been explained with reference to specific examples. However, this invention is not limited thereto. For example, a specific structure of each of the components composing the actuator is included in the scope of the invention as long as the invention can be carried out by appropriately selecting the structure from the known scope by those skilled in the art to obtain the same effect.

Moreover, combination of two or more components of the specific examples in the technically possible range is also included in the scope of the invention as long as including the substance of the invention.

In addition, all actuators that can be carried out by those skilled in the art with appropriately modifying the designs based on the above-described actuators as described above as the embodiments of the invention also belong to the scope of the invention as long as including the substance of the invention.

In addition, in the category of idea of the invention, it is understood that modified examples and revised examples thereof that can be achieved by those skilled in the art also belong to the scope of the invention.

The invention claimed is:

1. An actuator comprising:
    a substrate;
    a first beam extending from a first fixed end to a first connective end, including a first lower electrode, a first upper electrode, and a first piezoelectric film provided between the first lower electrode and the first upper electrode;
    a first fixed part connecting the first fixed end and the substrate and supporting the first beam above a main surface of the substrate with a gap;
    a second beam extending from a second connective end to a first action end and provided in parallel to the first beam, including a second lower electrode, a second upper electrode, a second piezoelectric film provided between the second lower electrode and the second upper electrode, and having a first division part divided by a first slit extending from the first action end toward the second connective end;
    a first connective part connecting the first connective end and the second connective end and holding the second beam above the main surface of the substrate with a gap; and a first fixed electrode provided on the main surface of the substrate being configured to be opposed to a part of the first division part on a side of the first action end.

2. The actuator according to claim 1, wherein
the second lower electrode is made of a substantially same material as the first lower electrode,
the second piezoelectric film is made of a substantially same material as the first piezoelectric film, and
the second upper electrode is made of a substantially same material as the first upper electrode.

3. The actuator according to claim 1, wherein the first connective part includes respective and substantially same layers as a layer made of a material forming the first lower electrode, a layer made of a material forming the first piezoelectric film, and a layer made of a material forming the first upper electrode.

4. The actuator according to claim 1, wherein
the first beam further includes a first intermediate electrode provided between the first piezoelectric film and the first upper electrode and a first upper piezoelectric film provided between the first intermediate electrode and the first upper electrode, and
the second beam further includes a second intermediate electrode provided between the second piezoelectric film and the second upper electrode and a second upper piezoelectric film provided between the second intermediate electrode and the second upper electrode.

5. The actuator according to claim 1, further comprising:
a third beam extending from a second fixed end to a third connective end and provided in parallel to the first beam, including a third lower electrode, a third upper electrode, and a third piezoelectric film provided between the third lower electrode and the third upper electrode;
a second fixed part connecting the second fixed end and the substrate and supporting the third beam above a main surface of the substrate with a gap;
a fourth beam extending from a fourth connective end to a second action end and provided in parallel to the third beam, including a fourth lower electrode, a fourth upper electrode, a fourth piezoelectric film provided between the fourth lower electrode and the fourth upper electrode, and having a second division part divided by a second slit extending from the second action end toward the fourth connective end;
a second connective part connecting the third connective end and the fourth connective end and holding the fourth beam above the main surface of the substrate with a gap;
a second fixed electrode provided on the main surface of the substrate being configured to be opposed to a part of the second division part on a side of the second action end; and
a third connective part connecting the first division part and the second division part.

6. The actuator according to claim 5, wherein
the second lower electrode is made of a substantially same material as the first lower electrode,
the second piezoelectric film is made of a substantially same material as the first piezoelectric film,
the second upper electrode is made of a substantially same material as the first upper electrode,
the fourth lower electrode is made of a substantially same material as the third lower electrode,
the fourth piezoelectric film is made of a substantially same material as the third piezoelectric film, and
the fourth upper electrode is made of a substantially same material as the third upper electrode.

7. The actuator according to claim 5, wherein
the first connective part includes respective and substantially same layers as a layer made of a material forming the first lower electrode, a layer made of a material forming the first piezoelectric film, and a layer made of a material forming the first upper electrode, and
the second connective part includes respective and substantially same layers as a layer made of a material forming the third lower electrode, a layer made of a material forming the third piezoelectric film, and a layer made of a material forming the third upper electrode.

8. The actuator according to claim 5, wherein
the first beam further includes a first intermediate electrode provided between the first piezoelectric film and the first upper electrode and a first upper piezoelectric film provided between the first intermediate electrode and the first upper electrode,
the second beam further includes a second intermediate electrode provided between the second piezoelectric film and the second upper electrode and a second upper piezoelectric film provided between the second intermediate electrode and the second upper electrode,
the third beam further includes a third intermediate electrode provided between the third piezoelectric film and the third upper electrode and a third upper piezoelectric film provided between the third intermediate electrode and the third upper electrode, and
the fourth beam further includes a fourth intermediate electrode provided between the fourth piezoelectric film and the fourth upper electrode and a fourth upper piezoelectric film provided between the fourth intermediate electrode and the fourth upper electrode.

9. The actuator according to claim 5, wherein when viewed from a direction perpendicular to the main surface of the substrate, a shape of the second beam and a shape of the fourth beam are substantially symmetric with respect to a central line between the second beam and the fourth beam.

10. The actuator according to claim 5, wherein when viewed from a direction perpendicular to the main surface of the substrate, a shape of the first beam and a shape of the third beam are substantially symmetric with respect to a central line between the second beam and the fourth beam.

11. The actuator according to claim 5, wherein the second fixed electrode is electrically connected to the first fixed electrode.

12. The actuator according to claim 5, wherein when viewed from a direction perpendicular to the main surface of the substrate, a shape of the first fixed electrode and a shape of the second fixed electrode are substantially symmetric with respect to a central line between the second beam and the fourth beam.

13. The actuator according to claim 1, further comprising:
a third beam extending from a second fixed end to a third connective end and provided in parallel to the first beam, including a third lower electrode, a third upper electrode, and a third piezoelectric film provided between the third lower electrode and the third upper electrode;
a second fixed part connecting the second fixed end and the substrate and supporting the third beam above a main surface of the substrate with a gap;
a fourth beam extending from a fourth connective end to a second action end and provided in parallel to the third beam, including a fourth lower electrode, a fourth upper electrode, a fourth piezoelectric film provided between the fourth lower electrode and the fourth upper electrode, and having a second division part divided by a second slit extending from the second action end toward the fourth connective end;

a second connective part connecting the third connective end and the fourth connective end and holding the fourth beam above the main surface of the substrate with a gap;

a second fixed electrode provided on the main surface of the substrate being configured to be opposed to a part of the second division part on a side of the second action end; and a fourth connective part connecting the second connective end and the fourth connective end.

14. The actuator according to claim 13, wherein the second lower electrode is made of a substantially same material as the first lower electrode, the second piezoelectric film is made of a substantially same material as the first piezoelectric film, the second upper electrode is made of a substantially same material as the first upper electrode, the fourth lower electrode is made of a substantially same material as the third lower electrode, the fourth piezoelectric film is made of a substantially same material as the third piezoelectric film, and the fourth upper electrode is made of a substantially same material as the third upper electrode.

15. The actuator according to claim 13, wherein the first connective part includes respective and substantially same layers as a layer made of a material forming the first lower electrode, a layer made of a material forming the first piezoelectric film, and a layer made of a material forming the first upper electrode, and the second connective part includes respective and substantially same layers as a layer made of a material forming the third lower electrode, a layer made of a material forming the third piezoelectric film, and a layer made of a material forming the third upper electrode.

16. The actuator according to claim 13, wherein the first beam further includes a first intermediate electrode provided between the first piezoelectric film and the first upper electrode and a first upper piezoelectric film provided between the first intermediate electrode and the first upper electrode, the second beam further includes a second intermediate electrode provided between the second piezoelectric film and the second upper electrode and a second upper piezoelectric film provided between the second intermediate electrode and the second upper electrode, the third beam further includes a third intermediate electrode provided between the third piezoelectric film and the third upper electrode and a third upper piezoelectric film provided between the third intermediate electrode and the third upper electrode, and the fourth beam further includes a fourth intermediate electrode provided between the fourth piezoelectric film and the fourth upper electrode and a fourth upper piezoelectric film provided between the fourth intermediate electrode and the fourth upper electrode.

17. The actuator according to claim 13, wherein when viewed from a direction perpendicular to the main surface of the substrate, a shape of the second beam and a shape of the fourth beam are substantially symmetric with respect to a central line between the second beam and the fourth beam.

18. The actuator according to claim 13, wherein when viewed from a direction perpendicular to the main surface of the substrate, a shape of the first beam and a shape of the third beam are substantially symmetric with respect to a central line between the second beam and the fourth beam.

19. The actuator according to claim 13, wherein the second fixed electrode is electrically connected to the first fixed electrode.

20. An electronic hardware comprising:

an electric circuit having the actuator including:

a substrate;

a first beam extending from a first fixed end to a first connective end, including a first lower electrode, a first upper electrode, and a first piezoelectric film provided between the first lower electrode and the first upper electrode;

a first fixed part connecting the first fixed end and the substrate and supporting the first beam above a main surface of the substrate with a gap;

a second beam extending from a second connective end to a first action end and provided in parallel to the first beam, including a second lower electrode, a second upper electrode, a second piezoelectric film provided between the second lower electrode and the second upper electrode, and having a first division part divided by a first slit extending from the first action end toward the second connective end;

a first connective part connecting the first connective end and the second connective end and holding the second beam above the main surface of the substrate with a gap; and a first fixed electrode provided on the main surface of the substrate being configured to be opposed to a part of the first division part on a side of the first action end, as at least any one of a variable capacitor and a high-frequency switch.

21. The hardware according to claim 20, wherein the actuator further includes:

a third beam extending from a second fixed end to a third connective end and provided in parallel to the first beam, including a third lower electrode, a third upper electrode, and a third piezoelectric film provided between the third lower electrode and the third upper electrode;

a second fixed part connecting the second fixed end and the substrate and supporting the third beam above a main surface of the substrate with a gap;

a fourth beam extending from a fourth connective end to a second action end and provided in parallel to the third beam, including a fourth lower electrode, a fourth upper electrode, a fourth piezoelectric film provided between the fourth lower electrode and the fourth upper electrode, and having a second division part divided by a second slit extending from the second action end toward the fourth connective end;

a second connective part connecting the third connective end and the fourth connective end and holding the fourth beam above the main surface of the substrate with a gap;

a second fixed electrode provided on the main surface of the substrate being configured to be opposed to a part of the second division part on a side of the second action end; and a third connective part connecting the first division part and the second division part.

22. The hardware according to claim 20, wherein the actuator further includes:

a third beam extending from a second fixed end to a third connective end and provided in parallel to the first beam, including a third lower electrode, a third upper electrode, and a third piezoelectric film provided between the third lower electrode and the third upper electrode;

a second fixed part connecting the second fixed end and the substrate and supporting the third beam above a main surface of the substrate with a gap;

a fourth beam extending from a fourth connective end to a second action end and provided in parallel to the third beam, including a fourth lower electrode, a fourth upper electrode, a fourth piezoelectric film provided between the fourth lower electrode and the fourth upper electrode, and having a second division part divided by a second slit extending from the second action end toward the fourth connective end;

a second connective part connecting the third connective end and the fourth connective end and holding the fourth beam above the main surface of the substrate with a gap;

a second fixed electrode provided on the main surface of the substrate being configured to be opposed to a part of the second division part on a side of the second action end; and a fourth connective part connecting the second connective end and the fourth connective end.

* * * * *